United States Patent
Perrott

(10) Patent No.: US 9,490,818 B2
(45) Date of Patent: Nov. 8, 2016

(54) CANCELLATION OF DELTA-SIGMA QUANTIZATION NOISE WITHIN A FRACTIONAL-N PLL WITH A NONLINEAR TIME-TO-DIGITAL CONVERTER

(71) Applicant: Silicon Laboratories Inc., Austin, TX (US)

(72) Inventor: Michael H. Perrott, Nashua, NH (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/448,447

(22) Filed: Jul. 31, 2014

(65) Prior Publication Data

US 2015/0145571 A1    May 28, 2015

Related U.S. Application Data

(60) Provisional application No. 61/909,490, filed on Nov. 27, 2013.

(51) Int. Cl.

| | |
|---|---|
| *H03L 7/06* | (2006.01) |
| *H03L 7/08* | (2006.01) |
| *H03L 7/093* | (2006.01) |
| *H03M 1/08* | (2006.01) |
| *H03M 1/66* | (2006.01) |
| *G04F 10/00* | (2006.01) |
| *H03L 7/099* | (2006.01) |
| *H03M 3/00* | (2006.01) |
| *H03L 7/085* | (2006.01) |

(Continued)

(52) U.S. Cl.
CPC ........... *H03L 7/0802* (2013.01); *G04F 10/005* (2013.01); *H03L 7/085* (2013.01); *H03L 7/093* (2013.01); *H03L 7/0995* (2013.01); *H03M 1/0836* (2013.01); *H03M 1/0854* (2013.01); *H03M 1/66* (2013.01); *H03M 3/358* (2013.01); *H03M 3/368* (2013.01); *H02M 3/07* (2013.01); *H03M 7/3004* (2013.01)

(58) Field of Classification Search
CPC ... H03L 7/087; H03L 2207/50; H03L 7/095; H03L 7/107; H03L 7/18
USPC .................................................. 327/156–159
See application file for complete search history.

(56) References Cited

U.S. PATENT DOCUMENTS

| | | | |
|---|---|---|---|
| 6,630,868 B2 | 10/2003 | Perrott et al. | |
| 8,207,766 B2* | 6/2012 | Yu | .................................. 327/156 |
| 8,390,348 B2 | 3/2013 | Burcea | |

(Continued)

OTHER PUBLICATIONS

Gupta, M. and Song, B.S., "A 1.8GHz spur cancelled fractional-N frequency synthesizer with LMS based DAC gain calibration," JSSC, vol. 41, No. 12, Dec. 2006, pp. 2842-2851.

(Continued)

*Primary Examiner* — Lincoln Donovan
*Assistant Examiner* — Diana J Cheng
(74) *Attorney, Agent, or Firm* — Abel Law Group, LLP

(57) ABSTRACT

A fractional-N phase-locked loop (PLL) includes a nonlinear time to digital converter that generates a digital representation of a phase error corresponding to a time difference between a feedback signal of the fractional-N PLL and a reference signal. A nonlinear quantization noise cancellation circuit supplies a correction signal to ensure that the generated digital representation has reduced quantization noise. The correctional signal may be applied in the analog or digital domain.

20 Claims, 41 Drawing Sheets

(51) Int. Cl.
*H02M 3/07* (2006.01)
*H03M 7/30* (2006.01)

(56) References Cited

U.S. PATENT DOCUMENTS

| | | | |
|---|---|---|---|
| 8,427,243 B2 | 4/2013 | Chen et al. | |
| 8,497,716 B2 | 7/2013 | Zhang | |
| 8,604,840 B2 * | 12/2013 | Ahmadi et al. | 327/107 |
| 8,947,139 B1 | 2/2015 | Vercesi et al. | |
| 8,957,712 B2 | 2/2015 | Tang et al. | |
| 2008/0116946 A1 | 5/2008 | Masson | |
| 2008/0129352 A1 | 6/2008 | Zhang | |
| 2008/0218228 A1 | 9/2008 | Masson | |
| 2009/0251225 A1 | 10/2009 | Chen et al. | |
| 2010/0097150 A1 | 4/2010 | Ueda et al. | |
| 2010/0213984 A1 | 8/2010 | Shin et al. | |
| 2011/0025388 A1 | 2/2011 | Lamanna | |
| 2011/0133799 A1 | 6/2011 | Dunworth et al. | |
| 2011/0204938 A1 | 8/2011 | Lamanna | |
| 2012/0161832 A1 | 6/2012 | Lee et al. | |
| 2013/0050013 A1 | 2/2013 | Kobayashi et al. | |
| 2013/0222026 A1 | 8/2013 | Havens | |
| 2013/0257494 A1 | 10/2013 | Nikaeen et al. | |
| 2014/0077849 A1 | 3/2014 | Chen et al. | |
| 2014/0266341 A1 | 9/2014 | Jang et al. | |
| 2015/0008961 A1 | 1/2015 | Kim et al. | |

OTHER PUBLICATIONS

Hedayati et al., "A 1 MHz Bandwidth, 6 GHz 0.18 m COMS Type-I Fractional-N Synthesizer for WiMAX Applications", JSSC, vol. 44, No. 12, Dec. 2009, pp. 3244-3252.

Hedayati et al., "A 3GHz Wideband • Δ Fractional-N Synthesizer with Voltage-Mode Exponential CP-PFD", RFIC Symposium, 2009, pp. 325-328.

Hsu, C.M. et al., "A Low-Noise Wide-BW 3.6-GHz Digital Delta-Sigma Fractional-N Frequency Synthesizer with a Noise-Shaping Time-to-Digital Converter and quantization Noise Cancellation," IEEE J. Solid-State Circuits, vol. 43, Dec. 2008, pp. 2776-2786.

Meninger et al., "A 1-MHZ Bandwidth 3.6-GHz 0.18um CMOS Fractional-N Synthesizer Utilizing a Hybrid PFD/DAC Structure for Reduced Broadband Phase Noise", JSSC, vol. 41, No. 4, Apr. 2006, pp. 966-980.

Pamarti et al., "A wideband 2.4GHz Δ☐ fractional-N PLL with 1 Mb/s in-loop modulation," JSSC, vol. 39, No. 1, Jan. 2004, pp. 49-62.

Staszewski, R.B. et al., "All-digital PLL and transmitter for mobile phone," IEEE J. Solid-State Circuits, vol. 40, No. 12, Dec. 2005, pp. 2469-2482.

Staszewski, R. et al., "1.3 V, 20 ps time-to-digital converter for frequency synthesis in 90-nm CMOS," IEEE Trans. Circuits Syst. II, vol. 53, No. 3, Mar. 2006, pp. 220-224.

Straayer, M.Z. and Perrott, M.N., A 12-Bit, 10-MHz Bandwidth, Continuous-Time • Δ ADC With a 5-Bit, 950-MS/s VCO-Based Quantizer.

Swaminathan et al., "A Wide-Bandwidth 2.4 GHz ISM Band Fractional-N PLL With Adaptive Phase Noise Cancellation", JSSC, vol. 42, No. 12, Dec. 2007, pp. 2639-2650.

Temporiti, E. et al., "A 700kHz Bandwidth • Δ Fractional Synthesizer with Spurs Compensation and Linearization Techniques for WCDMA Applications," JSSC, vol. 39, No. 9, Sep. 2004, pp. 1446-1454.

U.S. Appl. No. 14/448,458, filed Jul. 31, 2014, entitled "Cancellation of Spurious Tones Within a Phase Locked Loop with a Time-to-Digital Converter," Inventor Michael H. Perrott.

U.S. Appl. No. 14/448,466, filed Jul. 31, 2014, entitled "Time-to-Voltage Converter Using a Capacitor Based Digital to Analog Converter for Quantization Noise Cancellation," Inventor Michael H. Perrott.

U.S. Appl. No. 14/448,482, filed Jul. 31, 2014, entitled "Time-to-Digital Converter Based on a Voltage Controlled Oscillator," Inventor Michael H. Perrott.

U.S. Appl. No. 14/985,985, filed Dec. 31, 2015, entitled "Fractional-N Phase-Locked Loop", naming Michael H. Perrott as inventor.

* cited by examiner

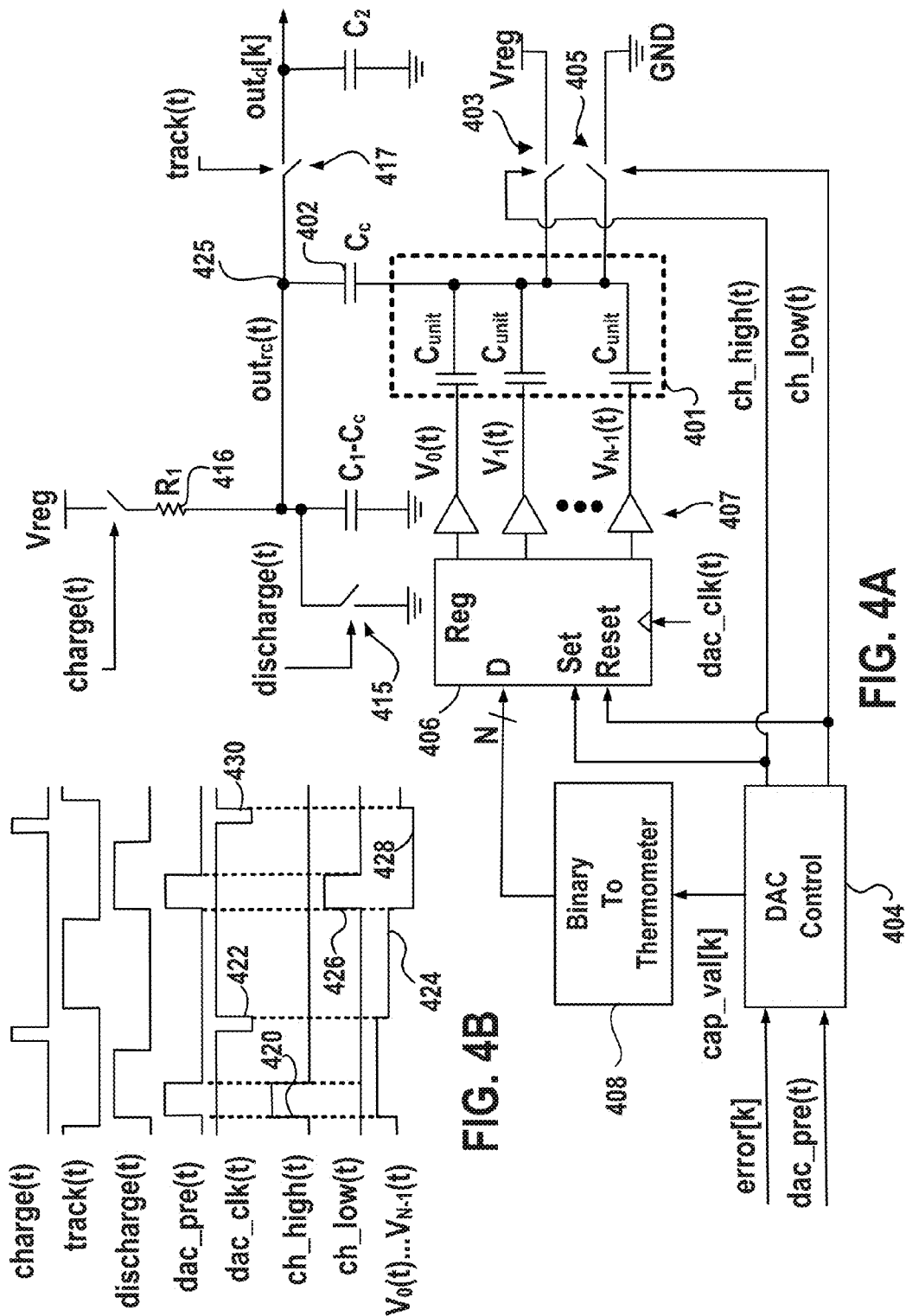

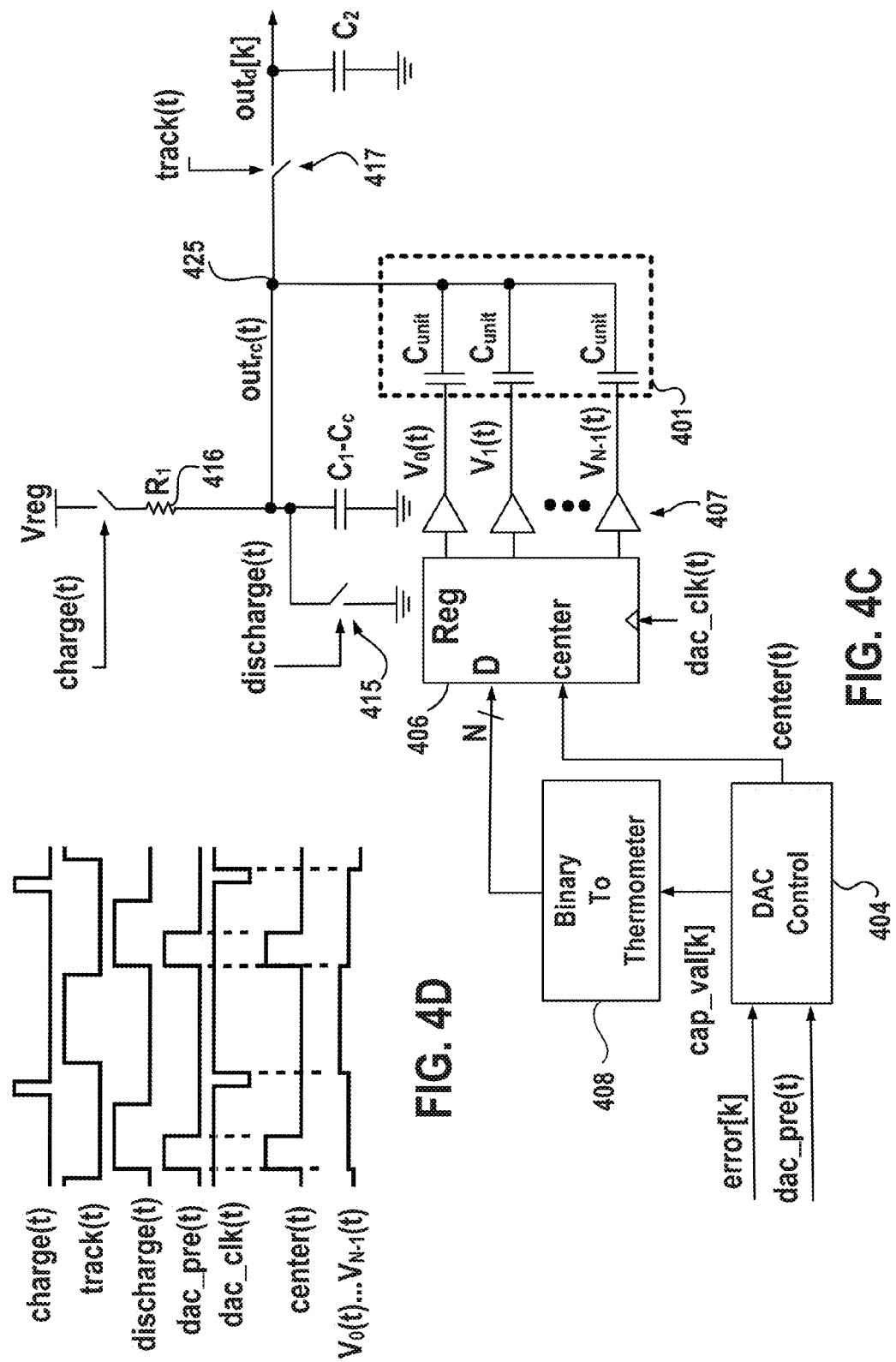

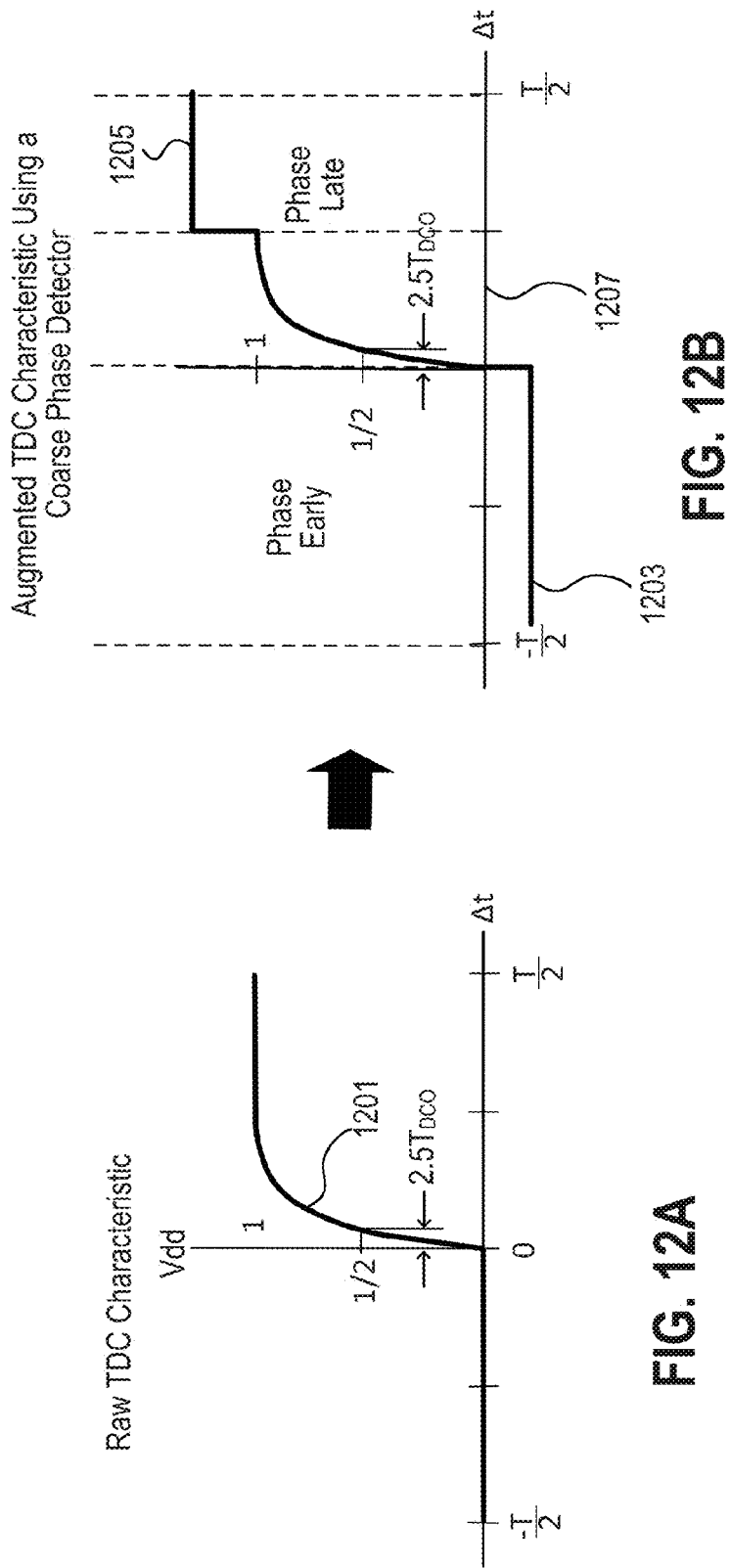

Operations in Each Estimation Frame:

First Sample of Frame:

$C_{xx} = 0$ (set all entries to 0)  $C_{xr} = 0$

Every Sample of Frame:

$C_{x_0x_0} = C_{x_0x_0} + x_0[k]x_0[k]$
$C_{x_0x_1} = C_{x_0x_1} + x_0[k]x_1[k]$
$C_{x_1x_1} = C_{x_1x_1} + x_1[k]x_1[k]$
$C_{x_2x_2} = C_{x_2x_2} + x_2[k]x_2[k]$
$C_{x_2x_0} = C_{x_0x_2} + x_0[k]x_2[k]$
...
$C_{x_4x_3} = C_{x_3x_4} = C_{x_3x_4} + x_3[k]x_4[k]$
$C_{x_4x_4} = C_{x_4x_4} + x_4[k]x_4[k]$ $C_{x_0r} = C_{x_0r} + x_0[k]r[k]$
$C_{x_1r} = C_{x_1r} + x_1[k]r[k]$
$C_{x_2r} = C_{x_2r} + x_2[k]r[k]$
$C_{x_3r} = C_{x_3r} + x_3[k]r[k]$
$C_{x_4r} = C_{x_4r} + x_4[k]r[k]$

Last Sample of Frame:

Store $C_{xx}$ and $C_{xr}$ for h estimate in next frame

Estimated Covariance Matrices:

$$C_{xx} = \begin{bmatrix} C_{x_0x_0} & C_{x_0x_1} & \cdots & C_{x_0x_4} \\ C_{x_1x_0} & C_{x_1x_1} & \cdots & C_{x_1x_4} \\ \vdots & \vdots & \ddots & \vdots \\ C_{x_4x_0} & C_{x_4x_1} & \cdots & C_{x_4x_4} \end{bmatrix}$$

$$C_{xr} = \begin{bmatrix} C_{x_0r} \\ C_{x_1r} \\ \vdots \\ C_{x_4r} \end{bmatrix}$$

FIG. 21

CANCELLATION OF DELTA-SIGMA QUANTIZATION NOISE WITHIN A FRACTIONAL-N PLL WITH A NONLINEAR TIME-TO-DIGITAL CONVERTER

CROSS-REFERENCE TO RELATED APPLICATION(S)

This application claims benefit of U.S. Provisional application 61/909,490, entitled "Fractional-N PLL", filed Nov. 27, 2013, naming Michael H. Perrott as inventor, which application is incorporated herein by reference. This application relates to: application Ser. No. 14/448,458, filed Jul. 31, 2014, entitled "Cancellation of Spurious Tones Within a Phase-Locked Loop With a Time-to-Digital Converter", naming Michael H. Perrott as inventor, application Ser. No. 14/448,466, filed Jul. 31, 2014, now U.S. Pat. No. 9,246,500, entitled "Time-to-Voltage Converter Using a Capacitor Based Digital to Analog Converter for Quantization Noise Cancellation", naming Michael H. Perrott as inventor, and application Ser. No. 14/448,482, filed Jul. 31, 2014, now U.S. Pat. No. 9,270,288, entitled "Time-To-Digital Converter Based On A Voltage Controlled Oscillator", naming Michael H. Perrott as inventor; all of which applications are incorporated herein by reference.

BACKGROUND

1. Field of the Invention

This invention relates to phase-locked loops (PLLs) and more particularly to use of a voltage controlled oscillator in a time to digital converter.

2. Description of the Related Art

Quantization noise cancellation within a fractional-N phase-locked loop (PLL) is a well-known technique that has been used for decades. FIG. 1 illustrates a prior art analog fractional-N PLL where the VCOCLK 101 is a non-integer multiple of the reference clock (RefCLK) 103. The fractional-N divider 107 supplies a feedback signal (divout) 108 to a phase and frequency detector (PFD) and charge pump 110 that determines the time difference between edges of the RefCLK signal 103 and the feedback signal 108 and supplies a phase error signal based on the time difference to the loop filter 119. Quantization noise is introduced because the divide value 105 supplied to the fractional-N divider 107 is modulated in time to achieve an average divide value corresponding to the desired divide value 109 supplied to the delta sigma modulator logic 111. The delta sigma ($\Delta$-$\Sigma$) modulator logic 111 supplies a digital error signal 115 based on the difference between the divide value 105 supplied to the fractional-N divider and the desired divide value 109. State of the art approaches to achieve quantization noise cancellation include using a digital-to-analog converter (DAC) 117 having a current-based output to convert the digital error signal 115 to a current that is added to the charge pump output signal and supplied to the loop filter 119. Other prior art approaches utilize digital cancellation of the quantization noise in the case of digital PLLs. For the analog PLL case, the use of the current DAC leads to increased power and area when striving for low noise. For the digital PLL case, the use of all digital cancellation relies on having a high performance Time-to-Digital Converter (TDC) that has adequately high resolution and linearity to achieve a desired level of phase noise performance. The implementation of such a TDC can be quite challenging when excellent noise performance is desired of the PLL. Accordingly, improvements in quantization noise cancellation are desirable.

SUMMARY OF EMBODIMENTS OF THE INVENTION

In one embodiment, a method includes performing nonlinear quantization noise cancellation to generate a digital representation of a phase error with reduced quantization noise. The phase error corresponds to a time difference between a feedback signal of a fractional-N phase-locked loop (PLL) and a reference signal. In an embodiment, the method further includes performing the nonlinear quantization noise cancellation in an analog domain to generate an analog representation of the phase error with reduced quantization noise. The analog representation is then converted to the digital representation of the phase error with reduced quantization noise. In another embodiment the method further includes generating an analog representation of the phase error, converting the analog representation to a digital representation, and performing the nonlinear quantization noise cancellation in a digital domain after converting to the digital representation.

In another embodiment a fractional-N phase-locked loop (PLL) includes a nonlinear time to digital converter to generate a digital representation of a phase error corresponding to a time difference between a feedback signal of the fractional-N PLL and a reference signal. The nonlinear quantization noise cancellation circuit is coupled to supply a correction signal to the time to digital converter to cause the time to digital converter to generate the digital representation of the phase error with reduced quantization noise. In an embodiment the fractional-N PLL includes a resistor-based or current-based charge pump controlled by a phase detector to create a voltage corresponding to the phase error that is combined with the correction signal. An analog to digital converter generates the digital representation of the phase error with reduced quantization noise.

In another embodiment a fractional-N phase-locked loop (PLL) includes a nonlinear time to digital converter to generate a digital representation of a phase error corresponding to a time difference between a feedback signal of the fractional-N PLL and a reference signal. The digital representation includes nonlinearity and quantization noise. A nonlinear quantization noise cancellation circuit supplies a correction signal to reduce the quantization noise and a summing circuit that combines the correction signal and a second signal based on the digital representation of the phase error, to generate a second digital representation of the phase error with reduced quantization noise.

BRIEF DESCRIPTION OF THE DRAWINGS

The present invention may be better understood, and its numerous objects, features, and advantages made apparent to those skilled in the art by referencing the accompanying drawings illustrating aspects of various embodiments.

FIG. 4A illustrates an embodiment of a capacitor DAC having N unit capacitors, along with a coupling capacitor, and selective precharging capability to a reference voltage or ground, for a resistor based charge pump.

FIG. 4B illustrates a timing diagram associated with the embodiment of FIG. 4A.

FIG. 4C illustrates an embodiment showing a simplified capacitor DAC structure.

FIG. 4D illustrates a timing diagram associated with the embodiment of FIG. 4C.

FIG. 12A illustrates raw TDC characteristic assuming a resistor based charge pump in the case where the midpoint charge value occurs when charge(t) has a time span of 2.5 VCO cycles.

FIG. 12B illustrates augmented TDC characteristic in which the usable range of the raw TDC characteristic is extended with the use of a coarse phase detector which adjusts the phase error characteristic to be monotonically increasing across the range of −T/2 to T/2, where T is the reference period.

FIG. 21 illustrates formation of the $C_{xx}$ matrix and the $C_{xr}$ vector during each estimation time frame.

The use of the same reference symbols in different drawings indicates similar or identical items.

DETAILED DESCRIPTION

Several techniques are introduced to achieve excellent wideband PLL phase noise performance. One technique utilizes a capacitor DAC rather than current DAC to achieve ΔΣ quantization noise cancellation. A second technique combines a Time-to-Voltage Converter (TVC) and Voltage-Controlled Oscillator (VCO) based Analog-to-Digital Converter (ADC) to achieve a high performance TDC. Use of a resistor based charge pump in the TVC achieves low flicker noise and avoids current bias circuits, but nonlinearity occurs in the TDC characteristic, which can cause noise folding of the ΔΣ quantization noise. As such, a third technique implements a nonlinear approach to ΔΣ quantization noise cancellation which utilizes the capacitor DAC as well as post ADC (i.e., post TDC) cancellation. A fourth technique leverages the digital information provided by the TDC to perform fractional and non-fractional spur cancellation.

Figure 1:
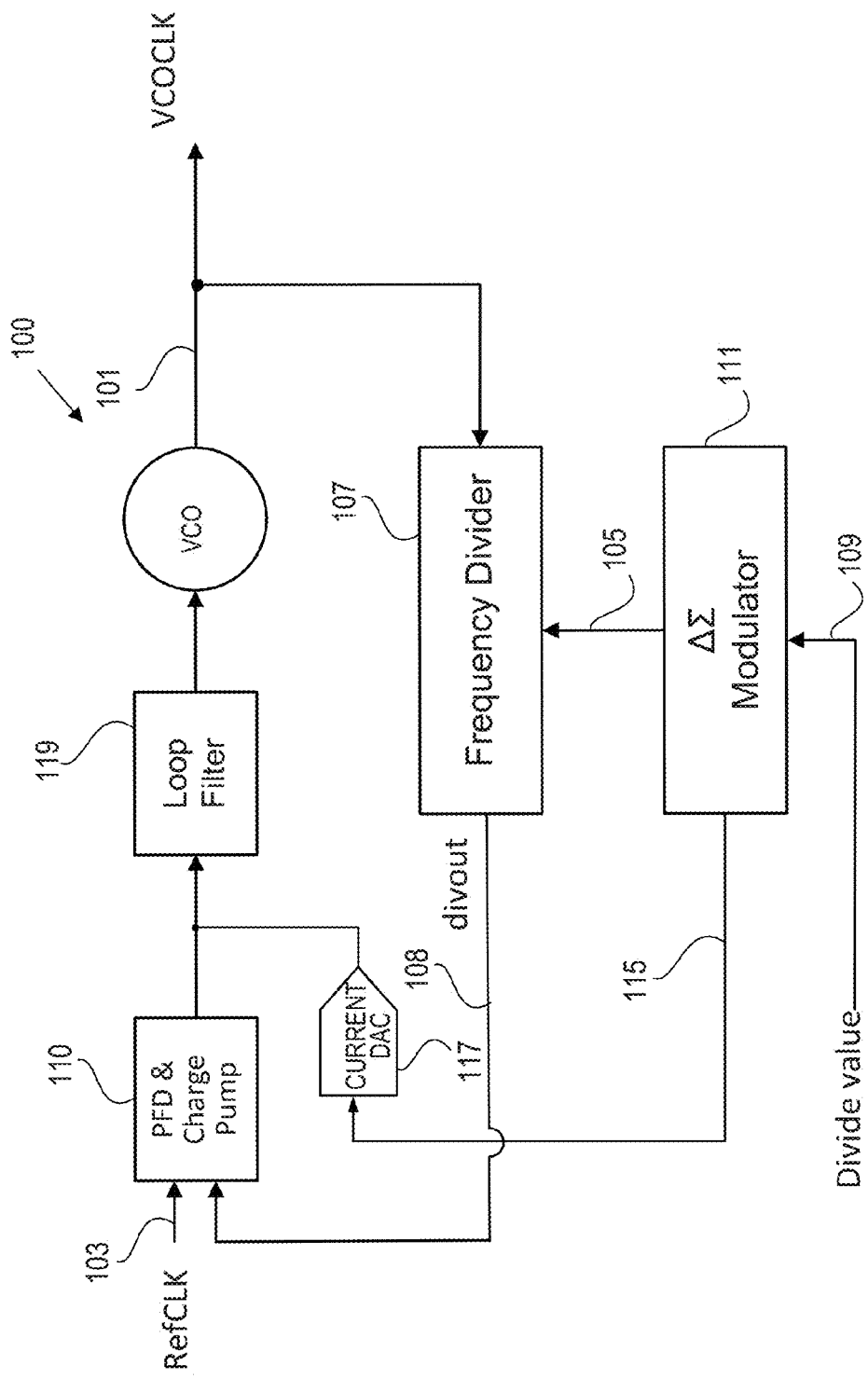
FIG. 1 illustrates is a block diagram of a prior art quantization noise cancelling fractional-N PLL using a current DAC with a traditional phase frequency detector (PFD) and charge pump.
Figure 2:
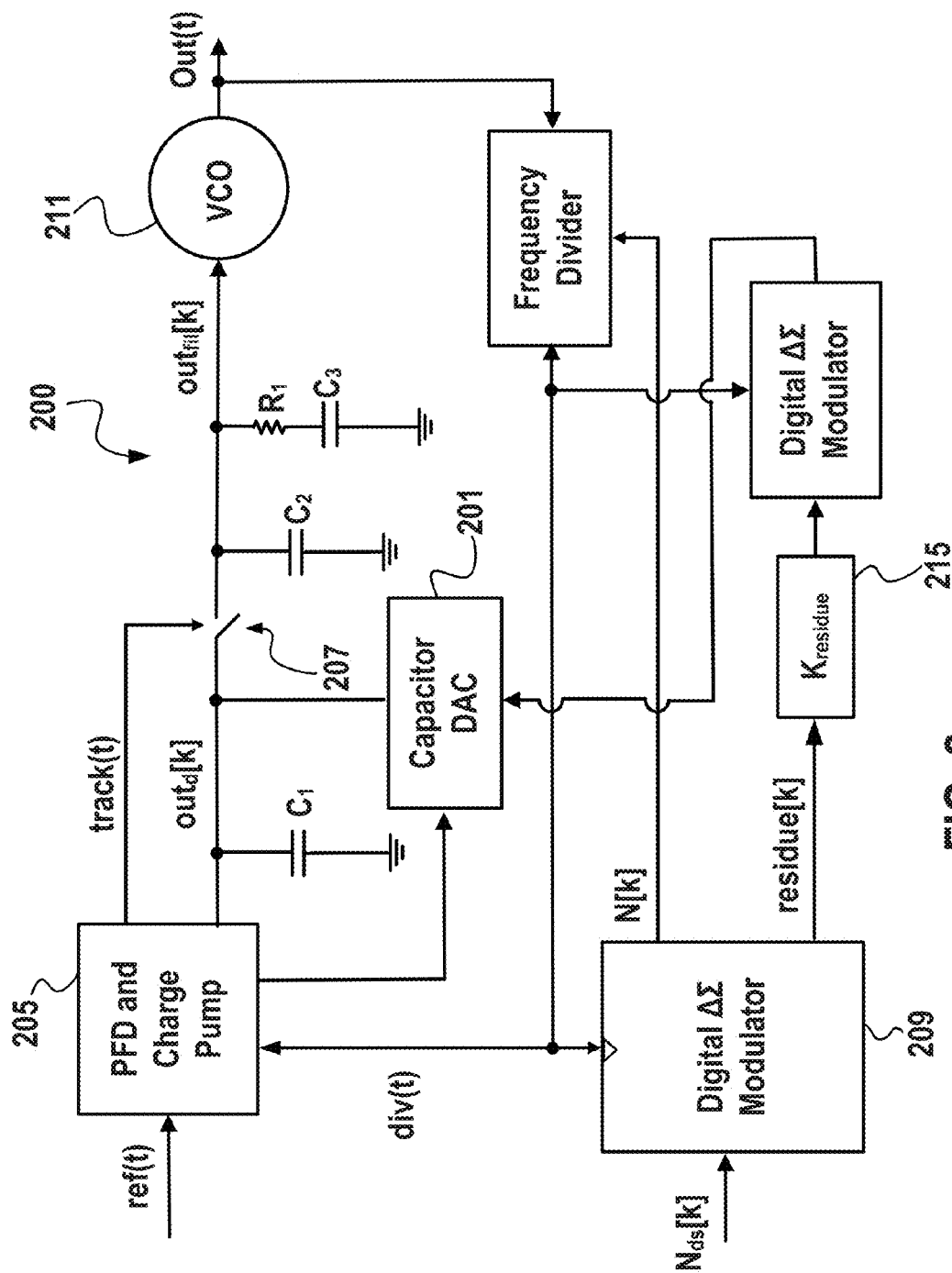
FIG. 2 illustrates a block diagram of a quantization noise cancelling analog fractional-N PLL utilizing a capacitor DAC for cancellation according to an embodiment.

Referring to FIG. 2, rather than using a current DAC as shown in FIG. 1, the PLL 200 uses a capacitor DAC 201 for an analog PLL implementation. The advantages of a capacitor DAC over a current DAC are that it achieves better matching of its elements within a given integrated circuit (IC) area, it requires no static power consumption (i.e., only dynamic power consumption when the capacitors are switched from supply to ground or vice versa), it adds no noise beyond the voltage regulator and switches that provide the voltage reference for the capacitor array elements (i.e., kT/C noise), and it can operate at low supply voltages. In the PLL 200, the phase and frequency detector (PFD) and charge pump 205 supplies a signal corresponding to a time difference between the reference signal ref(t) and the feedback signal div(t) that charges capacitor $C_1$ while the signal track(t) keeps switch 207 open. Note that given a fixed reference frequency, the phase error is simply a scale factor of the time difference between the reference signal ref(t) and the feedback signal div(t). The capacitor DAC converts the digital error signal associated with the delta sigma modulator 209 to a voltage that is combined with the voltage on $C_1$. When track(t) closes switch 207, the combined voltage is supplied to control the VCO 211. As with the current DAC approach, proper setting of the gain of the capacitor DAC is required as represented by the digital scale factor 215 ($K_{residue}$) in FIG. 2. While the value of $K_{residue}$ may be determined using adaptive tuning methods, implementing such tuning methods within an analog PLL typically requires high analog complexity, which can be undesirable for mass production devices since it increases design time and introduces risk to the PLL performance being met across temperature and process variations.

Figure 3:
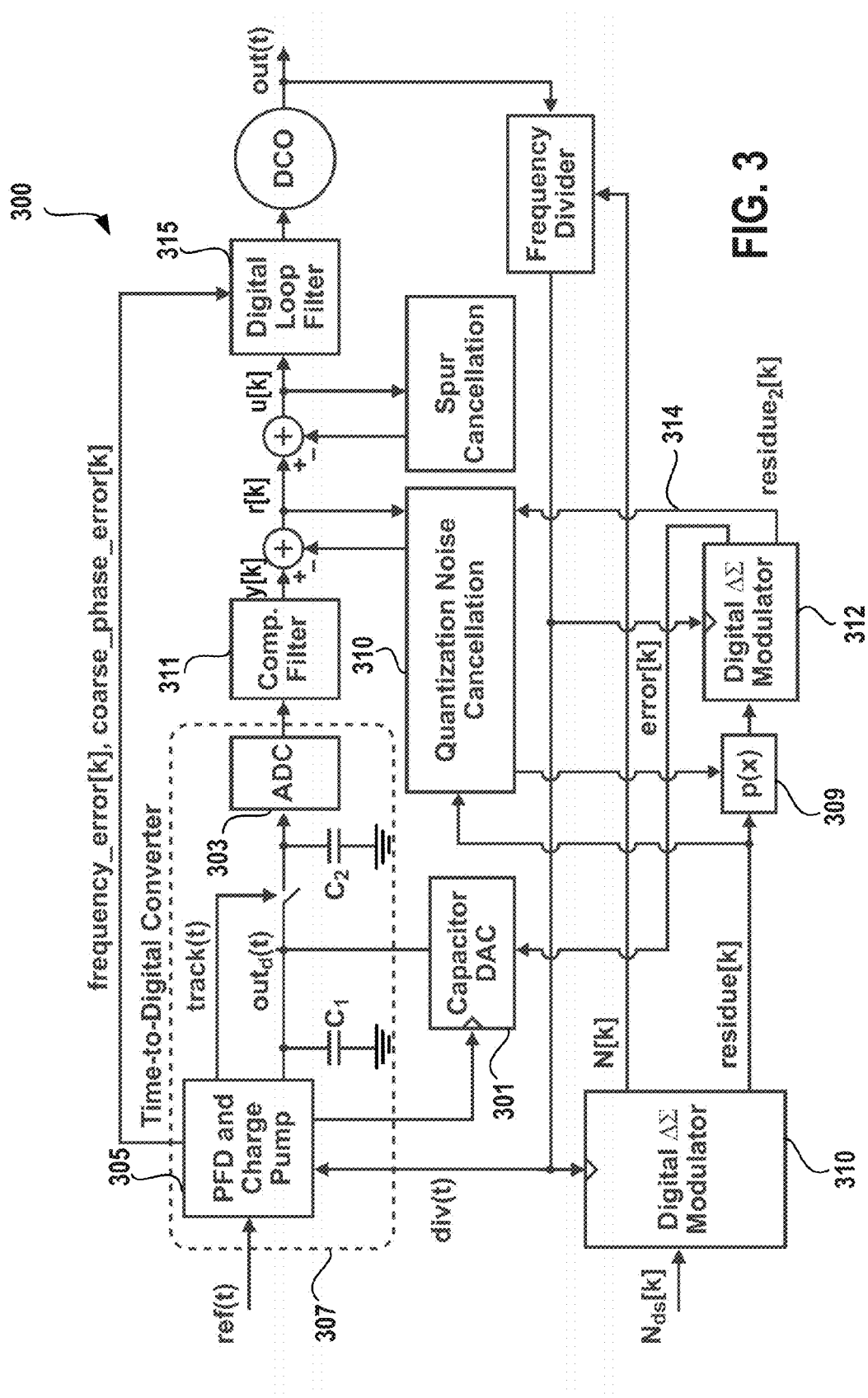
FIG. 3 illustrates a block diagram of an embodiment of a quantization noise cancelling digital fractional-N digital PLL with a capacitor DAC, digital nonlinear quantization noise cancellation, and spur cancellation.

Referring to FIG. 3, instead of using an analog PLL implementation 200, another embodiment utilizes a more digital implementation for PLL 300 when using the capacitor DAC 301. In this case, a high resolution Analog-to-Digital Converter (ADC) 303 digitizes the phase (or time) error signal produced by the PFD/Charge Pump circuits 305. Here the PFD/Charge Pump 305 can be considered as a Time-to-Voltage Converter (TVC) and the combined TVC and ADC 303 can be considered as a Time-to-Digital Converter (TDC) 307. The noise cancellation estimator 310 is implemented in a digital manner. Rather than constraining the cancellation to a linear approach, the digital estimator calculates the coefficients of a polynomial p(x) 309 that allows cancellation of the impact of nonlinearity in the TDC circuit 307. A digital compensation filter (Comp. Filter) 311 helps undo the effects of the filtering operation created by switching capacitor $C_1$ onto capacitor $C_2$. The use of the capacitor DAC 301 lowers the steady-state range required of the ADC 303 since the variation due to quantization noise is reduced, which also reduces the impact of nonlinearity in the ADC 303. In addition to the analog cancellation offered by the capacitor DAC 301, digital cancellation is also utilized after the ADC to further reduce noise. In particular, the residual error of the capacitor DAC cancellation is computed as $residue_2[k]$ 314, scaled appropriately, and then subtracted from the phase error signal before it is input to the digital PLL loop filter 315. The use of post ADC cancellation allows the capacitor DAC 301 to have lower resolution. In fact, the ideal capacitor DAC resolution should be high enough to ensure that its residual error is small enough to avoid the impact of nonlinearity in the ADC, but low enough such that the residual error can act as a dithering signal for the ADC to better scramble the impact of its quantization noise. Note that Dynamic Element Matching (DEM) techniques can be applied to the capacitor DAC elements in order to minimize the influence of capacitor mismatch on the DAC cancellation operation. Finally, the availability of the phase (or time) error signal in the digital domain can be leveraged to achieve fractional and non-fractional spur cancellation as explained further herein.

Capacitor DAC

FIG. 4A illustrates additional details of an embodiment of a capacitor DAC to achieve quantization noise cancellation for a fractional-N PLL and FIG. 4B illustrates timing of control signals associated with the embodiment of FIG. 4A. An array 401 of equal valued unit capacitors, $C_{unit}$, are combined with a coupling cap, $C_c$ 402 to adjust the voltage of signal $out_{rc}(t)$. The inclusion of $C_c$ 402 allows the $C_{unit}$ capacitors to have large enough size such that desired matching requirements are achieved. Assuming that the sum of the unit capacitors is much greater than $C_c$, the value of $C_1$ is reduced according to $C_c$ as indicated in FIG. 4A ($C_1$-$C_c$) so the capacitance value seen on node 425 is $C_1$ during charging. The value of $C_c$ is chosen large enough to provide the capacitor DAC with adequate range to fully cancel quantization noise caused by dithering of the divider within the fractional-N PLL. The capacitor array is controlled by DAC control logic 404 that receives the signal error[k] corresponding to the quantization noise residue[k] associated with the delta sigma modulator 310 (FIG. 3) that is additionally processed as described further herein to generate error[k]. The DAC control logic 404 converts the error[k] to a value cap_val[k] corresponding to the capacitor control value that corresponds to the error[k] and supplies that control value to the binary to thermometer encoder 408. Note that the DAC control logic 404 may also include logic for Dynamic Element Matching in order to noise shape the quantization noise due to mismatch of the DAC capacitor elements. The thermometer encoder 408 converts the cap_val[k] value to a thermometer code that supplies a bit for each of the unit capacitors in the array to register 406, which in turn supplies the bits to control charging of the unit capacitors through voltage buffers 407.

The embodiment shown in FIG. 4A provides the ability to precharge the unit capacitors. Note that including the coupling capacitor also allows precharging. The ability to precharge the unit capacitors to either $V_{dd}$ or ground on each of their terminals allows 2N+1 DAC levels to be achieved with only N unit capacitors. The DAC control logic 402 receives the dac_pre(t) timing signal that controls when the precharging takes place. As shown in the timing diagram of FIG. 4B, when ch_high(t) is asserted at 420 in synchronism with the dac_pre(t) signal, register 406 is set causing $V_0(t) \ldots V_{N-1}(t)$ to precharge to their maximum value while the other side of each unit capacitor is coupled to a regulated supply voltage $V_{reg}$ through switch 403. When the dac_clk(t) signal at 422 clocks in thermometer coded values for the DAC into register 406, $V_0(t) \ldots V_{N-1}(t)$ take the value shown at 424, which corresponds to the quantization noise correction voltage that is to be combined with the phase or timing error voltage. Alternatively, the capacitor unit array 403 can be precharged to ground when ch_low(t) is asserted at 426. That causes $V_0(t) \ldots V_{N-1}(t)$ to be reset as shown at 428 and the other side of each unit capacitor to be coupled to ground through switch 405. When the dac_clk(t) clocks at 430, $V_0(t) \ldots V_{N-1}(t)$ take on the thermometer encoded values clocked into register 406, which corresponds to the quantization noise correction voltage that is to be combined with the phase or timing error voltage.

The capacitor DAC can subtract voltage from the phase error or add voltage to the phase error to correct for the quantization error. When the quantization error is positive and the capacitor DAC needs to subtract voltage from phase error voltage on node 425 to cancel the quantization error the unit capacitors are precharged to the reference voltage on both terminals before thermometer code in register 406 is updated to determine the quantization error correction. When the quantization error is negative and the capacitor DAC needs to add voltage to $out_{rc}(t)$ (node 425), the unit capacitors are precharged to ground before the thermometer code in register 406 is updated to determine the quantization error correction. The DAC control logic determines whether to precharge to ground or the reference voltage based on the value of the error[k] signal received.

The timing diagram FIG. 4B illustrates the order of switching events for the illustrated embodiment. Discharge (t) signal causes $out_{rc}(t)$ (node 425) to be discharged through switch 415 at the start of the cycle. At the same time, the precharge signal dac_pre(t) is asserted to precharge the capacitor DAC to the reference voltage Vdd or ground before the charge pulse charge(t). The charge pulse, charge (t), then charges $out_{rc}(t)$ according to the phase (or time) error in the PLL. After charging node 425, the capacitor DAC value is updated after the charge pulse is completed by clocking in the thermometer code into register 406, and then the track(t) switch is closed. This timing approach avoids having the DAC transient influence the charging characteristic of $out_{rc}(t)$ while the charge(t) switch is closed, and also avoids undesired transient behavior, such as ramping of the $out_{rc}(t)$ node, from being seen by the ADC since the track(t) switch is only closed after $out_{rc}(t)$ is charged based on the phase error and then altered by the capacitor DAC. High gain is achieved when the ratio of charging current to capacitance is relatively high so that a small change in phase difference causes a relatively large change in $out_{rc}(t)$. The larger the gain, the more noise is suppressed in nodes that follow the $out_{rc}(t)$ node. Having a high gain for phase error relaxes the requirements on the ADC that follows. When the track(t) signal is asserted, switch 417 closes causing the corrected phase error to be transferred to $out_d[k]$. Then the track(t) signal is de-asserted followed by the discharge(t) signal becoming asserted to start the cycle over again. Overall, the transfer of charge to $out_d[k]$ results in the $out_d[k]$ voltage being the corrected phase error voltage.

In the embodiment of FIG. 4A the capacitor that is charged by the charge pump may be relatively small. In such case, as described earlier, it is beneficial to use the coupling capacitor 402 between that capacitor and the capacitor DAC in order to allow larger sizes for the capacitor DAC elements (to more easily achieve the desired level of matching of the DAC elements). Also, the coupling capacitor allows precharge/charge operations that double the usable range of the cap DAC in terms of number of levels. However, other embodiments may be able to utilize a simplified capacitor DAC structure. FIG. 4C illustrates an embodiment having a simplified capacitor DAC structure. The embodiment may be suitable for applications in which the capacitor charged by the charge pump is sufficiently large so that the capacitor DAC elements are directly coupled to that capacitor (i.e., no coupling capacitor is required). The simplified capacitor DAC structure of FIG. 4C loses the ability to precharge/ charge resulting in N+1 rather than 2N+1 levels being available for cancellation. However, for some applications there may be an advantage in having the simpler capacitor DAC structure. The timing diagram in FIG. 4D illustrates the order of switching events for the illustrated embodiment. Comparison of FIG. 4D to FIG. 4B reveals that the capacitor DAC is centered rather than precharged to a high or low value upon the assertion of the dac_pre(t) signal, but many of the other timing aspects are similar to what were discussed in the case of FIG. 4B.

Figure 5:
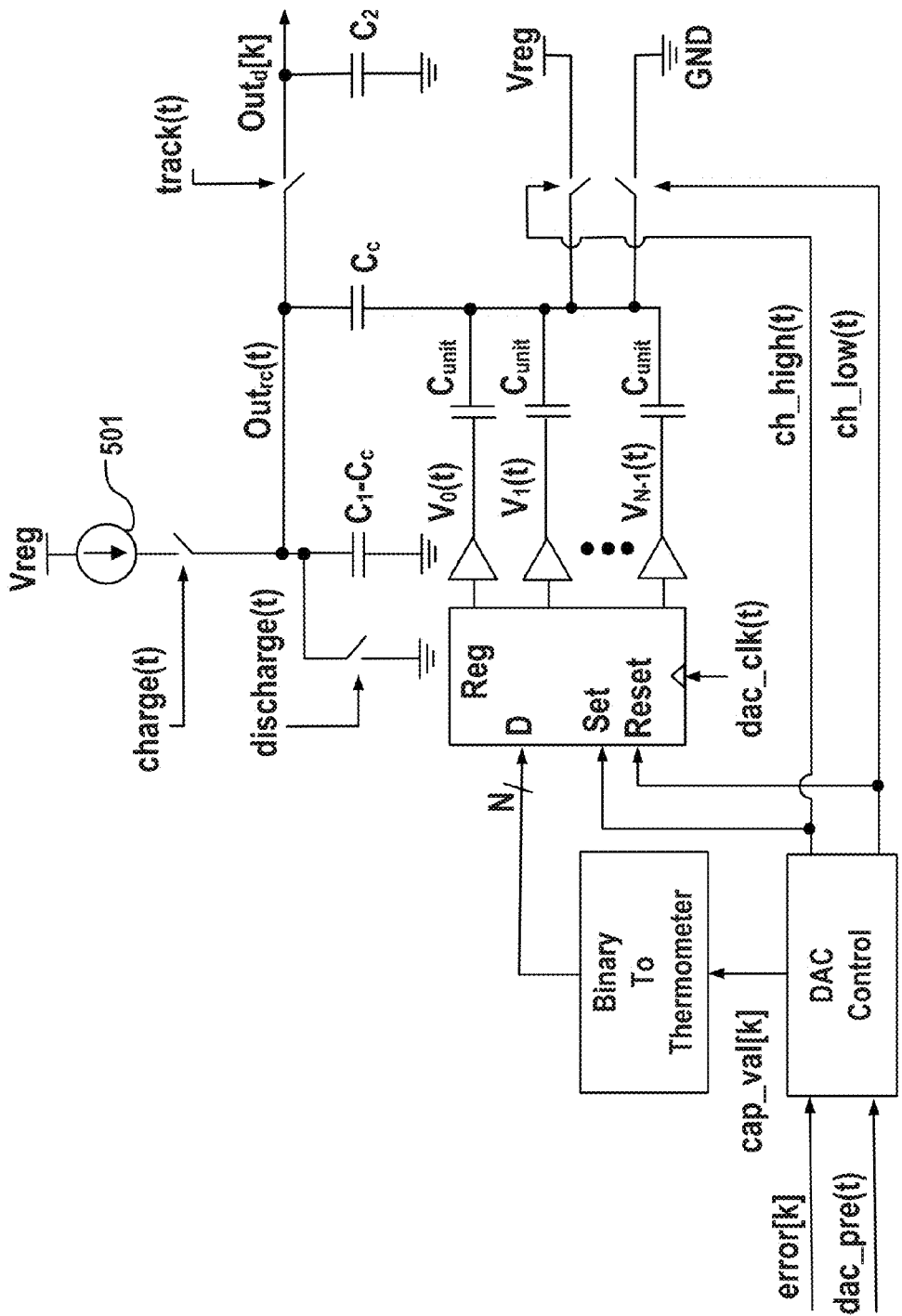
FIG. 5 illustrates an embodiment of a capacitor DAC implementation using N unit capacitors, along with coupling capacitor, and selective precharging to a reference voltage or ground, for a current source based charge pump.

FIG. 5 shows an embodiment in which the capacitor DAC structure is applied when the charge pump is implemented with a current source 501 rather than a resistor 416 as shown in FIG. 4A. FIG. 5 utilizes the same timing shown in FIG. 4B. The advantages of using the resistor based charge pump rather than a current source based charge pump are a lower flicker noise corner and the avoidance of a bias current network to set the charge pump current. The disadvantages of using the resistor based charge pump are a significantly nonlinear charging characteristic when closing the charge(t) switch and the requirement of a low noise voltage regulator to attenuate the impact of supply noise. The nonlinear charging characteristic can be addressed by performing nonlinear quantization noise cancellation as discussed in more detail later herein. The requirement of a low noise voltage regulator is also shared by the capacitor DAC, and has become common practice for many modern mixed signal designs.

Figure 6:
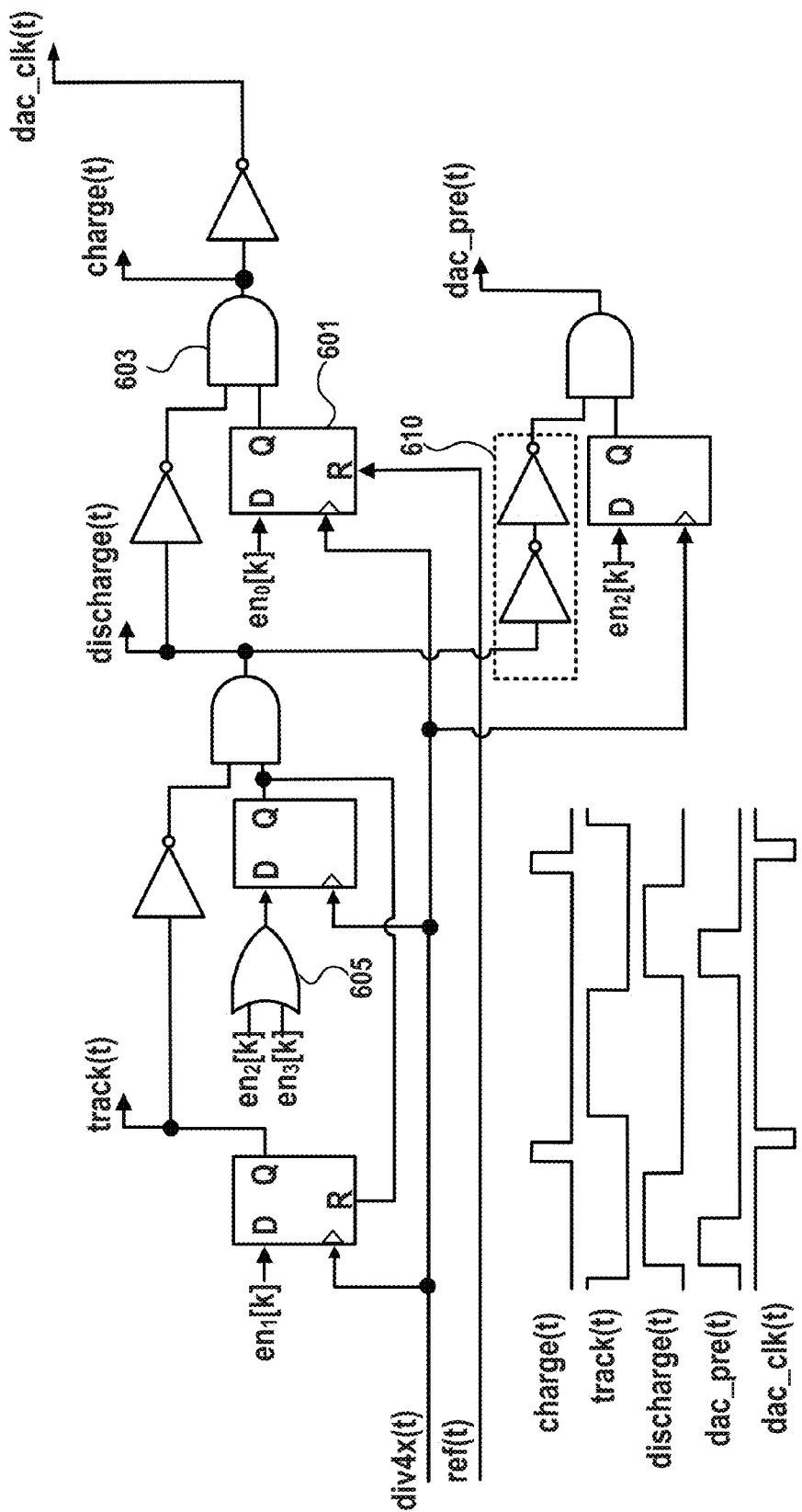
FIG. 6 illustrates a high level diagram of phase detector logic including generation of timing control signals for the capacitor DAC.
Figure 7:
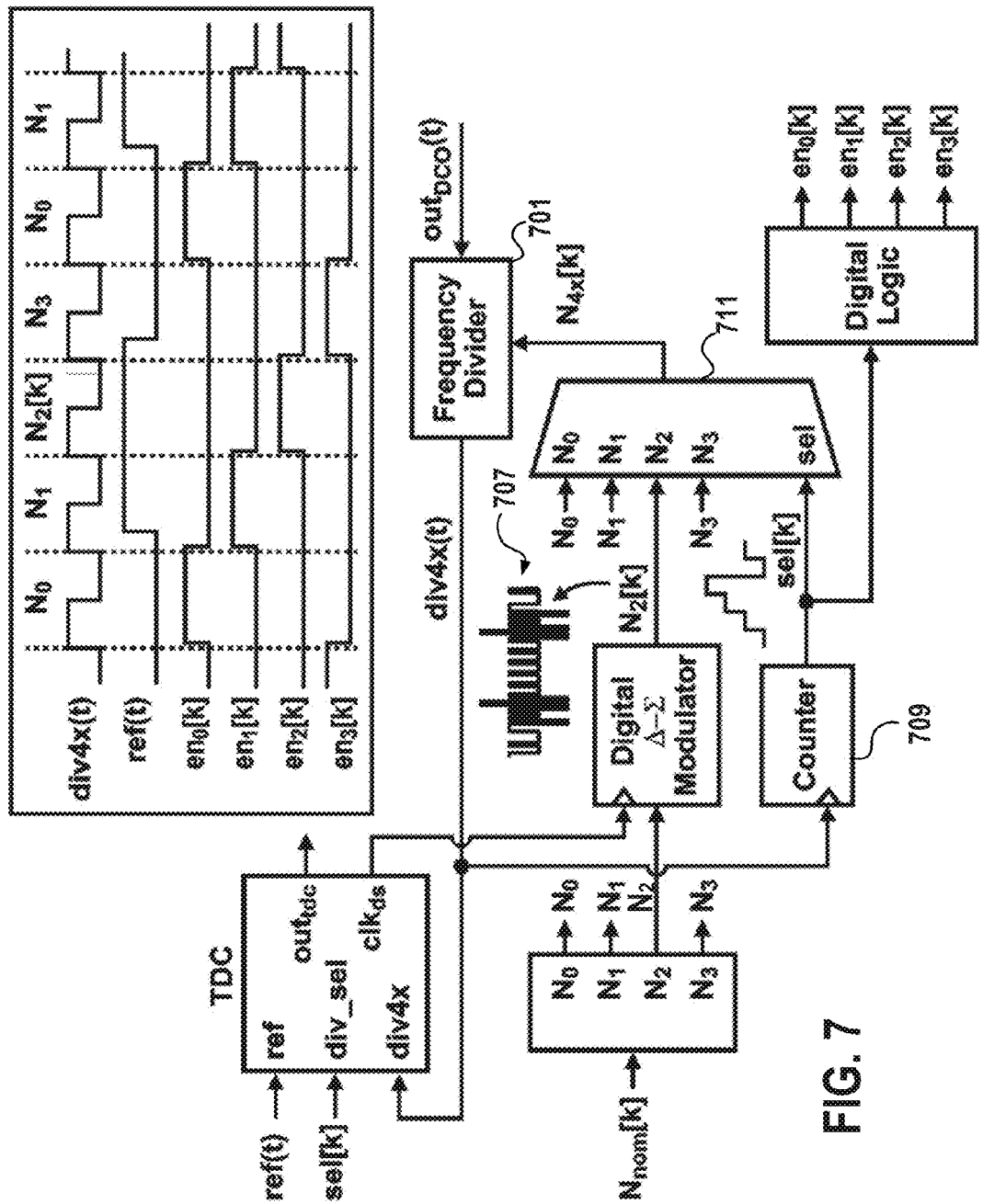
FIG. 7 illustrates utilization of a frequency divider whose output frequency is four times that of the reference frequency when the PLL is in lock in order to generate enable signals used by the phase detector and capacitor DAC.

FIGS. 6 and 7 illustrate various aspects of embodiments to realize the various timing signals utilized for phase (or time error) detection and capacitor DAC control. The phase detector and DAC control circuit, shown in FIG. 6, utilizes enable signals that are generated from the frequency divider output shown in FIG. 7. In the illustrated embodiment, the frequency divider 701 receives the digitally controlled oscillator (DCO) clock 703 and outputs a signal (div4x(t)) having a frequency that is four times that of the reference clock ref(t) when the PLL is in lock, which simplifies the creation of multiphase enable signals as shown in FIG. 6. By leveraging these enable signals in conjunction with the higher divider frequency, the phase detector logic shown in FIG. 6 is able to achieve the various timing control signals with a relatively simple implementation. Those control signals are utilized, e.g., in the embodiment illustrated in FIG. 4A.

Referring to FIGS. 6 and 7, when $en_0[k]$ goes high, the phase detector compares the next rising edge of div4x(t) to the reference clock ref(t) rising edge. As shown in FIG. 6 flip-flop 601 receives signal $en_0[k]$. When $en_0[k]$ goes high, the flip-flop output goes high on the next rising edge of div4x(t). Assuming discharge(t) is 0, causing the other input to AND gate 603 to be high, when the output of flip-flop 601 goes high the output of AND gate 603 goes high causing the charge signal to be asserted. The rising edge of ref(t) causes the charge signal to be deasserted. The logic shown in FIG. 6 is an embodiment to generate the timing signals shown in FIG. 4B. The track(t), discharge(t), and dac_pre(t) signals can all be generated using the reference and feedback clocks and the four enable signals. The enable signals $en_2[k]$ and $en_3[k]$ supplied to OR gate 605 ensure that discharge(t) last for approximately two div4x(t) cycles. Inverters shown in FIG. 6, such as inverters 610, are relied upon to create delay in order to achieve non-overlapping regions between the control signals. For example, the precharge signal dac_pre(t) asserts after delay from two inverters and an AND gate after discharge(t) has become asserted. Note that longer inverter chains may be required in practice to achieve sufficiently wide non-overlap regions that are robust in the face of temperature and process variations.

FIG. 7 illustrates an embodiment showing how the frequency divider 701 that supplies div4x(t) may be controlled. Remember that the output signal div4x(t) is four times the frequency of the reference clock when the PLL is in lock. The nominal divider value $N_{nom}[k]$ may be, e.g., 60.53, leading to $N_0$, $N_1$, $N_2$, and $N_3$ nominally having a value of 15. $N_{nom}[k]$ is the sum of $N_0$-$N_3$. Note that $N_2$ is the only value dithered by the digital $\Delta$-$\Sigma$ modulator in the illustrated embodiment as illustrated by the dithering shown at 707. The counter 709 provides the select signal to multiplexer 711 to cycle through the four divide values to select $N_0$-$N_3$, which are provided to the frequency divider 701. The counter value is also used to generate the enable signals as previously discussed.

High Performance Time-to-Digital Converter

Figure 8:
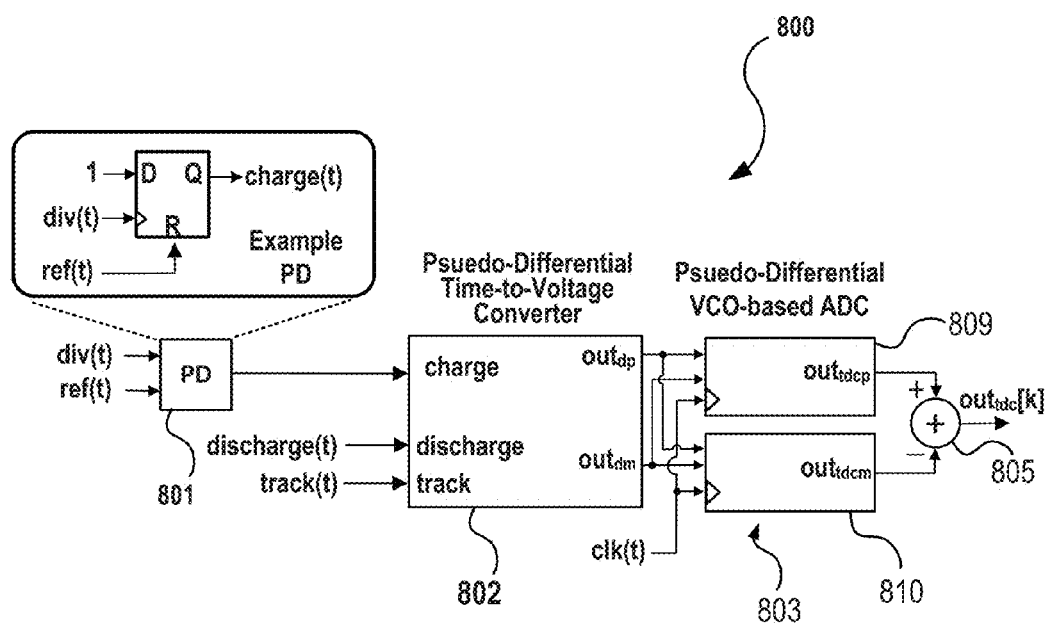
FIG. 8 illustrates a view of PFD/Charge pump as a Time-to-Voltage Converter (TVC), which, when combined with an analog to digital converter (ADC), leads to a Time-To-Digital Converter (TDC) structure.

As mentioned earlier, the PD/charge pump circuits can also be viewed as a Time-To-Voltage Converter (TVC) since the time error between the reference clock signal ref(t) and the divider signal div(t) of the PLL is translated to a voltage according to the length of time that the charge(t) switch is closed. Referring to FIG. 8, the illustrated TVC embodiment is a pseudo differential embodiment that includes a phase detector circuit 801 and a charge pump circuit 802 that provides a positive output ($out_{dp}$) and a negative output ($out_{dm}$). By then using the analog to digital converter (ADC) 803, which includes ADC 809 and ADC 810, to convert the voltage to a digital value, a Time-to-Digital Converter (TDC) 800 is achieved. A simple phase detector (PD) circuit 801 is shown as an example in FIG. 8 that creates a charge(t) pulse which corresponds to the time error between output phases of the reference clock signal and the feedback signal (div(t)) from the divider. Note that the reference clock signal ref(t) edge is assumed to follow the div(t) edge during steady-state operation for the exemplary phase detector circuit 801.

Figure 9A:
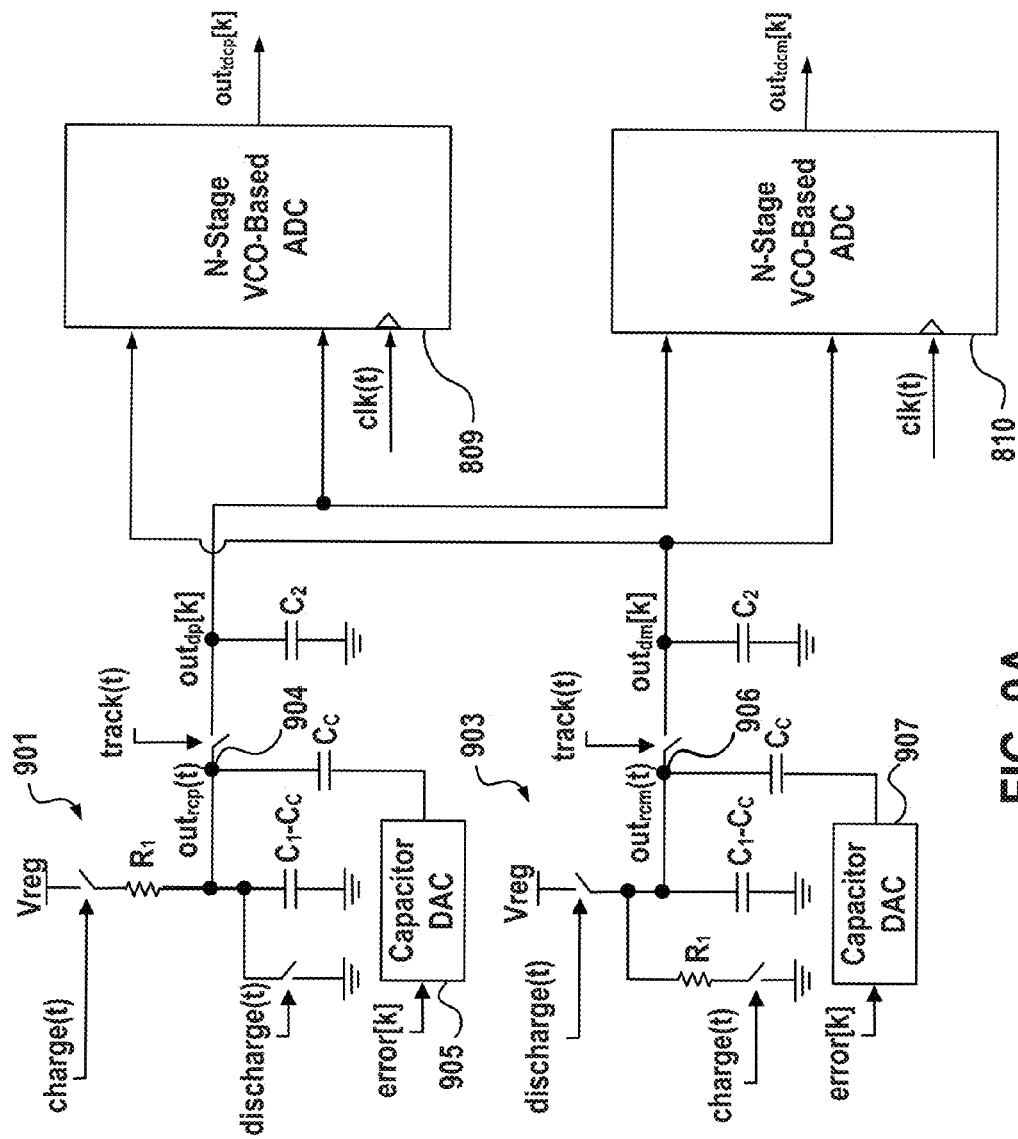
FIG. 9A illustrates an embodiment of a pseudo-differential TDC which includes two resistor based TVCs, two capacitor DACs for quantization noise cancellation, and two VCO-based ADCs.

FIG. 9A shows an embodiment of aspects of the pseudo-differential TDC structure 800. The pseudo-differential TDC includes two resistor based charge pumps 901 and 903, two capacitor DACs 905 and 907 for quantization noise cancellation, and an analog to digital converter that includes two voltage controlled oscillator (VCO)-based ADCs 809 and 810. The use of resistor based charge pumps provides the advantage of low 1/f noise, which is often a significant issue in advanced CMOS designs. The resistor based charge pump has better low frequency phase noise performance but also has a non-linear characteristic such that the amount of current supplied is a function of the voltage difference across $R_1$, which changes in time. Alternatively, current sources could be used in place of the resistor based charge pumps but current sources tend to introduce increased 1/f noise into the system. Once thermal or flicker noise is introduced into the system, it can not be removed. However, the impact of nonlinearities caused by the resistor-based charge pumps can be addressed using signal processing techniques such as nonlinear quantization noise cancellation as previously discussed.

Figure 9B:
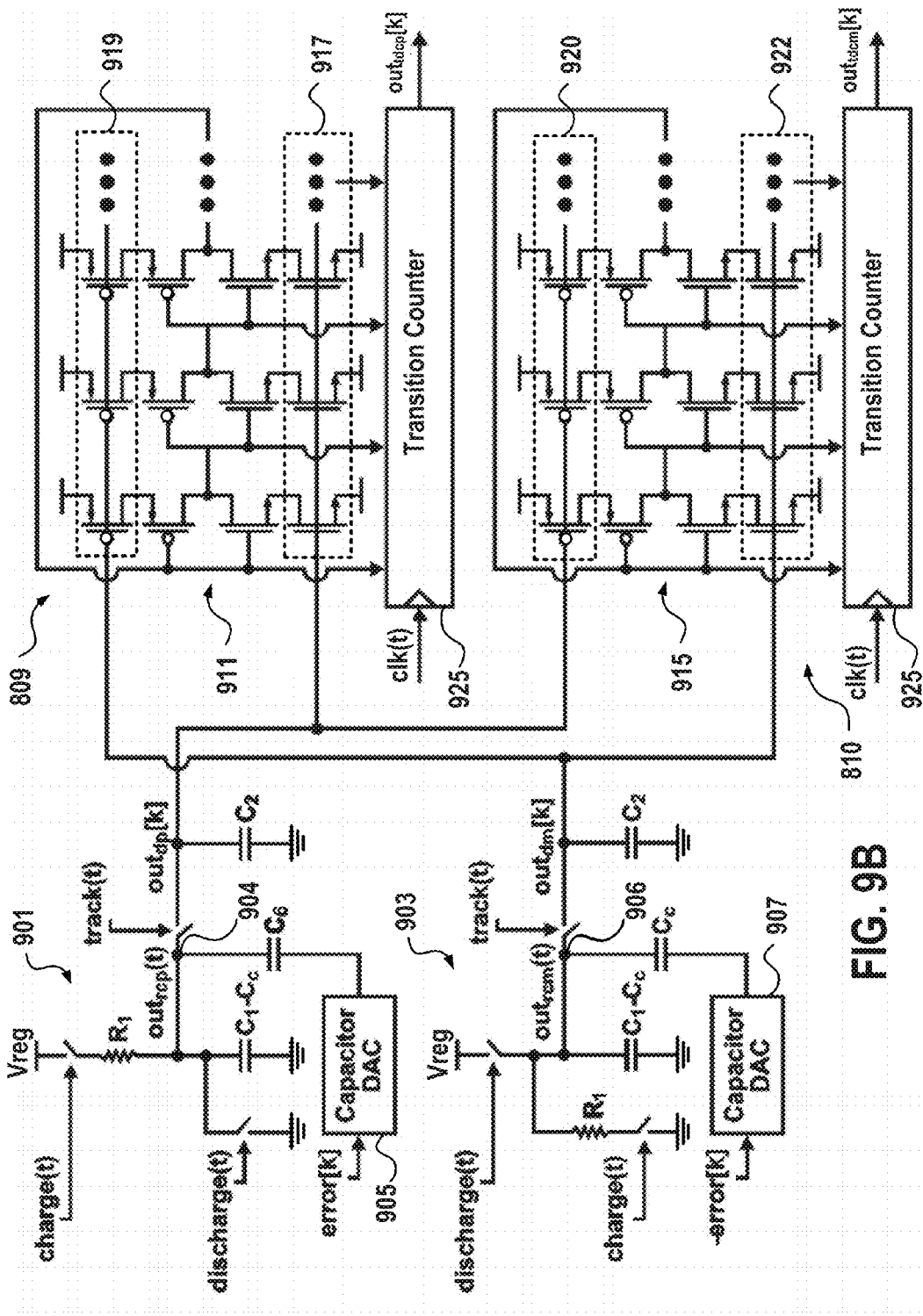
FIG. 9B illustrates additional details of the two VCO-based ADCs of FIG. 9A.

Referring to FIG. 9B, the VCOs of ADCs 809 and 810 are implemented as ring oscillators using inverter stages 911 and 915. The frequency of the oscillators is determined by tuning transistors 919 and 917 for inverter stages 911 and tuning transistors 920 and 922 for inverter stages 915. The two resistor based charge pump circuits 901 and 903 charge their outputs in opposite directions according to the charge(t) pulse. The discharge(t) pulse causes the node $out_{rep}$ 904 to be discharged to ground while the node $out_{rcm}$ 906 charges to a regulated supply voltage Vreg. The output of charge pump circuit 901 feeds directly into NMOS tuning transistors 917 and PMOS tuning transistors 920 to tune the frequency of the VCOs. The output of the charge pump circuit 903 feeds directly into NMOS tuning transistors 922 and PMOS tuning transistors 919 to tune the frequency of the VCOs. The inverter chains 911 and 915 disposed between the tuning transistors and the voltages on the gates of the tuning transistors determine the frequency of the ring oscillators. As shown in FIG. 9B, the gate signals of the tuning transistors are supplied by the positive phase error $out_{dp}[k]$ and the negative phase error $out_{dm}[k]$. The use of both NMOS and PMOS tuning devices in the VCO-based ADC allows a pseudo-differential topology that achieves high tuning gain for controlling the frequency of the ring oscillator within the VCO-based ADC, which provides advantages in noise performance. By utilizing direct voltage tuning of the VCO-based ADCs rather than an approach involving current mirrors, extra current bias circuits are avoided, which yields better noise performance for a given amount of power dissipation, and low voltage operation is readily achieved.

Note that the connections from TVC to VCO-based ADC tuning devices is symmetric in the sense that $out_{dp}[k]$ and $out_{dm}[k]$ each influence both NMOS and PMOS devices, which improves even order cancellation of nonlinearity in the ADCs and also helps to reduce the impact of gate leakage on these nodes. However, this connection arrangement largely removes information of the common-mode value of $out_{dp}[k]$ and $out_{dm}[k]$ from the ADC outputs. Fortunately, the common-mode value of $out_{dp}[k]$ and $out_{dm}[k]$ is implicitly set by the opposite charging characteristics of the TVC outputs, and the capacitor DAC input values can be set to have opposite sign as shown in FIG. 9B. Since this arrangement leads to a common-value of zero from the pseudo-differential capacitor DACs, undesired common-mode variations of $out_{dp}[k]$ and $out_{dm}[k]$ due to mismatch will not be suppressed. Fortunately, the impact of such mismatch-induced common-mode variations are insignificant assuming best design practices are employed to ensure good matching between the circuit elements of the TDC, and appropriate calibration techniques are employed. As FIGS. 9A and 9B imply, the use of a VCO-based ADC rather than an alternative ADC structure offers a relatively simple implementation of the overall TDC. FIG. 9B also shows transition counter logic 925, which determines the number of edges that occur in the oscillator of the VCO-based ADC within a given measurement interval and thus provides an indication of frequency of the respective oscillator.

As a representative example of operation, note that phase error leading to an increased pulse width for the charge(t) signal will cause node $out_{dp}[k]$ to increase in voltage and the node $out_{dm}[k]$ to decrease in voltage for the circuit shown in FIG. 9B. In turn, the higher voltage of node $out_{dp}[k]$ and lower voltage of node $out_{dm}[k]$ will lead to an increase in the frequency of the ring oscillator 911 in ADC 809 and decrease in the frequency of ring oscillator 915 in ADC block 810. The resulting change in frequency is due to the fact that higher voltage on the gates of the NMOS transistors 917 and lower voltage on the gates of the PMOS transistors 919 leads to increased current availability for inverter stages 911 and therefore a higher frequency of oscillation. Similarly, a lower voltage on the gates of the NMOS transistors 922 and higher voltage on the gates of the PMOS transistors 920 leads to decreased current availability for inverter stages 915 and therefore a lower frequency of oscillation. For the case of phase error leading to a decreased pulse width for the charge(t) signal, node $out_{dp}[k]$ will decrease in voltage and node $out_{dm}[k]$ will increase in voltage leading to a decrease in the frequency of the ring oscillator 911 in ADC 809 and increase in the frequency of ring oscillator 915 in ADC block 810. Therefore, subtraction of the measured frequency values of VCO-based ADC blocks 809 and 810 leads to an error signal proportional to the phase error. The outputs of transition counters 925 provide an indication of the VCO-based ADC frequency information as digital signals. Therefore, as shown in FIG. 8, the positive $out_{tdep}[k]$ signal and the negative $out_{tdcm}[k]$ signal are subtracted in summer 805 to generate the $out_{tdc}[k]$ signal that is a digital value that corresponds to the phase error. Note that in FIG. 9B, both voltages are used to tune oscillators 911 and 915. In other embodiments, the voltage $out_{dp}[k]$ may be used alone to tune oscillator 911 and $out_{dm}[k]$ may be used alone to tune oscillator 915. In such an embodiment the other tuning transistors (919 and 920) not directly connected to the tuning voltage may be configured similar to the embodiment shown in FIG. 10B. Alternatively, tuning transistors 919 and 920 (or 917 and 922) could be omitted entirely.

Figure 10A:
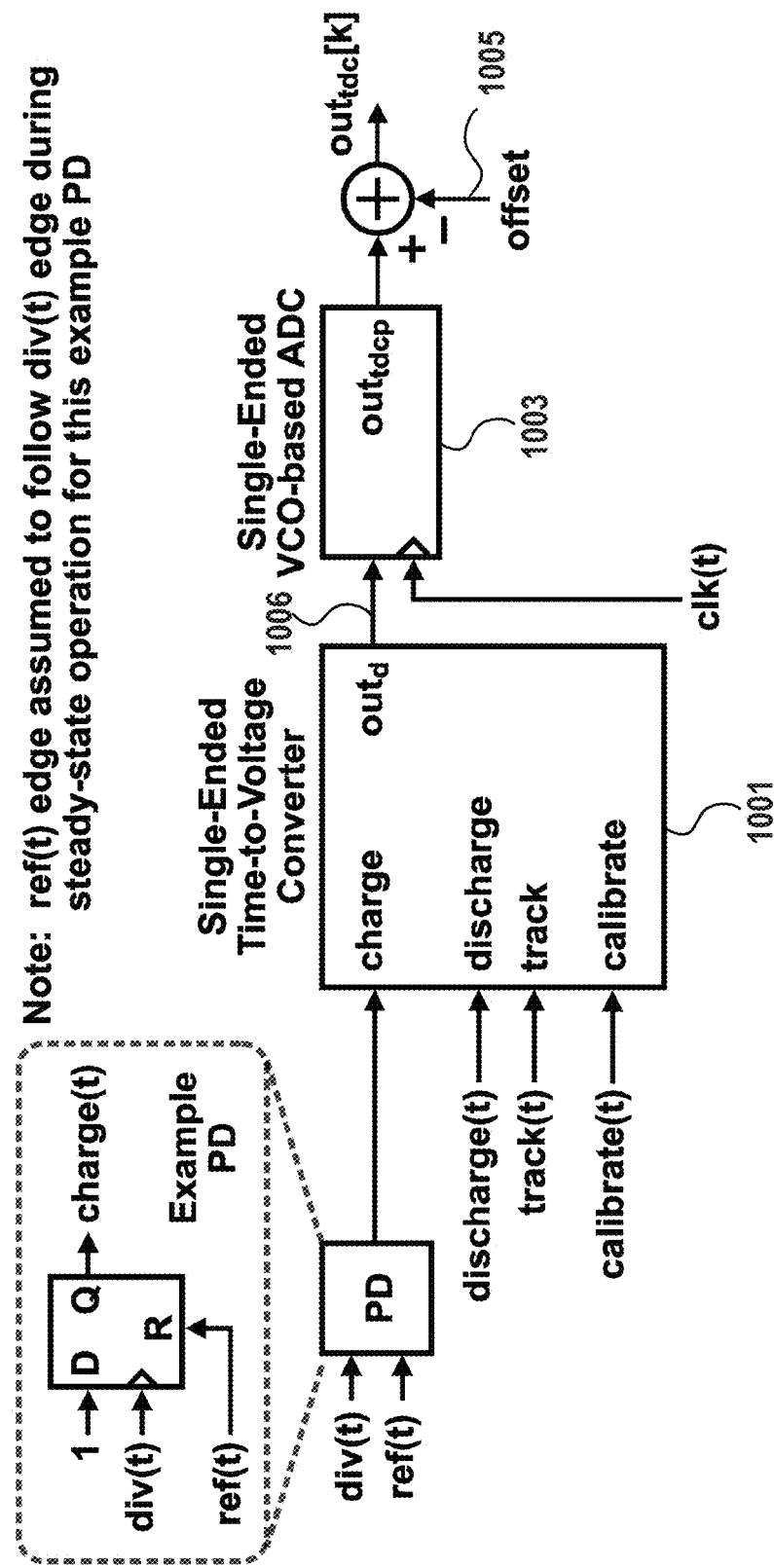
FIG. 10A illustrates a single-ended time to digital converter embodiment.
Figure 10B:
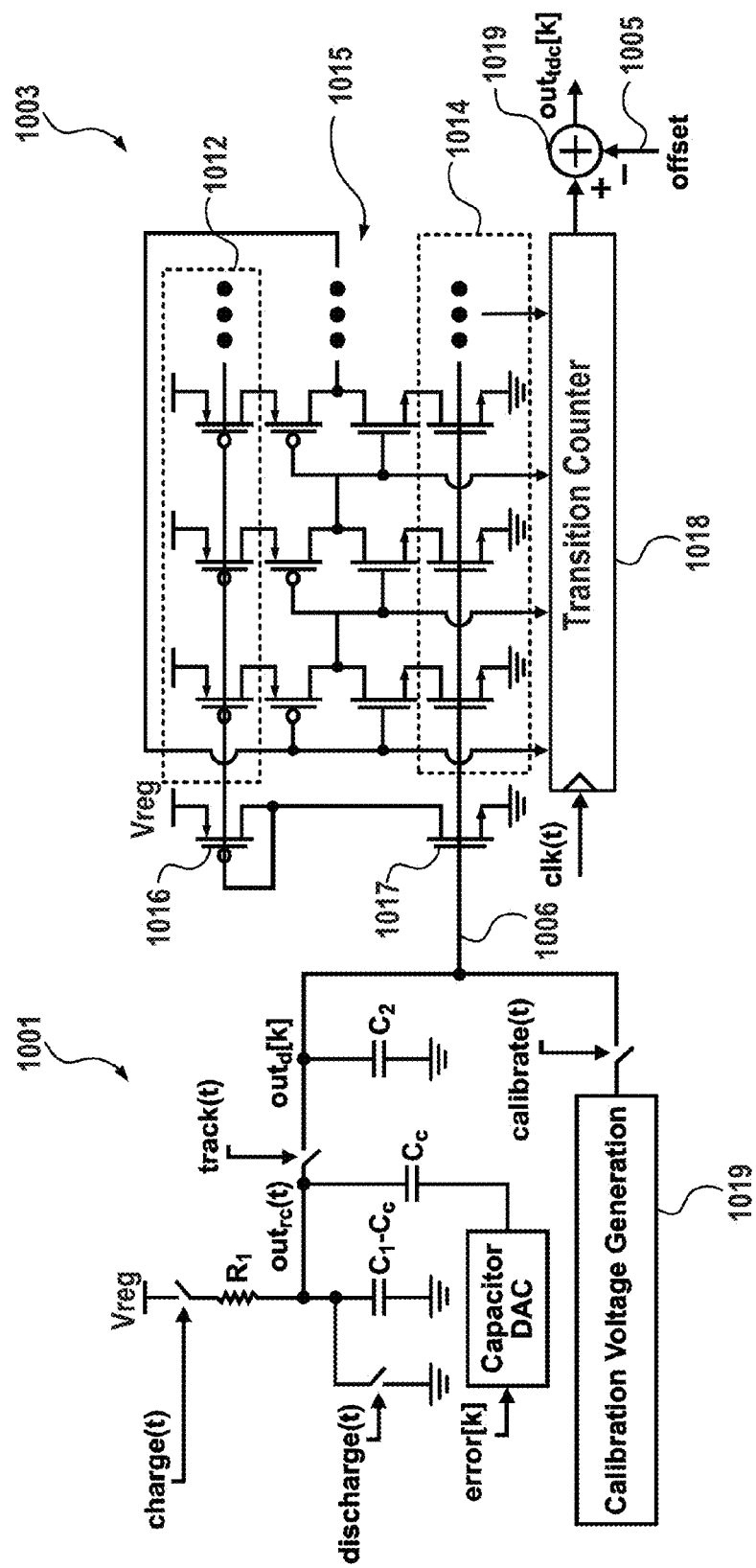
FIG. 10B illustrates additional details of an embodiment of a single-ended time to digital converter.

While FIGS. 9A and 9B show a pseudo differential embodiment, other applications may utilize a single-ended implementation, which may be advantageous for achieving lower power and area. FIGS. 10A and 10B illustrate a single-ended embodiment for a time-to-digital converter. FIG. 10A shows a single-ended time-to-voltage converter 1001 and a single-ended VCO-based ADC 1003. Single-ended embodiments may generally require some level of calibration to account for sensitivity of the ADC to process, voltage, and temperature variations. As an example, FIG. 10A shows an offset 1005, which can be obtained through calibration, being combined with the output of the ADC 1003. In particular, by setting the offset according to the output of the VCO-based ADC 1003 when the $out_d[k]$ signal 1006 is set to a voltage at the middle of its range, as achieved through calibration, the overall output signal $out_{tdc}[k]$ will achieve a value of 0 when $out_d[k]$ is in the middle of its range, and a positive or negative value otherwise.

FIG. 10B illustrates additional details of a single-ended TDC. The output of the time to voltage converter 1001 supplies an input voltage $out_d[k]$ to tune the ring oscillator 1015. The ADC 1003 includes PMOS tuning transistors 1012 and NMOS tuning transistors 1014. The oscillator frequency depends on the tuning voltage. The embodiment in FIG. 10B provides a simple approach of using transistors 1016 and 1017 for controlling PMOS versus NMOS frequency adjustment for the tuning transistors with a single-ended control signal. When the input voltage $out_d[k]$ is relatively high, tuning transistors 1014 turn on relatively strongly as their gate voltage is relatively high as do tuning transistors 1012 with a relatively low gate voltage (brought towards ground through transistor 1017). Thus, tuning transistors 1012 and 1014 will turn more strongly or more weakly based on the voltage corresponding to the phase error. More sophisticated approaches can be employed in other embodiments at the expense of higher analog complexity. While two sets of tuning transistors 1012 and 1014 are shown in FIG. 10B, in other embodiments only one set of tuning transistors may be utilized. The transition counter 1018 supplies a count value corresponding the frequency of the ring oscillator 1015. That count value is supplied to summer 1019, which also receives the offset value 1005 that is determined during calibration. Note that the voltage controlled oscillators used in various embodiments shown, e.g., in FIGS. 9A, 9B, 10A, and 10B, may also be implemented by using an intermediate circuit to convert the voltage of the TVC into one or more currents, and then supplying the current(s) to control the frequency of one or more current controlled oscillators.

Calibration voltage generation 1019 is used during calibration of the ADC by supplying a calibration voltage. As discussed above, voltage calibration should primarily determine VCO frequency for a mid-range voltage input in order to determine the offset. This allows the overall output of the TDC $out_{tdc}[k]$ to have a typical value of zero at the mid-range value of the voltage input into VCO-based ADC, which is convenient when using $out_{tdc}[k]$ as a feedback control signal within the PLL. Note that calibration may also be advantageously employed for the embodiments shown in FIGS. 9A and 9B.

Figure 11A:
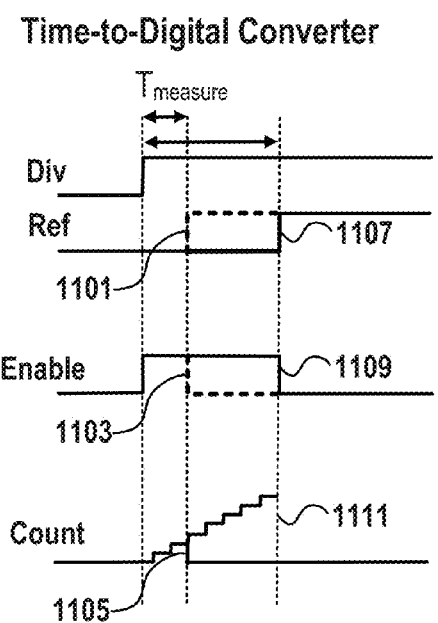
FIG. 11A shows illustrates the resolution of classical TDC, which is set by an inverter delay.
Figure 11B:
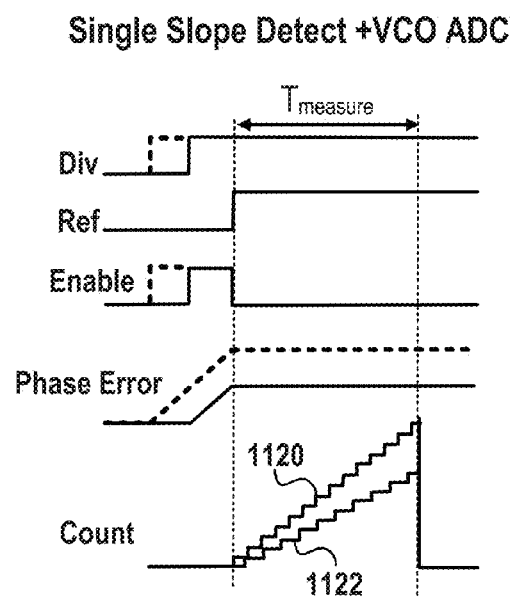
FIG. 11B illustrates the higher resolution (as compared to the classical TDC) of an embodiment of the TDC described herein in which higher gain in the TVC allows reduction of the impact of the ADC resolution.

A particular advantage of the combined TVC and VCO-based ADC structure for realizing a TDC is that the impact of the ADC quantization noise (and ADC thermal and flicker noise) can be reduced by increasing the gain in the TVC. As indicated in FIGS. 11A and 11B, the ability to reduce the impact of quantization noise is in contrast to classical TDC designs in which the quantization noise is set by the inverter delay in the CMOS process being used. FIGS. 11A and 118B shows a comparison of resolution of classical TDC (FIG. 11A), which is set by an inverter delay, versus the TDC described herein (FIG. 11), in which higher gain in the TVC allows reduction of the impact of the ADC resolution. In FIG. 11A the rising edge of Ref clock determines the falling edge of the Enable signal. When Ref clock rises at 1101, the enable signal falls at 1103 and the count stops at 1105. If the Ref signal rises later at 1107 because of a larger phase difference the Enable signal continues until 1109 and the count continues until 1111. However, the count value in FIG. 11A has a constant slope such that resolution can be increased only by reducing inverter delay in the TDC. In FIG. 11B, the Enable signal, which corresponds to the charge(t) signal, similarly takes on a pulse width corresponding to the difference in time between the rising edges of the divider output (DIV) and Ref clock. However, the count value in FIG. 11B (1120 or 1122) is determined by the pulse width of the Enable signal in combination with the gain of TVC and delay per stage of the VCO based ADC. A large gain in the TVC ensures that the count value produced by the ADC over the measurement interval $T_{measure}$, which typically corresponds to the period of the Ref clock, will be significantly impacted by the phase error change reflected in the voltage error signal supplied to the ADC. In particular, a large TVC gain will lead to a wider range of frequency variation in the VCO-based ADC for a given range of phase error, and therefore lead to a higher range of count values for that given range in phase error such that each change in count value corresponds to a smaller phase error step size. The different count values for different phase errors are reflected in the count values 1120 and 1122.

Larger gain in the TVC shown in FIG. 9B is achieved by reducing the value of $R_1C_1$ such that nodes $out_{rep}(t)$ and $out_{rem}(t)$ have a faster charging characteristic as a function of the charge(t) pulse width. In an exemplary embodiment the resistance $R_1$ is 1 kOhms, the capacitance $C_1$ is approximately 350 fF, the coupling capacitor Cc is approximately ⅓ to ½ of $C_1$ and the unit capacitors (see FIG. 4A) are approximately 50 fF. These particular values are only examples and the capacitor values used in any particular embodiment can change based on the requirements of the particular embodiment and process technology. While a faster charging characteristic can provide increased gain, increased TVC gain leads to a smaller phase error detection range and higher nonlinearity seen by the divider-induced quantization noise. As such, design of the TVC gain value involves a tradeoff between lowering the impact of noise in the VCO-based ADC versus achieving adequate phase detector range to accommodate noise and perturbations in the PLL phase error signal and reasonable levels of nonlinearity to achieve the desired level of performance of the nonlinear quantization noise cancellation.

The PLL generally requires a wider phase detection region to acquire frequency lock than during steady-state operation, which only requires an adequately large phase detection range to accommodate noise and perturbations. Some embodiments may augment the raw TDC characteristic with a coarse phase detector that is only active outside of the steady-state operating range of the phase (or time) error signal. FIG. 12A illustrates the raw TDC characteristic at 1201 assuming the resistor based charge pump in the case where the midpoint charge value occurs when charge(t) has a time span of 2.5 DCO cycles. That nominal time span is assumed to provide an adequate cushion of time for maintaining a reasonably large minimum pulse width for charge (t) given the expected changes due to change in the divider value of approximately ±one DCO cycle that occur when using a $2^{nd}$ order delta-sigma modulator to control the frequency divider. When the nominal time span of charge(t) is set to be longer than 2.5 DCO cycles through appropriate choice of $R_1C_1$ in FIG. 10B (or $I/C_1$ for a current based charge pump), the nonlinearity experienced by the Δ-Σ quantization noise will be reduced but the TVC gain will also be reduced. The nominal charging value is set to approximately half the value of $V_{reg}$ (the regulated supply voltage used to charge the capacitors based on the charge(t) signal).

Because of the narrow range of particular embodiments of the TDC structure, an augmented detection scheme may be desirable in order to reliably achieve lock conditions for the PLL. In other embodiments, the coarse phase detector may not be needed given a monotonic characteristic of the TDC. FIG. 12B illustrates how the augmentation works in one embodiment such that a monotonically increasing error curve is achieved across the time error range of –T/2 to T/2 with the coarse phase detector output being added to the TDC output in the digital domain. If the PLL is determined to be in a phase early condition (time errors Δt less than zero), the coarse phase detector output is assumed to be negative such that the TDC output is reduced as indicated at 1203. If the PLL is determined to be in a phase late condition (time errors Δt greater than the steady-state operating range of the TDC such as Δt greater than T/4), the coarse phase detector output is assumed to be positive such that the TDC output is increased as indicated at 1205. The relative scale factors of the coarse phase detector outputs in relation to the TDC output is set such that a monotonically increasing (or decreasing for some embodiments) error characteristic is achieved from their combined output and proper settling behavior is achieved for the PLL. In the illustrated embodiment, the period (T) of the Ref clock is divided into quartiles to determine when phase early and phase late occur. The quartile 1207 between 0 and T/4 is assumed to be the steady-state operating range of the TDC.

Figure 13A:
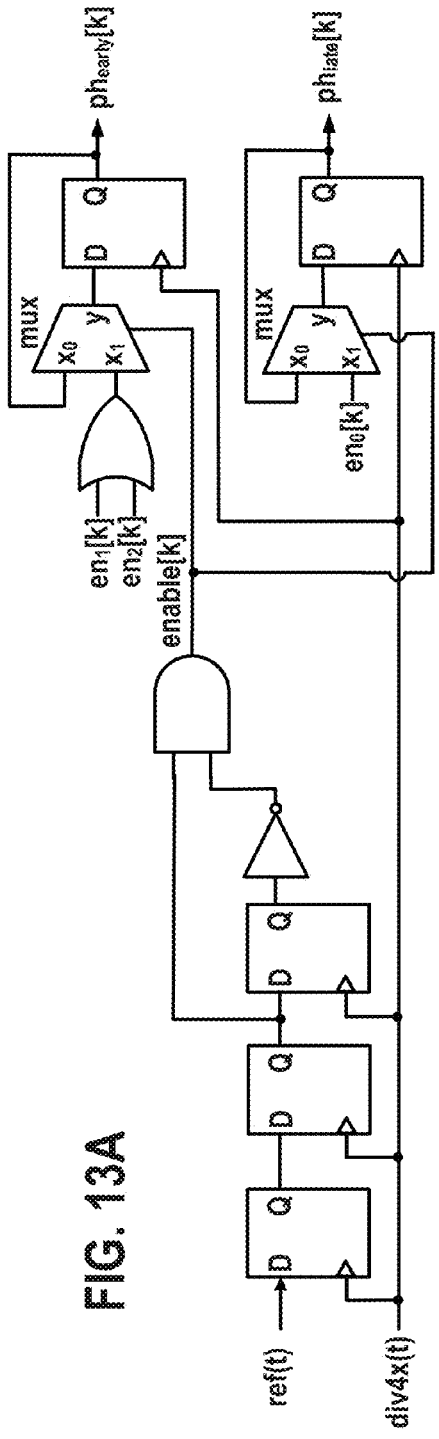
FIG. 13A illustrates an embodiment of a digital coarse phase detector circuit that determines phase early and phase late signals.
Figure 13B:
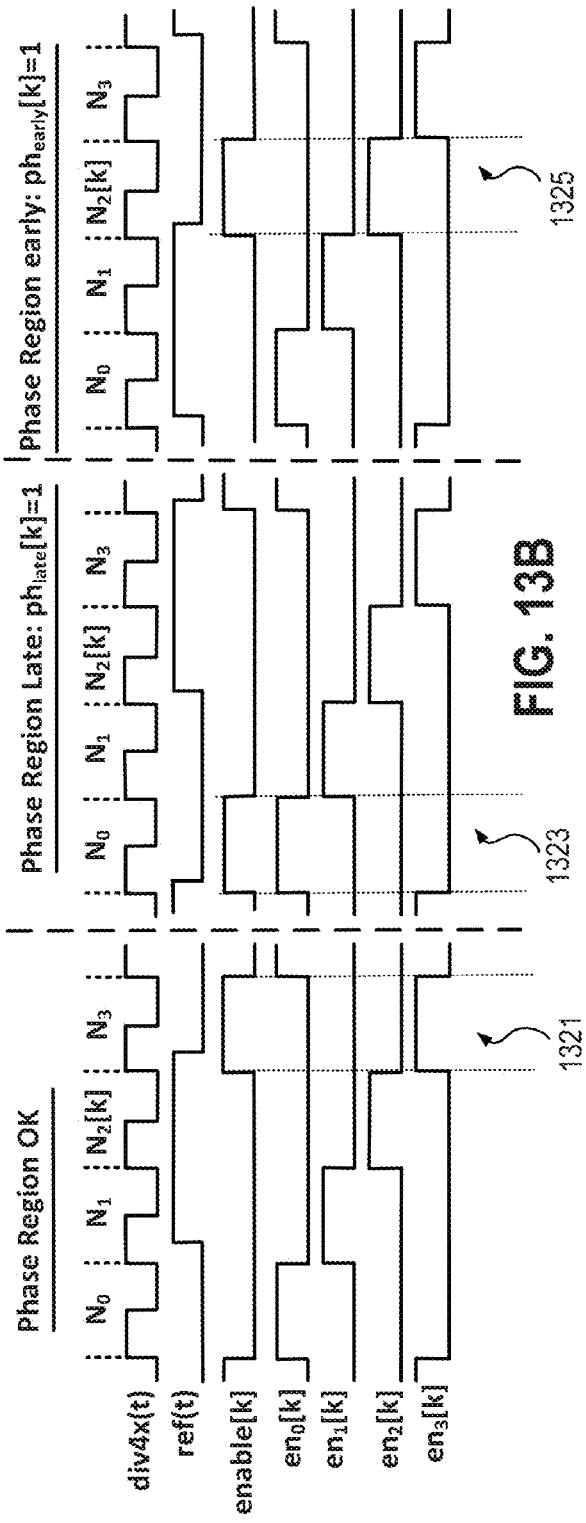
FIG. 13B illustrates a timing diagram associated with the embodiment of FIG. 13A.
Figure 14:
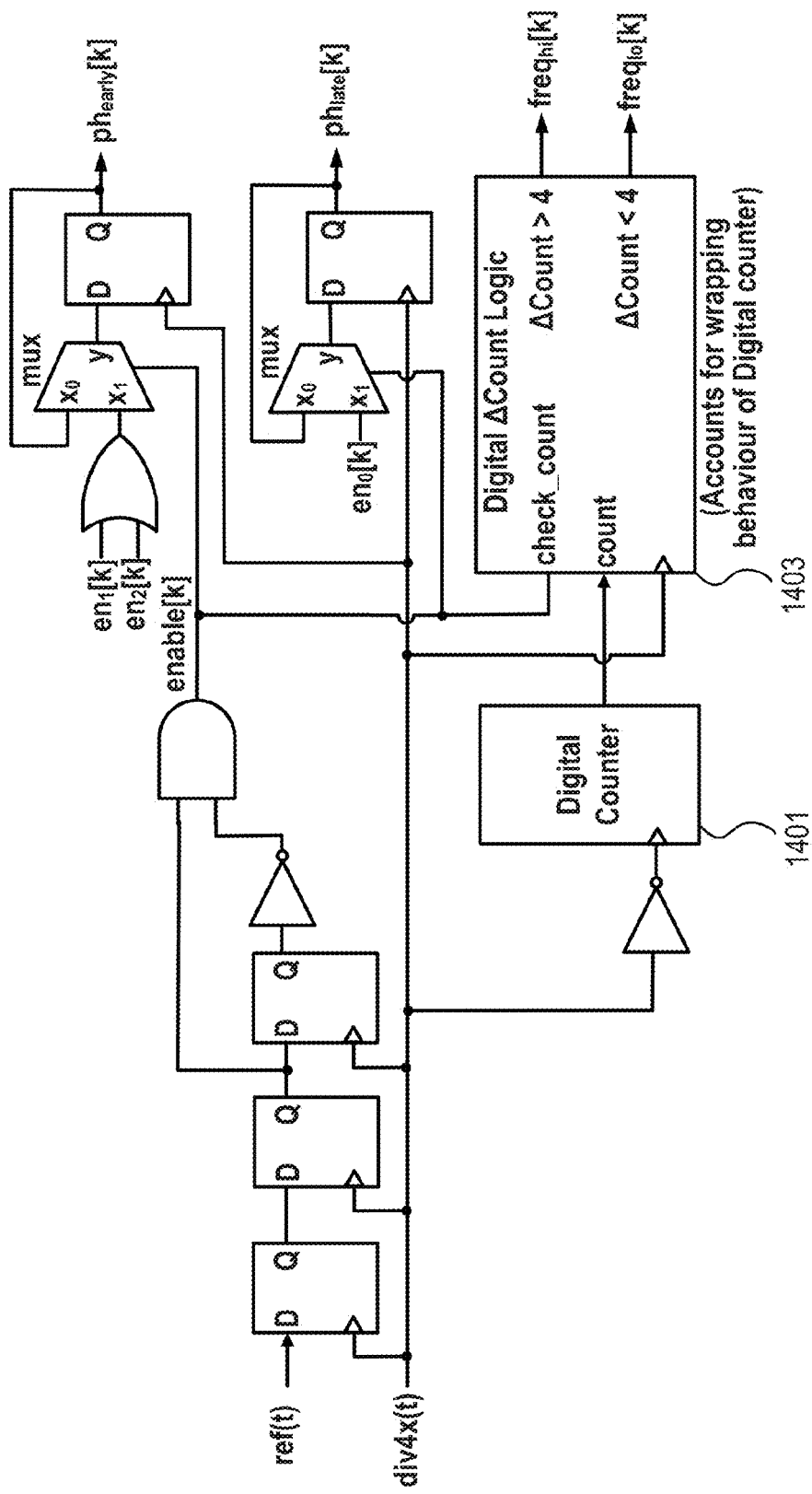
FIG. 14 illustrates an embodiment in which the coarse phase detector circuit of FIG. 13A is modified to additionally sense frequency error.

FIG. 13A illustrates an embodiment of a digital coarse phase detector circuit that determines phase early and phase late. FIG. 13B illustrates a timing diagram associated with the circuit of FIG. 13A. Referring to FIG. 13B, $en_0[k]$, $en_1[k]$, $en_2[k]$, $en_3[k]$ correspond to the four phases of the div4x(t) divide signal. Remember that the div4x(t) corresponds to a feedback signal having a frequency that is four times that of the reference signal when the PLL is in lock. FIG. 13B illustrates the timing associated with the phase ok region 1321 corresponding to region 1207 (see FIG. 12). The digital coarse phase detector circuit of FIG. 13A determines of the phase region is phase late in 1323 or phase early in 1325. Note that the digital coarse phase detector circuit of FIG. 13A is intrinsically active (provides an asserted $ph_{early}[k]$ or $ph_{late}[k]$ signal) only when the PLL is out of lock. FIG. 14 illustrates another embodiment in which the coarse phase detector circuit of FIG. 13A is modified to include a digital counter 1401 and count logic 1403 to sense frequency error. When the PLL is locked there will be four div4x cycles per ref clk cycle. Greater than 4 div4x cycles implies the DCO frequency is too high such that $freq_{hi}[k]$ is asserted. Less than div4x cycles implies the DCO frequency is too low such that $freq_{lo}[k]$ is asserted.

Figure 15:
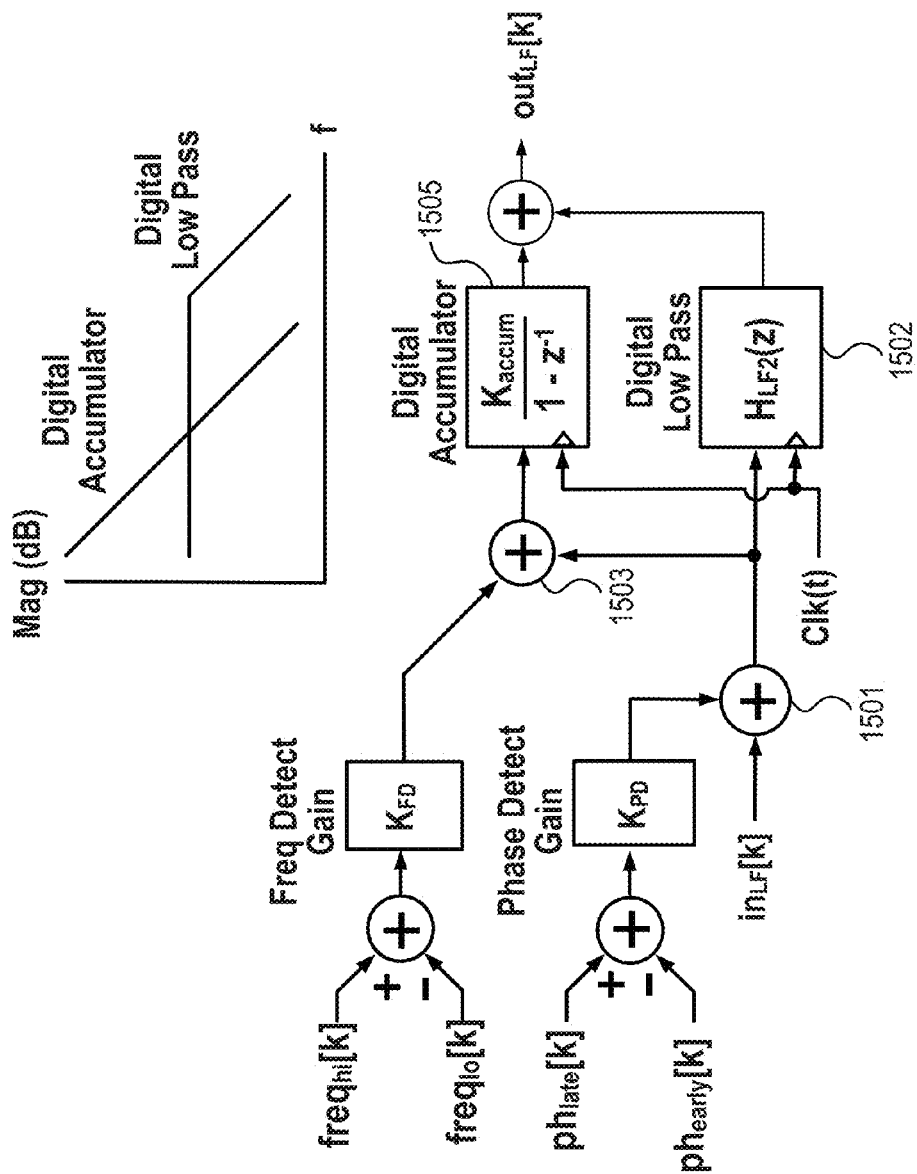
FIG. 15 illustrates how the outputs from the digital coarse phase detector and frequency sense circuits are used to augment or adjust the output of the TDC as it is fed into an embodiment of a digital PLL loop filter after being passed through a digital compensation filter.

FIG. 15 illustrates one embodiment of how the outputs from the digital coarse phase detect and frequency sense circuits are used in the loop filter to augment or adjust the output of the TDC that is supplied to the loop filter after it has been passed through a digital compensation filter. FIG. 15 shows the loop filter input $in_{LF}[k]$ adjusted in summer 1501 by a signal based on gain $K_{PD}$ and the $ph_{late}[k]$ and $ph_{early}[k]$ signals. In general, KPD is chosen in order achieve a monotonically increasing (or decreasing) phase error characteristic in the range of –T/2 to T/2 as shown in FIG. 12B. The adjusted signal is supplied from summer 1501 to the digital low pass filter 1502. In addition, the augmented signal is supplied to the summer 1503 where it is added to a signal based on gain $K_{FD}$ and the $freq_{hi}[k]$ and $freq_{lo}[k]$ signals (see FIG. 14). Summer 1503 supplies its output to digital accumulator 1505, which is summed with the low pass filter output to generate the overall loop filter output $out_{LF}[k]$.

Nonlinear Quantization Noise Cancellation

The nonlinearity introduced by the resistor based charge pump generally leads to the preference of a second order delta sigma (Δ-Σ) modulator to control the dithering of the PLL frequency divider and the use of nonlinear quantization noise cancellation in order to achieve excellent wideband PLL noise performance. To explain, higher order shaped quantization noise is more sensitive to noise folding when passing through a nonlinearity than lower order shaped quantization noise. However, the quantization noise produced by a first order Δ-Σ modulator is generally not well scrambled, which leads to high spurious content in its spectrum and slows the convergence of the coefficient estimation for nonlinear quantization noise cancellation. As such, a second order delta-sigma modulator is the preferred choice in some embodiments to avoid excessive noise folding but also to achieve fast convergence of the nonlinear coefficient estimates.

Figure 16:
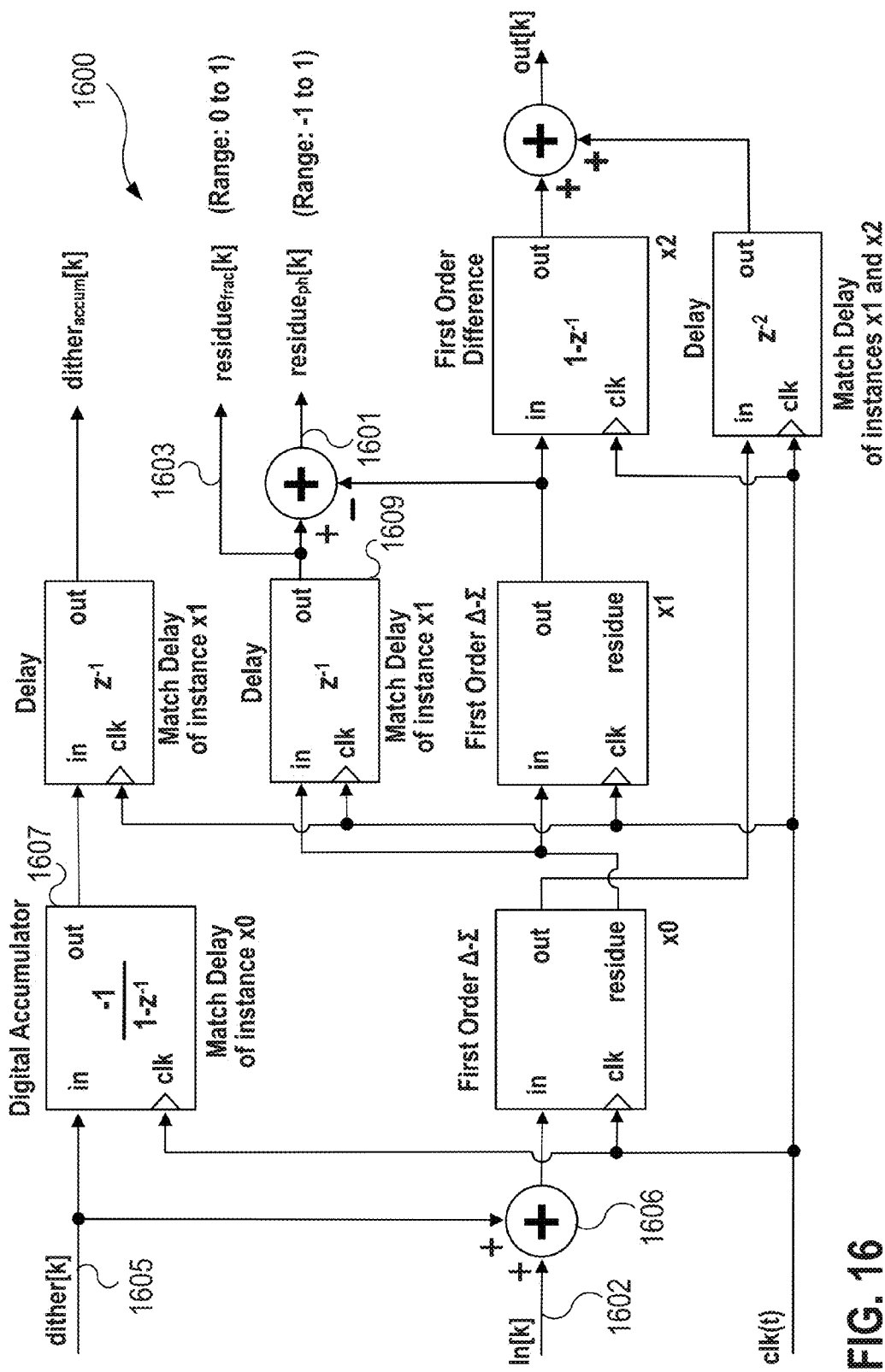
FIG. 16 illustrates a block diagram of an embodiment of a delta sigma modulator.

FIG. 16 shows a preferred digital Δ-Σ modulator implementation to control the PLL frequency divider in order to achieve fractional divide values. The Δ-Σ modulator structure 1600 includes a conventional second order multi-stage noise shaping (MASH) structure, which is augmented to generate two residue sequences and an accumulated dither signal. The residue sequences include $residue_{ph}[k]$ 1601, which corresponds to the Δ-Σ quantization noise to be cancelled, and $residue_{frac}[k]$ 1603, which can be utilized to achieve fractional spur cancellation. Note that out[k] in FIG. 16 corresponds to $N_2[k]$ in FIG. 7 and In[k] 1602 corresponds to $N_2$ in FIG. 7. The dither signal, dither[k] 1605, is added in summer 1606 at the input of the Δ-Σ modulator in order to improve scrambling of its quantization noise, which also aids in achieving faster convergence of the estimation of the nonlinear coefficients for quantization noise cancellation. A digital accumulator 1607 converts the dither sequence to sequence $dither_{accum}[k]$ in order to achieve cancellation of the dither signal as discussed below. Note that it is desirable that the dither_accum[k] signal have zero mean in order to achieve accurate performance for the nonlinear quantization noise cancellation, which may require additional commonly understood signal processing operations beyond the conceptual block diagram shown in FIG. 16. Note that the summers shown in FIG. 16 and the other figures herein may be additive or subtractive. That is a summer may add signals together, e.g., as shown in summer 1606, or subtract signals, as shown, e.g., in the summer supplying $residue_{ph}[k]$ 1601.

Figure 17:
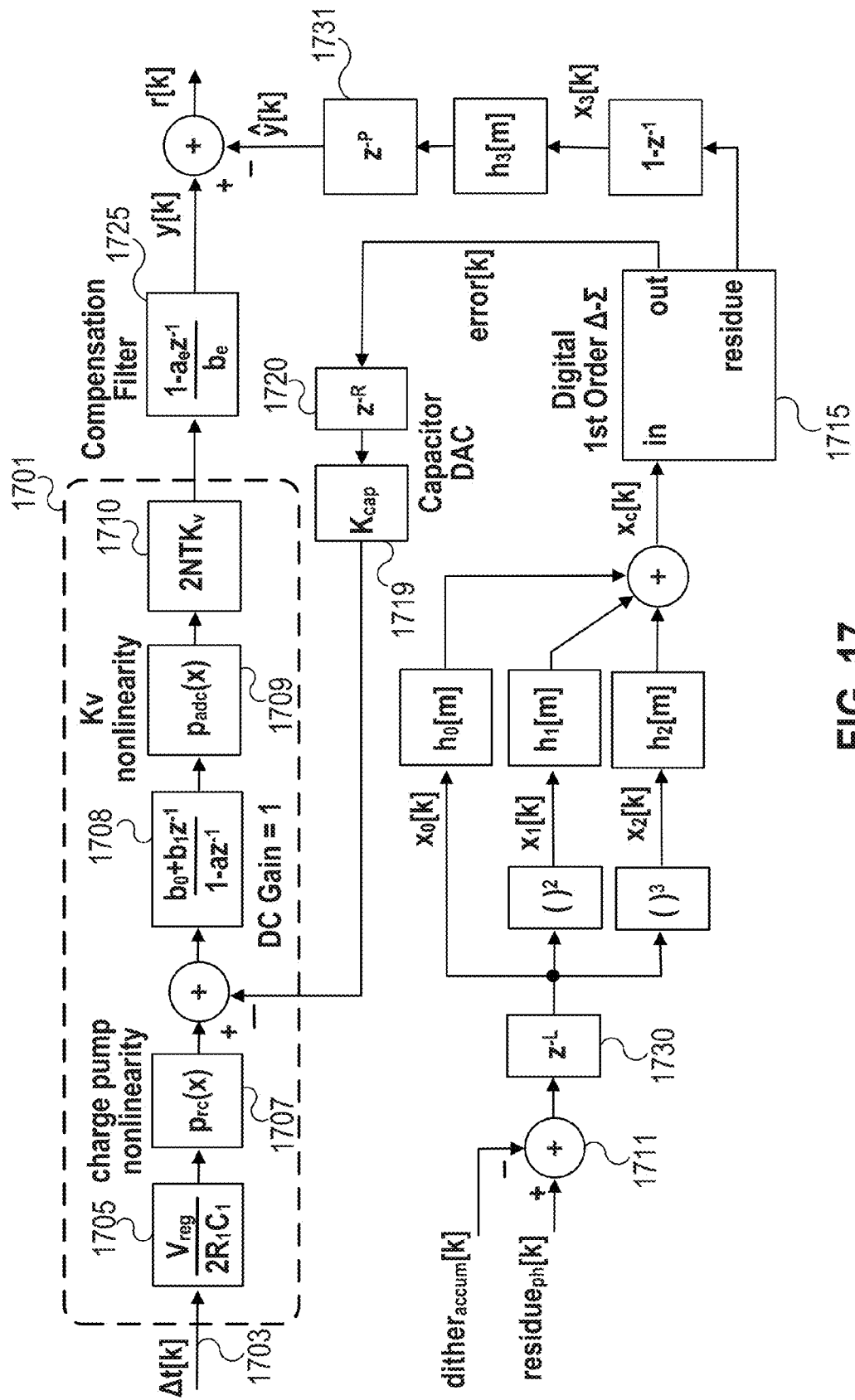
FIG. 17 illustrates an embodiment to achieve nonlinear quantization noise cancellation that includes a combination of pre-ADC and post ADC cancellation.

FIG. 17 shows a block diagram model of an approach to achieve nonlinear quantization noise cancellation according to a preferred embodiment. FIG. 17 illustrates a representation of the TDC 1701. The TDC 1701 receives the signal Δt[k] 1703, which represents the phase (or time) error signal which is composed of perturbations to the PLL, noise from the VCO and other PLL blocks, and quantization noise from the Δ-Σ modulator. Block 1705 represents the DC gain associated with the resistor based charge pump. The non-linearity of the resistor based charge pump charging characteristic and the VCO-based ADC are represented by polynomials $p_{rc}(x)$ and $p_{adc}(x)$ in blocks 1707 and 1709, respectively. The filter block 1708 represents a model of the filter resulting from the capacitor sampling operation on the phase error signal. In particular, the switched capacitor network formed by capacitors $C_1$ and $C_2$ used to sample the phase error signal (see FIG. 3) corresponds to a discrete-time low pass filter. In addition, the sampling operation results in some sampling error caused by leakage of the previous sample into the current sample as represented by a nonzero $b_1$ coefficient in the filter block model. Finally, the TDC 1701 includes the ADC gain 1710, where N is the number of stages in the VCO-based ADC, T is the reference frequency period, and $K_v$ is the gain of frequency/volt in the VCO-based ADC.

The accumulated dither sequence, $dither_{accum}[k]$, is subtracted from the Δ-Σ quantization noise sequence $residue_{ph}[k]$ in summing circuit 1711. The resulting sequence is multiplied by a polynomial (shown as third order in the illustrated embodiment, but could be of higher or lower order) with coefficients $h_j[m]$, which are updated according to a frame based approach discussed below, to form sequence $x_c[k]$. As shown in FIG. 17, $x_0[k]$ represents the linear term, $x_1[k]$ the square term, and $x_2[k]$ the cube term of the polynomial. Sequence $x_c[k]$ is then passed into a digital Δ-Σ modulator 1715 (preferably first order) to form the error[k] sequence which is sent into the capacitor DAC represented by a gain block 1719 and a delay block 1720.

One reason for utilizing the delta sigma modulator 1715 is to achieve a reasonable number, e.g., 4-6 bits for the capacitor DAC to make the capacitor DAC implementation practical. However, use of the delta sigma modulator 1715 results in residual quantization noise error which needs to be corrected. Assuming adequate matching of the capacitor DAC elements, the residual error of the capacitor DAC cancellation can be estimated from the residue of the delta sigma modulator 1715 using a first order difference (whose output is $x_3[k]$ in FIG. 17), an appropriate scaling factor (shown as $h_3[m]$ in FIG. 17), and appropriate delay 1731 to create a cancellation signal labeled as ŷ[k] in FIG. 17. The cancellation signal ŷ[k] is then subtracted in the digital domain from the output of the ADC after it has passed through the digital compensation filter to form the residual error signal, r[k], as shown in the figure, which is supplied to the loop filter to control the DCO. In an embodiment (see FIG. 3) the signal r[k] is supplied to the loop filter after spur cancellation. Note that it is assumed that dynamic element matching (DEM) techniques should generally be applied to the capacitor DAC so that mismatch in its elements becomes noise shaped such that the influence of such mismatch on PLL phase noise is minimized. Note that FIG. 17 identifies the TDC as block 1701. While the compensation filter and the summer generating r[k] are shown to be outside the TDC 1701 for ease of illustration, more general embodiments of the TDC can include any circuits and processing utilized in generating r[k] from Δt[k] 1703.

Compensation filter 1725 provides compensation for the affects of filter block 1708 in order to achieve improved convergence properties for estimation of coefficients $h_j[m]$. Additional details on how the coefficients $a_e$ and $b_e$ of the compensation filter may be tuned are provided herein.

Note that FIG. 17 shows that delays 1720, 1730, 1731 are provided in the various cancellation pathways to properly align the cancellation signals in time. Note that these delays, which have implementation specific values, should be positive (or zero, in which case no delay is used) in order to be realizable. Avoiding the need for negative delays can be achieved by delaying the output of the delta sigma modulator 310 (FIG. 3) to the divider and tapping out values from the delta sigma modulator early. Also, it is important to form the sequences $x_i[k]$ and r[k] such that they have zero mean. In the case where the PLL loop filter contains an accumulator (i.e., to realize a type II PLL), the sequence r[k] will conveniently have zero mean during steady-state operation. In the case of the sequences $x_i[k]$, commonly understood signal processing operations should be applied to ensure that each have zero mean.

Figure 18:
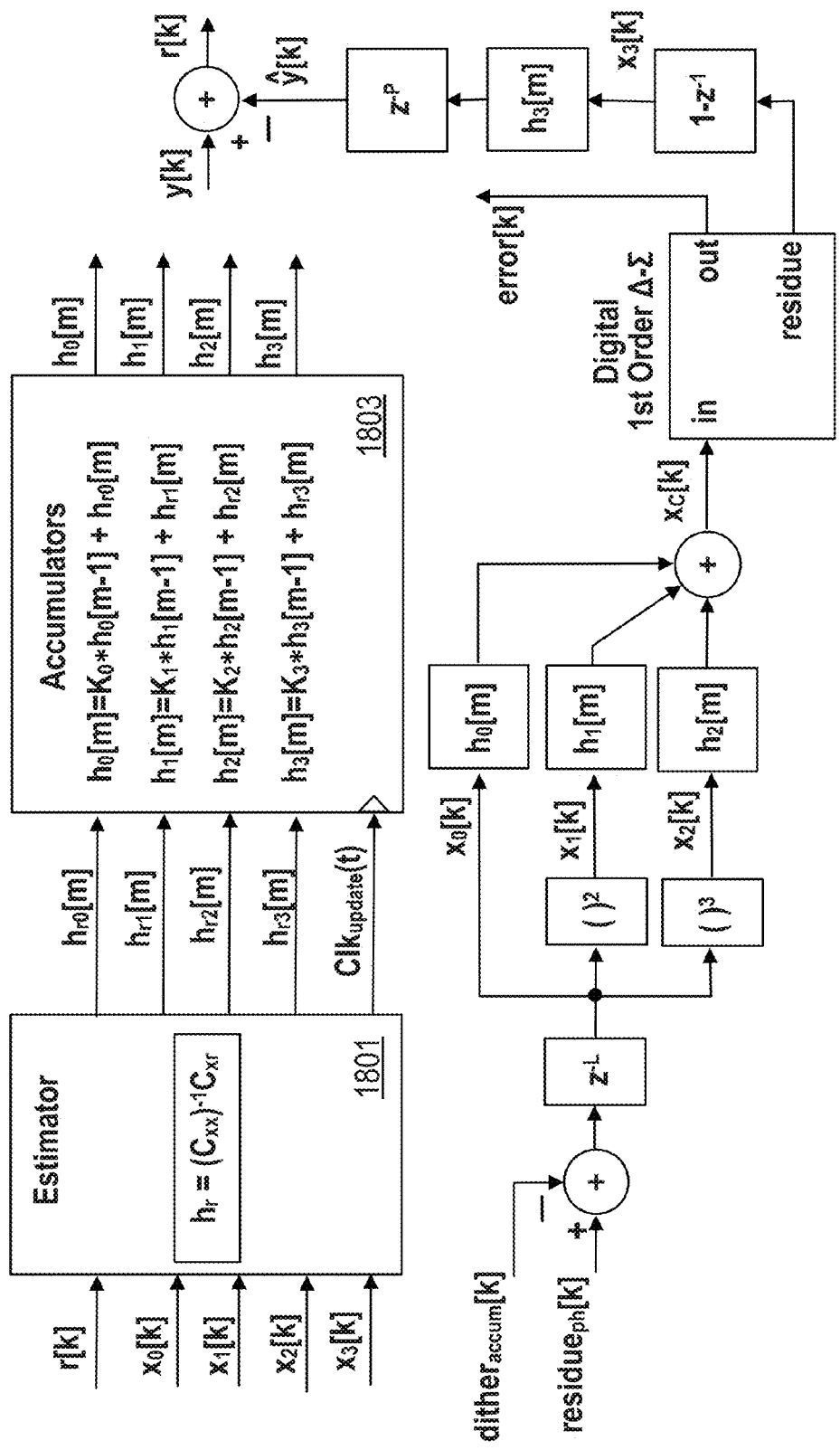
FIG. 18 illustrates an estimation algorithm for computing the coefficient values.

The quantization noise cancellation approach shown in FIG. 17 requires proper setting of the scale factors $h_j[m]$ in order to provide an effective level of cancellation of the Δ-Σ quantization noise. FIG. 18 shows a preferred embodiment to achieve estimation of the values of the scale factors, which is to first calculate correlation estimates $h_{rj}[m]$ based on matrix $C_{xx}$ and vector $C_{xr}$ in estimator 1801, which are formed using sequences $x_j[k]$ and r[k], and then send the $h_{rj}[m]$ values into a set of accumulators 1803. Assuming proper design, the outputs of the accumulators will converge to the desired coefficient values $h_j[m]$ that are used in the cancellation block diagrams shown in FIGS. 17 and 18. To better understand the estimation algorithm, note that proper choice of the coefficient values $h_j[m]$ leads to zero correlation between sequences $x_j[k]$ and r[k] such that the $h_{rj}[m]$ coefficients become zero. In such case, the accumulators hold their value such that the $h_j[m]$ coefficients remain at the correct value for achieving a high level of Δ-Σ noise cancellation. However, in the case of non-zero correlation between sequences $x_j[k]$ and r[k] (due to temperature induced variation or initial startup), the accumulators update the values of $h_j[m]$ until the values of $h_{rj}[m]$ return to zero such that a high level of Δ-Σ noise cancellation is achieved. Note that the estimation procedure could be achieved without the use of the accumulators in 1803, but the use of the accumulators reduces the dynamic range required of the signals in block 1801 since the $h_{rj}[m]$ sequences converge to zero in steady-state, which helps in achieving an efficient hardware implementation of estimator 1801.

Figures 19, 20:
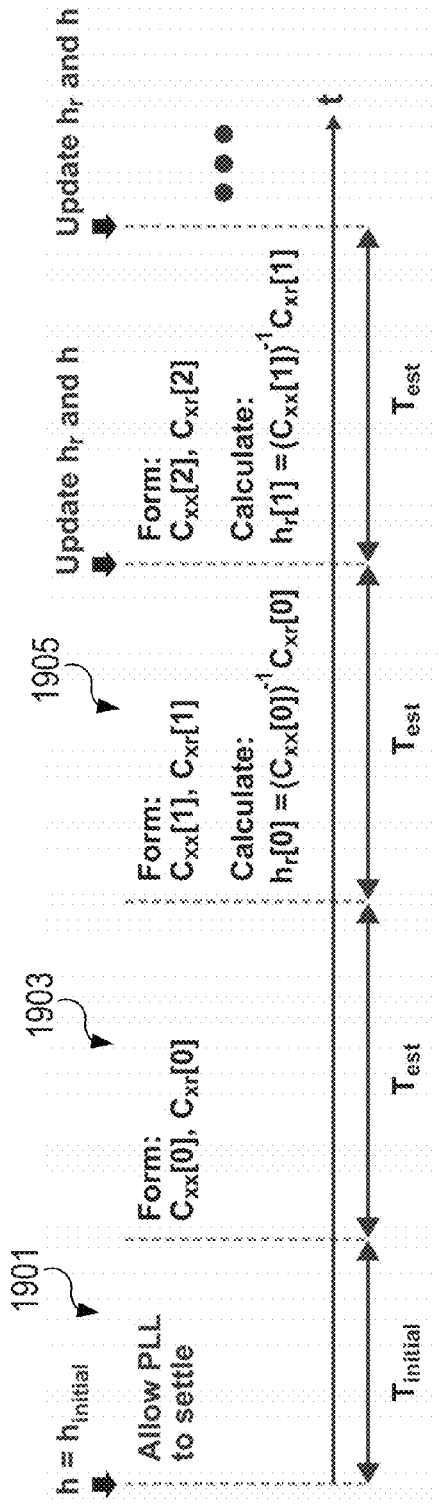
FIG. 19 illustrates a frame based approach for updating the estimated coefficient values.
FIG. 20 illustrates an embodiment utilizing adaptive frame times for updating coefficient values.

FIG. 19 shows a frame based approach for updating the estimated coefficient values $h_j[m]$. After an initial time period 1901 to allow the PLL to settle, the matrix $C_{xx}$ and vector $C_{xr}$ are formed over a timespan of $T_{est}$ 1903. At the end of the $T_{est}$ timespan, calculation of $h_r$ occurs while forming the matrix $C_{xx}$ and $C_{xr}$ for the new $T_{est}$ timespan 1905. While direct calculation of $h_r$ involves forming the inverse of matrix $C_{xx}$ as shown in the figure, an alternative approach to achieve this calculation is to apply an iterative method such as the Jacobi or Gauss-Seidel method. Upon the completion of each $T_{est}$ timespan, the updated value of $h_r$ is sent into the accumulator such that the h coefficients are also updated. Note that the update rate of the $h_r$ coefficients need not be the same as the update rate of the h coefficients. For instance, by using a shorter frame period for the $h_r$ coefficient estimation, less digital logic area may be possible due to the reduced dynamic range requirements for the estimation logic. In such case, a longer frame period for updating the h coefficients can be achieved by sampling the output of the accumulators 1803 (FIG. 18) at a lower rate than the accumulator update rate set by $h_r$. In such case, the scale factors $K_i$ within the accumulators 1803 (FIG. 18) may need to be appropriately adjusted to achieve the desired convergence time and noise properties of the h coefficient calculations as further discussed below.

The value of $T_{est}$ and accumulator scale factors $K_i$ are chosen as a tradeoff between achieving fast convergence of the h coefficient values and minimizing the variation of the h values due to noise. Referring to FIG. 20, to improve this tradeoff, in some embodiments it is useful to adapt the value of $T_{est}$ such that short time frames $T_{estshort}$ 2001 are initially used to achieve fast convergence, and then long time frames $T_{estlong}$ 2003 are used in order to reduce the impact of noise on the coefficient values as shown in FIG. 20. Note that FIG. 20 focuses on the case where one update of $h_r$ values occurs per time frame, but some embodiments may utilize multiple $h_r$ updates per time frame as discussed above in order to reduce digital logic area. In general, the adaptive time frame approach is useful in achieving fast convergence during startup (and better accommodation of the impact of the PLL feedback transients at such time) as it allows a relatively fast update rate adjustment of the h coefficient values in the beginning of the estimation procedure followed by a reduction of the impact of noise on the h coefficient values by using longer estimation frames (which leads to a slower update rate of the h coefficient values). In other embodiments, the value of $T_{est}$ remains constant during startup and steady state operation.

FIG. 21 shows further details on forming the $C_{xx}$ matrix and $C_{xr}$ vector during each estimation time frame under the simplifying assumption that the $h_r$ values are updated once per estimation frame. Each entry of this matrix and vector are formed through multiply and accumulate operations. Since these operations can easily be performed in parallel, one can use synthesized digital logic with several parallel blocks that implement these operations if the speed of the logic operations is of concern. If the speed of the logic operations is not of concern, these computations can alternatively be performed serially using, e.g., synthesized digital logic, a processor, or a microcontroller (MCU).

Figure 22:
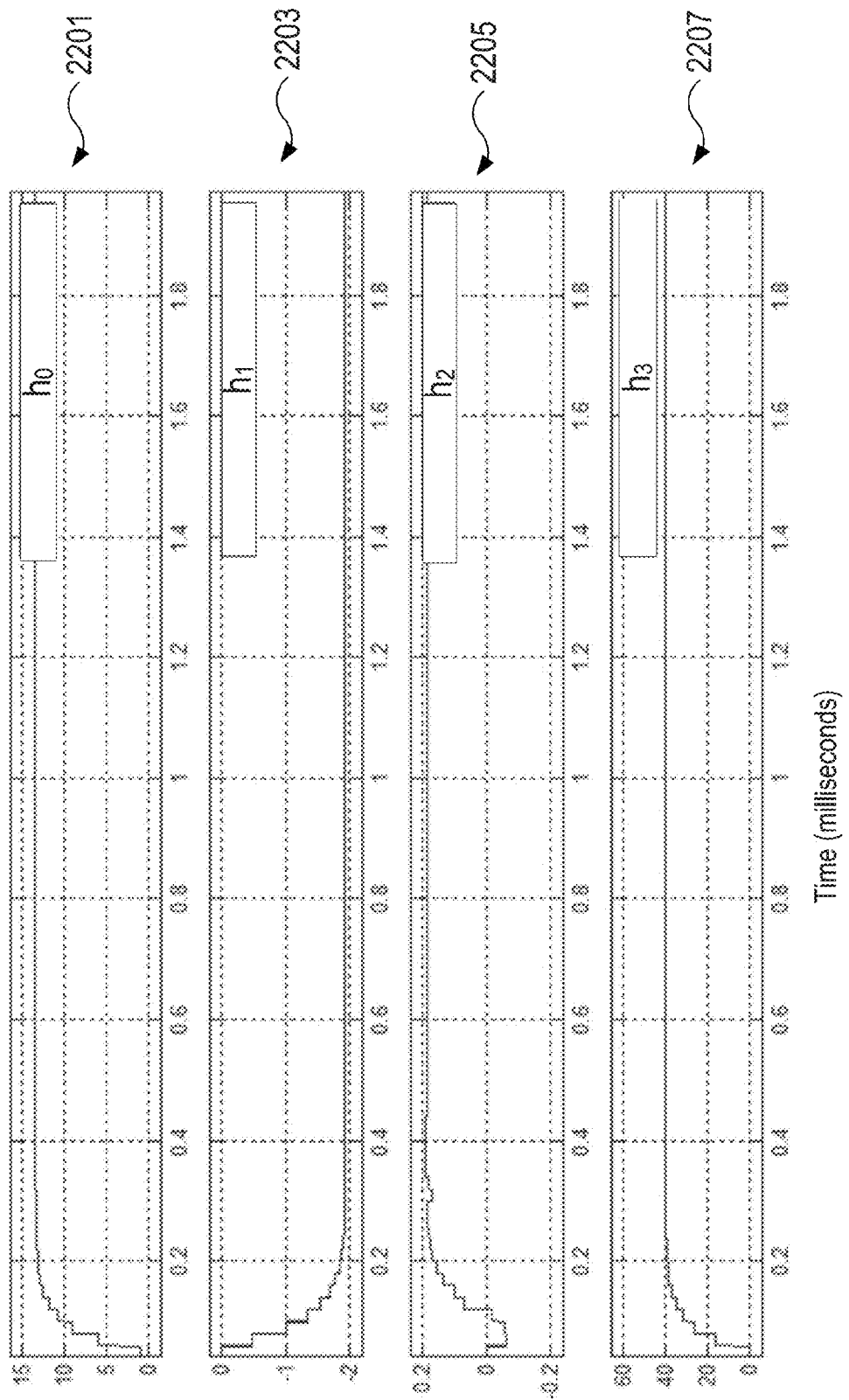
FIG. 22 illustrates settling characteristic of coefficient values using the estimation framework.

Behavioral simulation results of applying the above estimation framework to a fractional-N PLL with a second order Δ-Σ modulator are shown in FIG. 22. Here the time-domain waveforms 2201, 2203, 2205, and 2207 of the coefficient values $h_j[m]$, respectively $h_0[m]m\ h_1[m]$, $h_2[m]$, and $h_3[m]$ are shown as the outputs of their respective accumulators 1803 (see FIG. 18). In this case, the initial value of $T_{est}$ was chosen to be 20 μs for the first 20 updates, and the steady-state value of $T_{est}$ was chosen to be 500 μs for the remainder of the simulation. FIG. 22 shows the coefficients are able to converge in less than 500 μs using the adaptive time frame approach.

Figure 23:
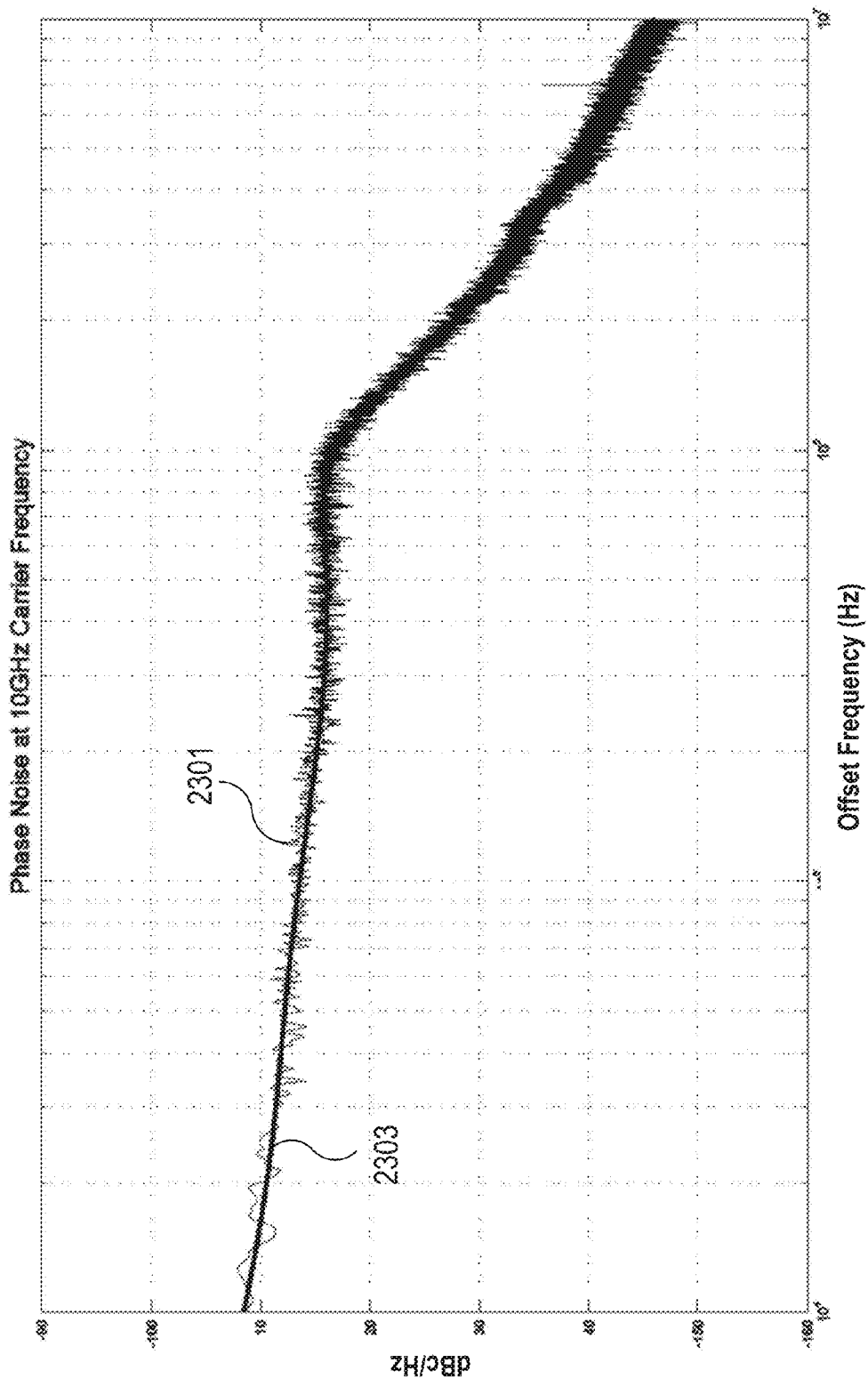
FIG. 23 illustrates simulated PLL phase noise corresponding to when h coefficient values have settled.

The resulting phase noise of the PLL from the same simulation is shown in FIG. 23 and compared to a theoretical phase noise model in which Δ-Σ quantization noise has been completely cancelled. FIG. 23 shows very good agreement between the simulation results 2301 and model 2303, indicating that the Δ-Σ quantization noise is successfully cancelled. Note that the slight hump in phase noise in the 3 to 4 MHz offset frequency range is due to mismatch between the elements of the capacitor DACs and can be eliminated by using a better algorithm for dynamic element matching of the capacitor elements.

One should note that the calculated h coefficients such $h_0[m]$ and $h_3[m]$ shown in FIG. 17 are also useful for calibration of the open loop gain of the PLL in order to achieve better control over its dynamics and robustness to stability. To explain, as is commonly encountered with analog circuits, the gain of the TDC may vary across process, temperature, and supply voltage conditions. The impact of such gain variations is to change the overall open loop gain of the PLL, which leads to changes in its bandwidth and stability margin. For the example embodiment shown in FIG. 17, the value of $h_0[m]$ will be a function of the TVC gain, $V_{reg}/(2R_1C_1)$, as well as the capacitor DAC gain $K_{cap}$. Assuming $K_{cap}$ is fairly well controlled, we can use the estimated value of $h_0[m]$ to infer the value of the TVC gain. Similarly, the estimated value of $h_3[m]$ can be used to help infer the value of the ADC gain, $2NTK_v$. Given knowledge of these gain values, one can adjust the gain of the PLL loop filter such that the overall open loop gain of the PLL experiences less variation.

Tuning of Compensation Filter

The estimation procedure described above relies on having a compensation filter that essentially undoes the memory effect of the capacitor filter formed by $C_1$ and $C_2$ shown in FIG. 3, which is also impacted by leakage currents from the switches and by gate leakage at the input of the VCO-based ADC. Fortunately, the combination of pre-ADC and post-ADC cancellation shown in FIG. 17 is fairly robust in the presence of variations in the compensation filter. However, it can be useful to perform tuning (i.e., calibration) of the compensation filter to achieve improved matching of the compensation filter coefficient values to their optimal values.

Figure 24:
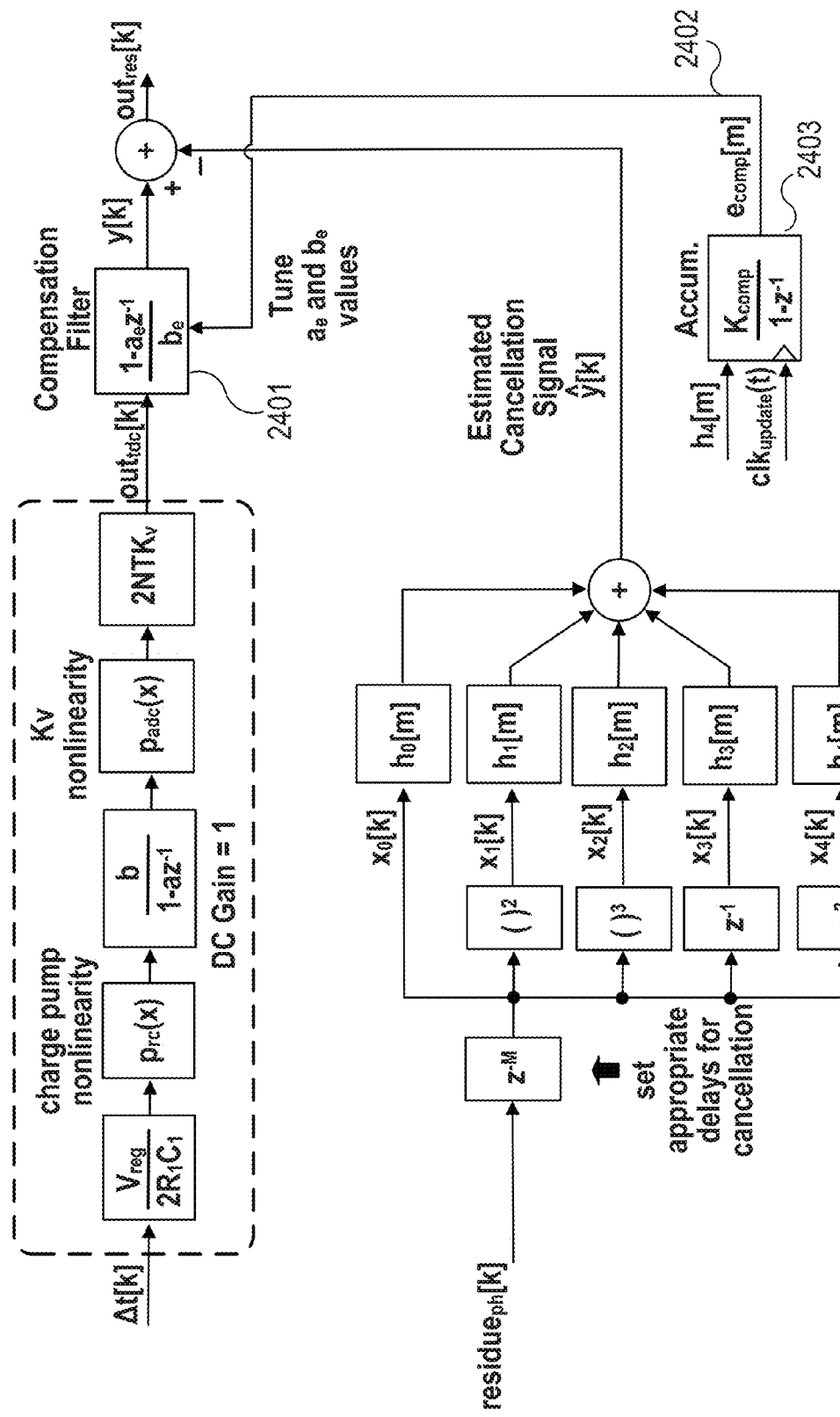
FIG. 24 illustrates an alternative embodiment performing cancellation of the Δ-Σ quantization noise using only post ADC cancellation.

FIG. 24 shows an alternative approach to performing cancellation of the Δ-Σ quantization noise, which is to use post ADC cancellation (also referred to as post TDC cancellation) only. In this case, the capacitor DAC may be set to a constant value such as its mid-range value such that it has no effect on the phase (or time) error signal. In other embodiments the capacitor DAC may be omitted entirely. The benefit of performing post ADC cancellation only is that a relatively large error signal passes through the capacitor filter, represented by transfer function $b/(1-az^{-1})$ in FIG. 24, which allows detection of its transfer function "a" and 'b' coefficient values as described below. Note that for simplicity we are ignoring the presence of leakage of the previous sample into the current sample as represented by the $b_1$ coefficient in the filter block within the detailed model 1708 shown in FIG. 17. However, using only post ADC cancellation leads to increased sensitivity to the $K_v$ nonlinearity of the VCO-based ADC (i.e., polynomial $p_{adc}(x)$ in FIG. 24), which can lead to difficulties in achieving sufficient quantization noise cancellation when excellent phase noise performance is required (i.e., when the PLL output is on-line during steady-state operation). As such, one approach is to perform the post TDC only cancellation indicated in FIG. 24 in an off-line manner in order to initially tune (i.e., calibrate) the compensation filter, and then use the combined approach of pre ADC and post ADC cancellation during steady-state operation of the PLL. The off-line calibration of the compensation filter can be done at power up of the device or any other time that the PLL is not actively being relied upon to generate an output with excellent noise performance.

Ideally, the compensation filter 2401, which is represented with transfer function $(1-a_e z^{-1})/b_e$, has coefficient values of $a_e=a$ and $b_e=b$ such that it is the inverse of the capacitor filter. In practice, however, there will be error on these coefficients as represented by $a_e=a+\epsilon_a$ and $b_e=b+\epsilon_b$. The impact of this error is to create a net filter response from the cascade of the capacitor and compensation filters such that:

$$\frac{b}{1-az^{-1}} \frac{1-a_e z^{-1}}{b_e} = \frac{b}{b+\epsilon_b}\left(1-\frac{\epsilon_a z^{-1}}{1-az^{-1}}\right)$$

The resulting transfer function shown above indicates that error in the $b_e$ coefficient, $\epsilon_b$, leads to a DC gain error and error in the $a_e$ coefficient, $\epsilon_a$, leads to an impact of the current sample error on future "post samples".

As indicated in FIG. 24, one can take advantage of the "post sample" correlation that occurs from mismatch of the capacitor and compensation filters by tuning the compensation filter until this "post sample" correlation goes to zero. As shown in FIG. 24, this is accomplished by feeding an estimate of the second post sample correlation, represented as coefficient $h_4[m]$ in the figure, into an accumulator whose output tunes the compensation filter. Assuming stable feedback dynamics, the accumulator will adjust its output until the $h_4[m]$ coefficient goes to zero, therefore implying $a_e=a$ since the $2^{nd}$ post sample correlation has become zero. As discussed in the next paragraph, the a and b coefficients formed by the switched capacitor filtering operation are related such that $b_e=b$ can also be achieved. Note that the first "post sample" correlation coefficient, identified as $h_3[m]$ in FIG. 24, is not used for the compensation filter tuning since it is also sensitive to other effects such as the presence of leakage of the previous sample into the current sample as represented by the $b_1$ coefficient in the filter block within the detailed model 1708 shown in FIG. 17.

In another embodiment, rather than performing nonlinear quantization noise cancellation in the digital domain, the TDC function from $\Delta t[k]$ to $y[k]$ in FIG. 24 is linearized by including an inverse function of the TDC nonlinearity. The digital processing block performing the inverse function of the TDC nonlinearity may be placed before or after the compensation filter depending on whether the nonlinearity is dominated by the Kv nonlinearity or the charge pump nonlinearity, respectively. In such an embodiment the residue signal $residue_{ph}[k]$ is scaled in a scaling block to generate $\hat{y}[k]$, rather than being multiplied by a polynomial. The scaled signal $\hat{y}[k]$ is then combined (subtracted) from $y[k]$ after linearization of the TDC has occurred in order to cancel the quantization error. Note that some embodiments could also combine linearization of the TDC with nonlinear quantization noise cancellation in order to further improve performance at the expense of increased hardware complexity. Also, some embodiments may avoid using the compensation filter in cases where the TDC nonlinearity is weak and/or performance requirements are modest.

Figure 25:
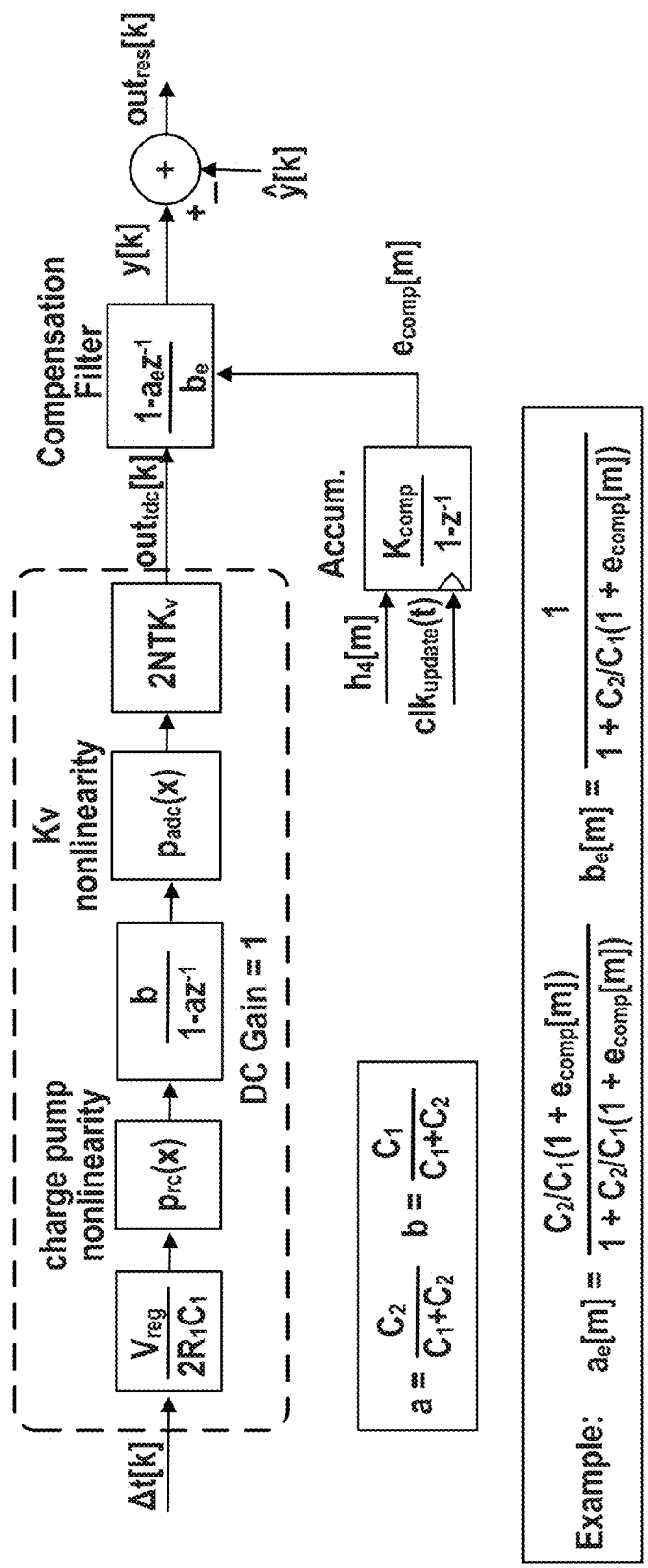
FIG. 25 shows an example of tuning the digital compensation filter.

FIG. 25 provides more details on tuning of the compensation filter by providing an example of how the $a_e$ and $b_e$ coefficients can be adjusted according to the output of the accumulator, $e_{comp}[m]$.

Fractional and Non-Fractional Spur Cancellation

Figure 26:
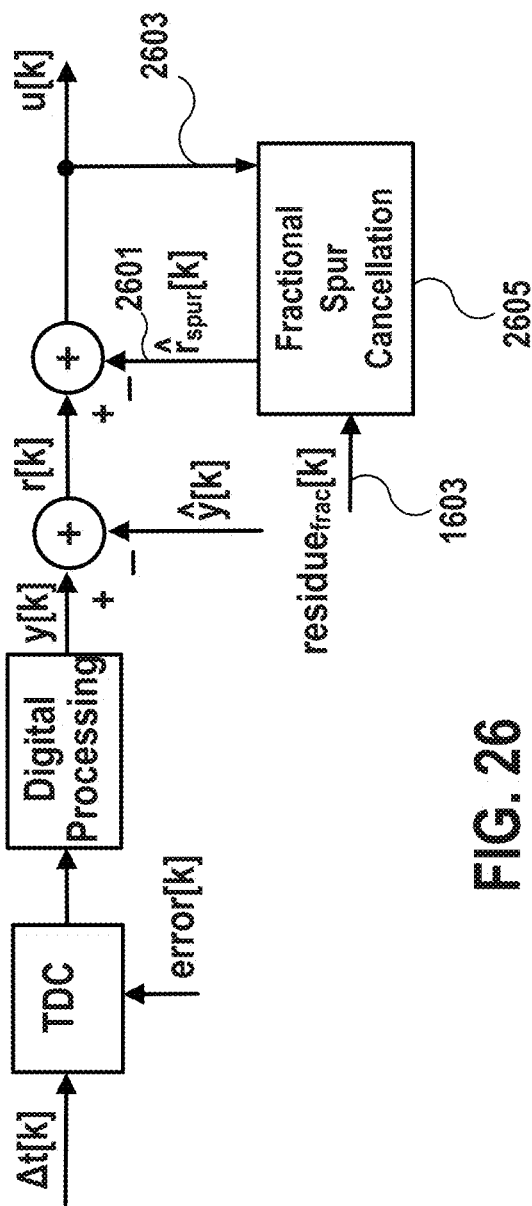
FIG. 26 illustrates a block diagram of fractional spur cancellation within a PLL according to an embodiment.

In addition to achieving cancellation of the Δ–Σ quantization noise, we can also perform fractional and non-fractional spur cancellation within the PLL structure shown in FIG. 3 due to the digital information provided by the TDC output. Fractional spur cancellation refers to cancellation of spurs that arise in fractional-N PLLs due to the selection of a fractional divide value as input into the Δ–Σ modulator 310 in FIG. 3. Beginning with fractional spur cancellation, FIG. 26 shows a block diagram view of performing spur cancellation by creating a cancellation signal, $\hat{r}_{spur}[k]$ 2601, based on the residual error signal $u[k]$ and the Δ–Σ residue sequence $residue_{frac}[k]$ 1603 (see FIG. 16). In one embodiment, the fractional spur cancellation block 2605 shown in FIG. 26 only cancels a spur at one frequency, and additional fractional spur cancellation blocks may be used to cancel spurs at additional frequencies as described further herein.

Figure 27A:
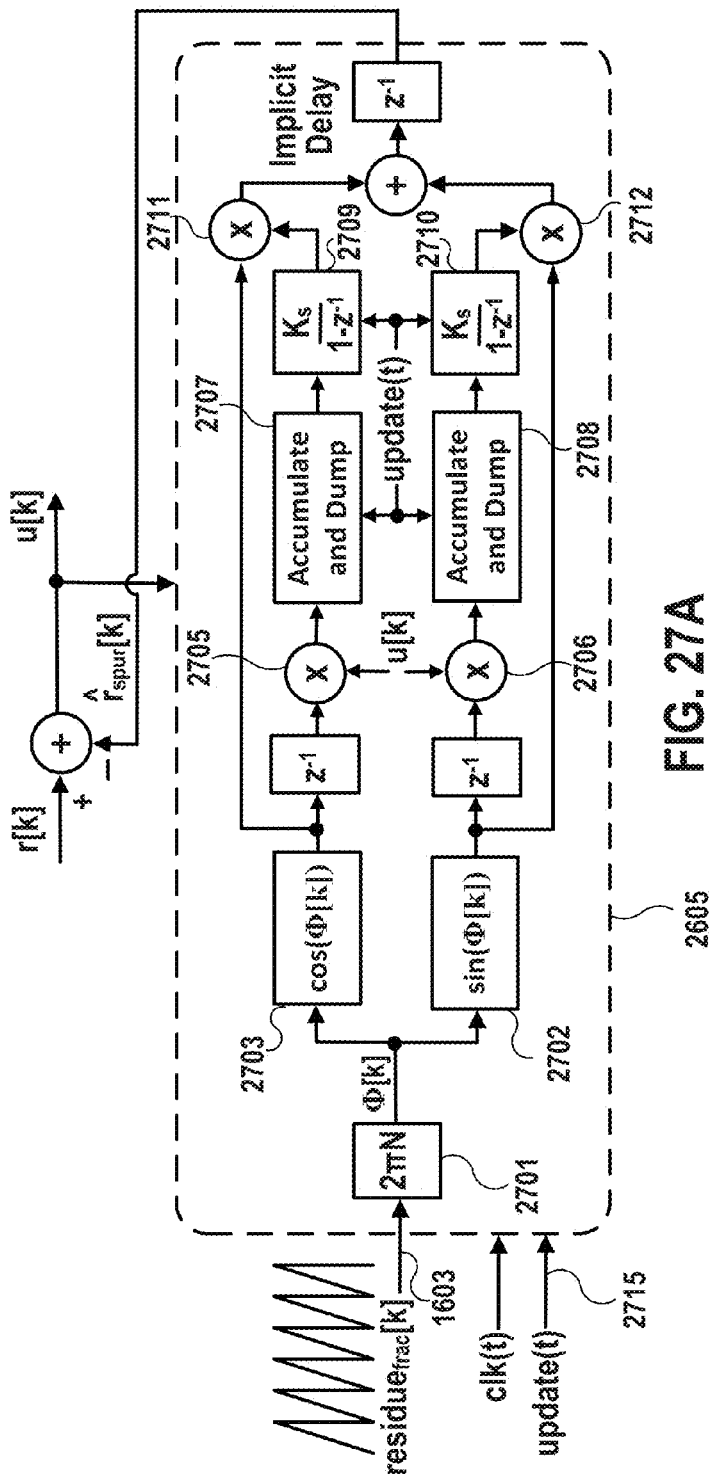
FIG. 27A illustrates further details of an embodiment to achieve fractional spur cancellation.

FIG. 27A provides further details of the operations utilized to achieve fractional spur cancellation. In this example, the Δ–Σ residue sequence, $residue_{frac}[k]$ 1603, which is assumed to take on values in the range of 0 to 1, is first scaled by the factor $2\pi N$ in 2701, where N corresponds to the harmonic of the fractional spur to be cancelled, to form sequence $\Phi[k]$. Typically N=1, which corresponds to the fundamental fractional spur frequency. As an example, if the divide value for the PLL is set to 200.013973 with a reference frequency of 50 MHz, then the fundamental fractional spur frequency (corresponding to N=1) is calculated as 0.013973*50 MHz=698.7 kHz. The sequence $\Phi[k]$ is then used to create sine and cosine sequences in blocks 2702 and 2703, which are correlated with sequence $u[k]$ using digital multipliers 2705 and 2706 and accumulate-and-dump circuits 2707 and 2708. These operations essentially correspond to doing a discrete-time Fourier transform on signal $u[k]$ at just the frequency of interest. The accumulate-and-dump circuits 2707 and 2708 operate over M spur cycles, with the final accumulator values over this time span being "dumped" and then fed into digital accumulators 2709 and 2710 whose outputs are supplied to multipliers 2711 and 2712 to set the scale factors of the cosine and sine components of the cancellation signal $\hat{r}_{spur}[k]$.

The value of M should be set as large as possible to reduce the impact of noise while still allowing the spur cancellation to achieve reasonably fast start up time and to track temperature changes. As with the estimation framework described earlier, the value of M can be made adaptive such that a small value of M is used initially and then a large value of M used during steady-state operation. The signal update (t) 2715 provides the timing information of when to "dump" the accumulate and dump signal in the illustrated embodiment. Counting of spur cycles can be accomplished by counting wrap events in the $residue_{frac}[k]$ sequence. A wrap event occurs when the $residue_{frac}[k]$ ramp signal undergoes a rapid change in its value (i.e., a value of 1 is subtracted from it) in order to avoid exceeding a value of 1. By utilizing the wrap information of $residue_{frac}[k]$, the accumulate and dump operation can be performed on fully completed spur cycles in order to achieve the best signal-to-noise ratio for the estimation of the scale factors used to form the cancellation signal. The goal for spur cancellation is for the residual error signal $u[k]$ to contain zero influence of the spur signal that is being cancelled. In such case, a zero correlation error is achieved such that outputs of the accumulate and dump circuits which supply the input to the accumulators 2709 and 2710 go to zero average value, which allows for a relatively small range to be required for the digital values of the correlation multipliers and accumulate and dump circuits, thereby allowing for an efficient hardware implementation.

As the input into the Δ-Σ modulator In[k] changes (see FIG. 16), the ramp of residue$_{frac}$[k] 1603 changes to track the primary fractional spur. Note that the ramp may not be monotonic due to the presence of dither or other issues related to the operation of the Δ-Σ modulator.

Figure 27B:
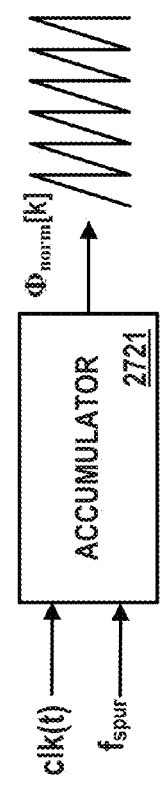
FIG. 27B illustrates an embodiment to achieve a residue signal for non-fractional spur cancellation.

Non-fractional spurs may also be of interest. For example, there may be a clock signal on the integrated circuit and a spur resulting from the presence of that clock signal. For that case or other non-fractional spur cancellations, the Φ[k] sequence should be formed based on the spur frequency of interest, $f_{spur}$, rather than from the Δ-Σ residue sequence residue$_{frac}$[k]. FIG. 27B illustrates one embodiment for creating a residue signal $\Phi_{norm}$[k] for non-fractional spur cancellation using an accumulator 2721 to realize the expression $\Phi_{norm}$[k]=$\Phi_{norm}$[k−1]+$f_{spur}$T, where T is the sample period of the accumulator and the accumulator wraps whenever it exceeds a predetermined value, e.g., 1. Other predetermined values other than 1 may also be utilized. Using the embodiment illustrated in FIG. 27B, a ramp sequence is created at the frequency of interest. $\Phi_{norm}$[k] is then supplied as the input to the scale block 2701 instead of the residue$_{frac}$[k] signal to generate Φ[k]=2πN$\Phi_{norm}$[k] (where N is nominally of value 1). Note that non-fractional spur cancellation can be applied either to a fractional-N or integer-N PLL structure. Also note that the clk(t) signal with a period T is supplied to accumulator block 2721 as the sample clock for the accumulator, and $f_{spur}$ should generally be set to less than 1/(2T) which corresponds to the bandwidth of the digital correlation processing. Multiple spur cancellation blocks may be utilized to cancel spurs at more than one frequency, with a mixture of fractional and non-fractional spur cancellation being applied as desired. Note that in some implementations, the ramp sequence from the accumulator may be monotonic from zero to its wrap value. In other embodiments, the ramp sequence may not be monotonic.

Figure 28A:
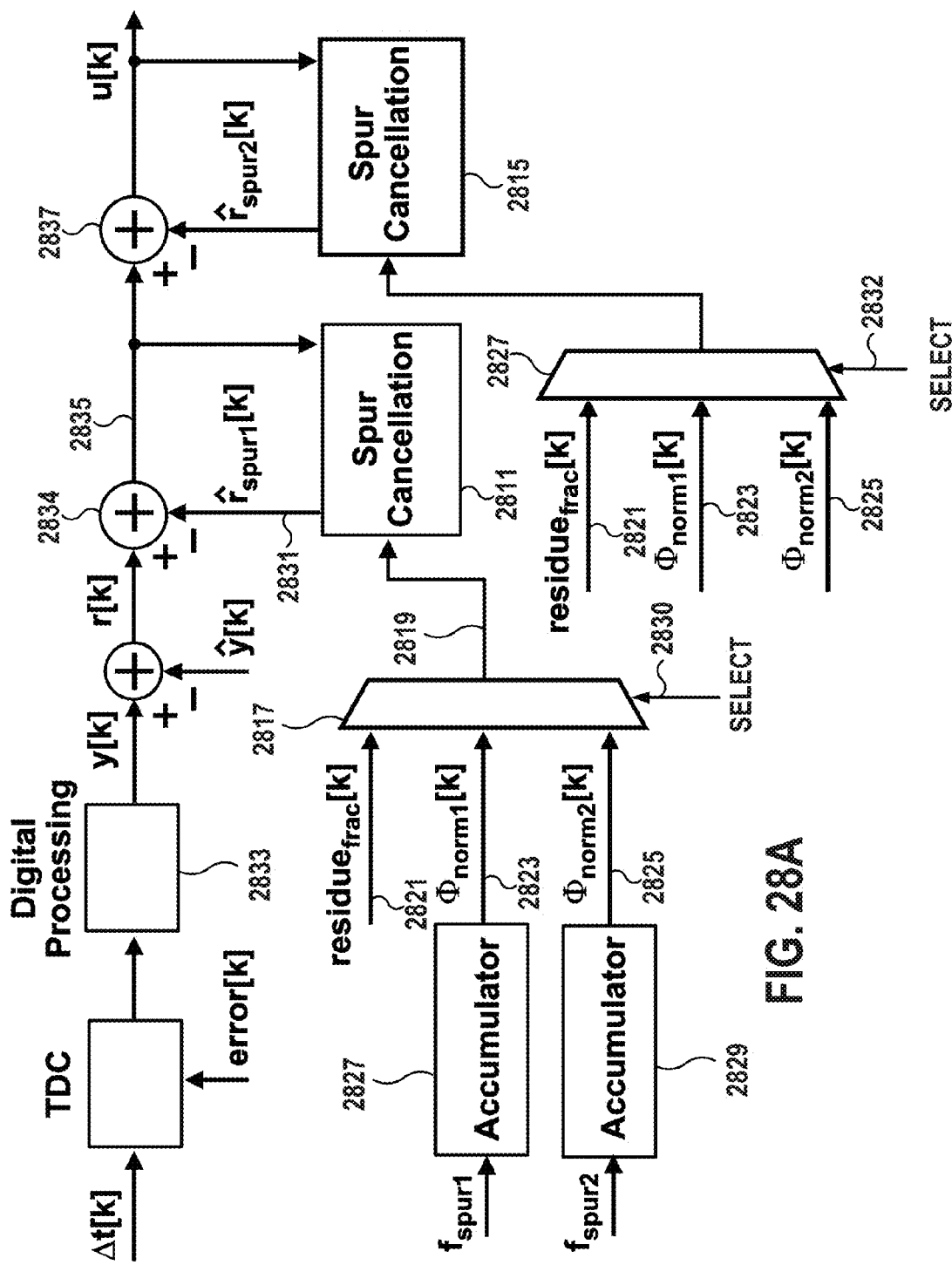
FIG. 28A illustrates an embodiment that cancels multiple spurious tones and where the tones to be canceled are selectable.

FIG. 28A illustrates an embodiment that cancels spurs at multiple frequencies by cascading spur cancellation block 2811 and 2815. The two spur cancellation blocks 2811 and 2815, which may be implemented as spur cancellation block 2605, cancel spurs at different frequencies. In addition to canceling multiple spurs, the embodiment illustrated in FIG. 28A allows the spurs to be canceled to be selectable. In the illustrated embodiment, a selector circuit 2817 supplies spur cancellation block 2811 with a selected residue signal 2819. Selector circuit 2817 selects between residue signals 2821, 2823, and 2825 based on select signal 2830. The residue signal 2821 may be supplied from the Δ-Σ modulator 1600 in FIG. 16. The other two residue signals 2823 and 2825 may be supplied from accumulators 2827 and 2829 that can provide residue signals to cancel spurs at non-fractional-N frequencies. Similarly, select signal 2832 selects one of the residue input signals, which selector circuit 2827 supplies to spur cancellation block 2815. Note that the embodiment shown in FIG. 28A allows multiple non fractional-N spurs to be canceled or one fractional-N based spur and a non fractional-N based spur where the residue signal is sourced from an accumulator. The embodiment also allows multiple fractional-N spurs to be canceled. For example, the selector circuits may both select residue$_{frac}$[k] signal 2821. One spur cancellation block may cancel the spur at the fundamental frequency by setting N=1 in scale block 2701 (see FIG. 27A) and the other spur cancel block may cancel a spur at a harmonic by setting N to an appropriate integer.

The spur cancellation block 2811 supplies a first spur cancellation signal, $\hat{r}_{spur1}$[k] 2831, which is combined with r[k], which is based on the phase error signal. The phase error signal r[k] is a digital phase error signal after various processing, e.g., by the TDC as described herein and digital processing block 2833. In some embodiments, digital signal processing block 2833 may implement a compensation filter as described herein. In addition, the phase error signal r[k] may include correction ŷ[k] as described herein. The particular processing performed to generate r[k] may vary according to the needs of a particular system. After the processing as needed for the particular system, the digital phase error representation r[k] has $\hat{r}_{spur1}$[k] 2831 subtracted in summer 2834 to generate a residual phase error signal 2835. That residual phase error is supplied to summer 2837 that subtracts $\hat{r}_{spur2}$[k] to generate the final residual phase error signal u[k]. Note that while two spur cancellation blocks are shown, other embodiments may have more than two cancellation blocks according to the number of spurs that need to be canceled. Further, while both spur cancellation blocks in FIG. 28A are shown to have selectable residue signals, in other embodiments, some or all of the spur cancellation blocks may have fixed (non-selectable) residue inputs. Note that the feedback signals supplied to the spur cancellation block 2811 and 2815 are from the summing circuits 2834 and 2837. Thus, the feedback signal 2835 to spur cancellation block 2811 has only one spur reduced, which has a spur frequency associated with the selected residue signal 2819. The feedback signal u[k] supplied to spur cancellation block 2815 has spurs at two frequencies reduced.

Figure 28B:
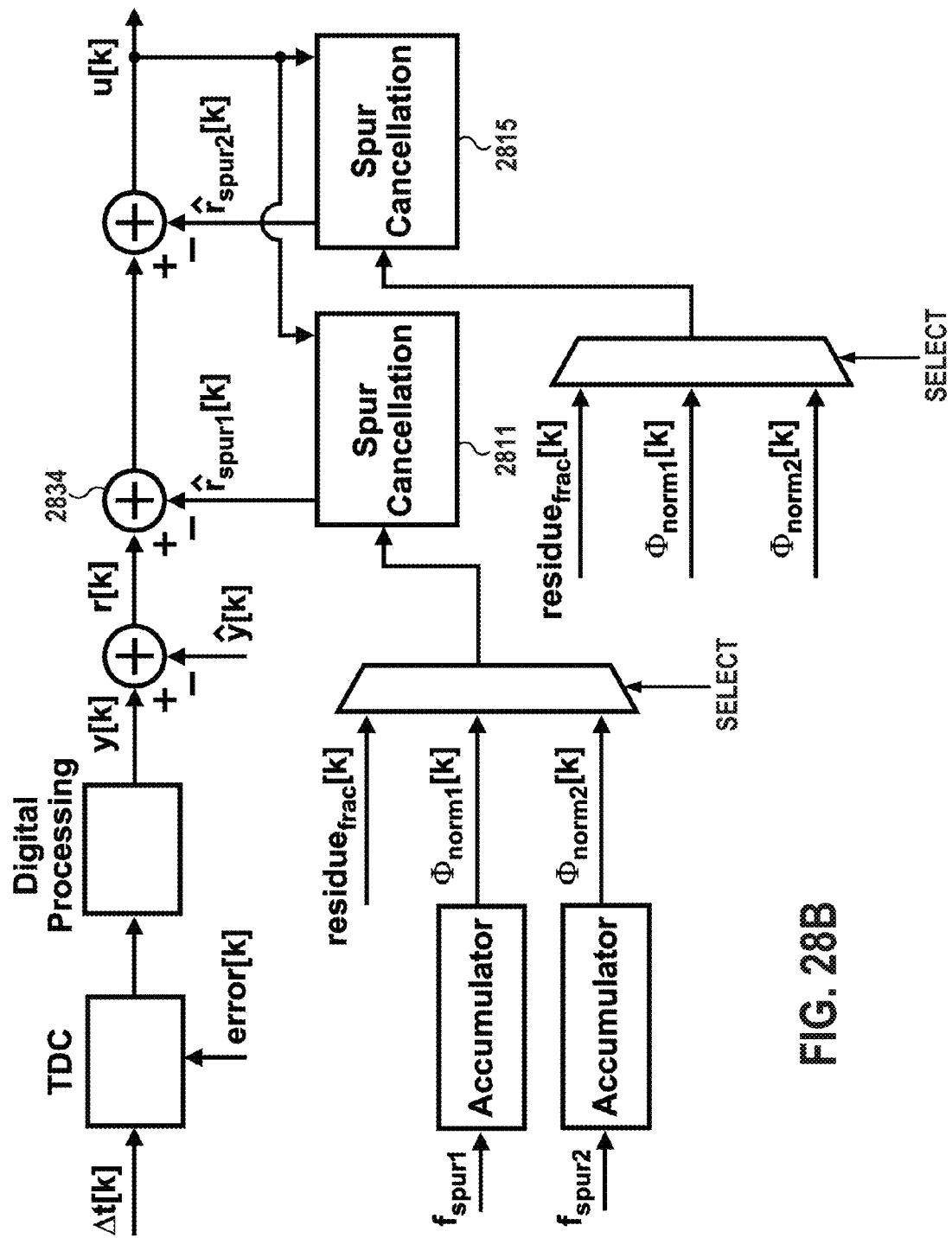
FIG. 28B illustrates another embodiment that cancels multiple spurious tones and where the tones to be canceled are selectable.

FIG. 28B shows another embodiment with multiple spur cancellation blocks 2811 and 2815. Block 2815 is configured the same as in FIG. 28A while spur cancellation block 2811 receives u[k] as the residual phase error signal used to correlate the sine and cosine sequences instead of the residual error signal generated by summer 2834. While FIGS. 28A and 28B illustrate embodiments for two spur cancellation blocks, other embodiments may include additional spur cancellation blocks to cancel spurs at additional frequencies.

Figure 29:
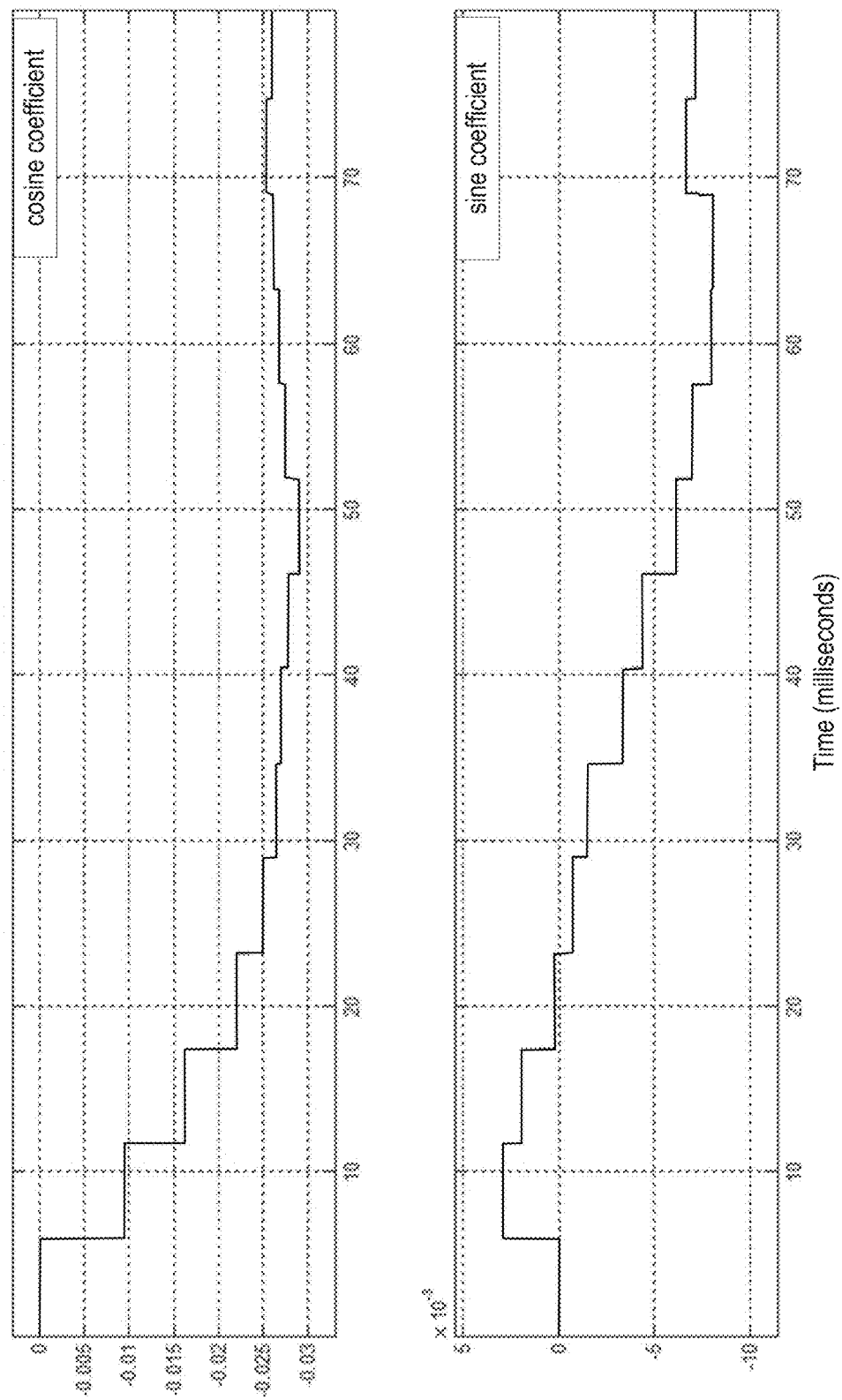
FIG. 29 shows the results of a behavioral simulation where fractional spur cancellation is performed.

FIG. 29 shows the results of a behavioral simulation where fractional spur cancellation is performed on a detailed fractional-N PLL model. In particular, FIG. 29 shows behavioral simulation results of estimated cosine and sine scale factors for the fractional spur cancellation shown in FIG. 27 within a fractional-N PLL. FIG. 29 shows the cosine scaling coefficient takes on a non-zero value while the sine coefficient roughly stays at zero. For the simulation shown in FIG. 29, M=4.000 spur cycles and the fractional spur frequency is set to be 698.7 kHz according to the choice of the PLL divide value and reference frequency as discussed above. In this case, each update of the spur cancellation scaling coefficients occurs every 1/698.7 kHz*4,000=5.725 ms.

Figure 30:
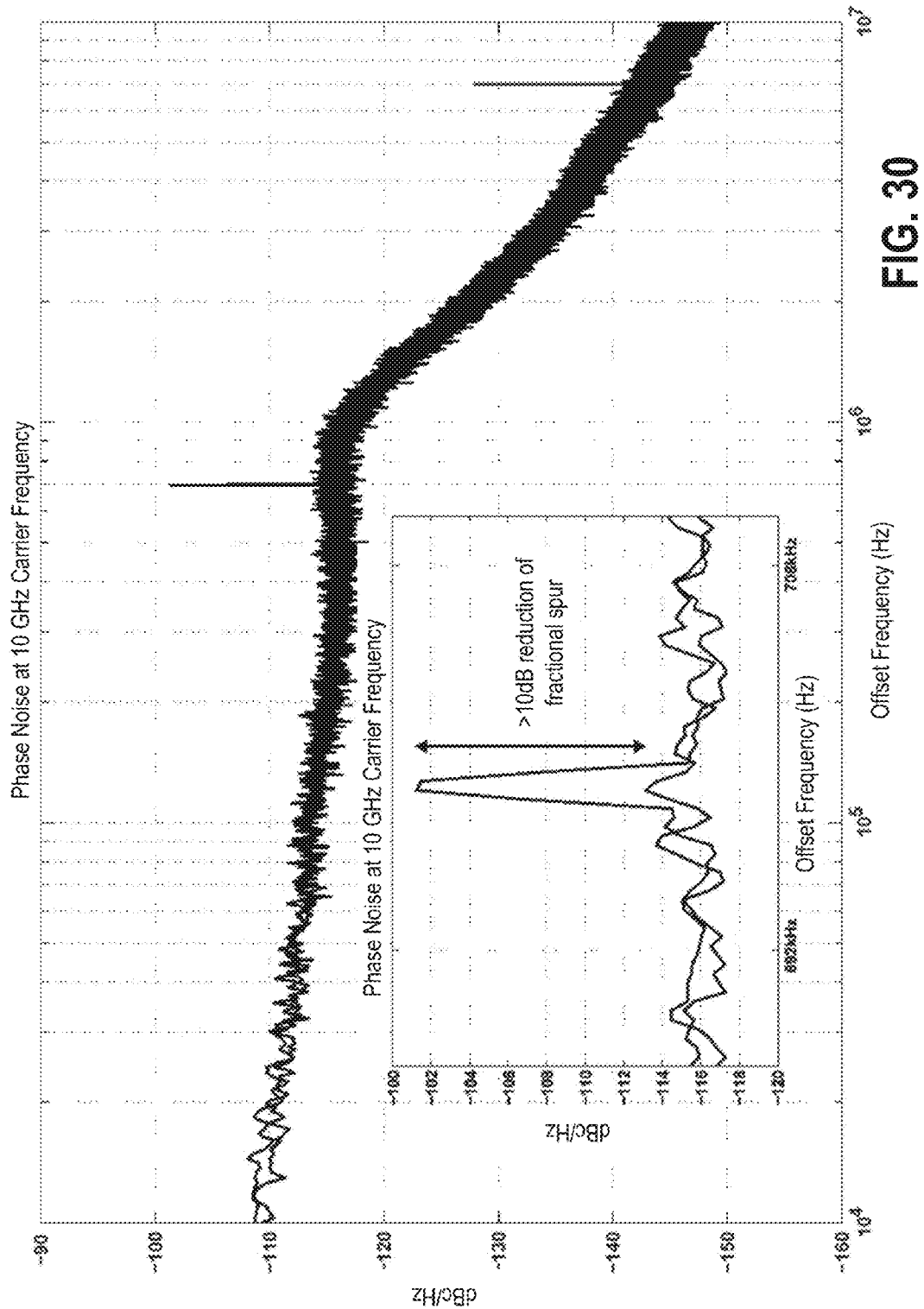
FIG. 30 shows the simulated PLL phase noise with and without fractional spur cancellation applied.

Finally, FIG. 30 shows the simulated PLL phase noise for a behavioral model of a fractional-N PLL in which fractional spur cancellation with N=1 is enabled and disabled (thus with and without fractional spur cancellation applied). In this case, the phase noise calculation was based on simulation results occurring after 40 ms in order to allow settling of the scaling coefficients as shown in FIG. 28. For this example, we see that over 10 dB of fractional spur cancellation is achieved.

Figure 31:
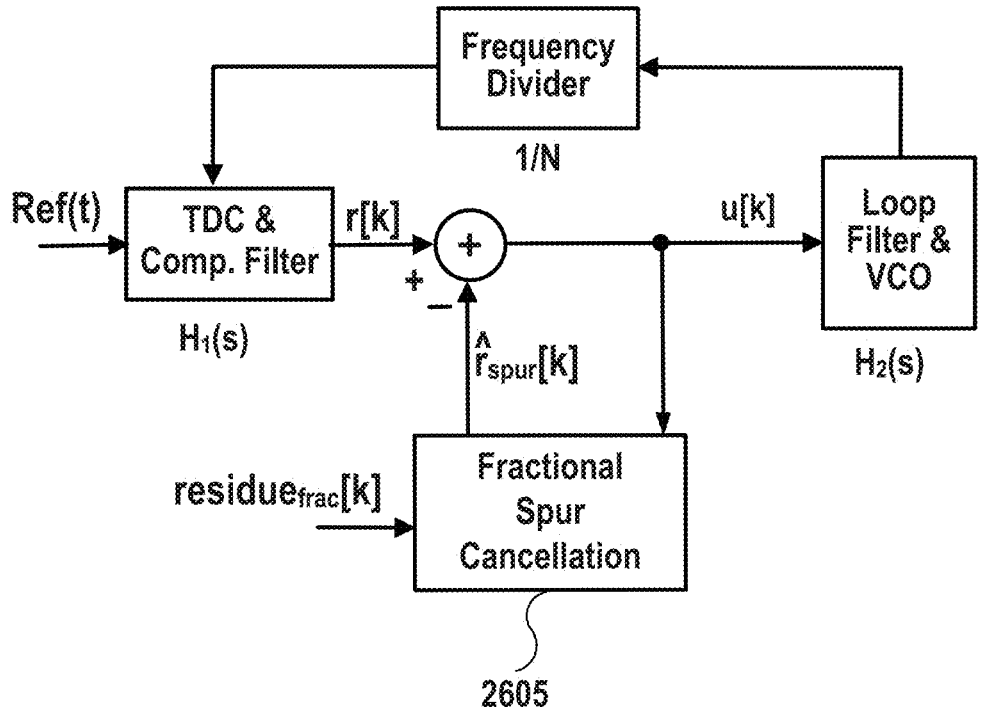
FIG. 31 illustrates a block diagram of an embodiment of a spur cancellation system.

PLL dynamics may impact spur cancellation under certain conditions. FIG. 31 illustrates a block diagram of a PLL system with spur cancellation. Calculating the transfer function from $\hat{r}_{spur}[k]$ to u[k], using Black's formula:

$$\frac{U(s)}{\hat{r}_{spur}(s)} = \frac{-1}{1 + H_2(s)H_2(s)/N} = -G_{hf}(s).$$

Figure 32:
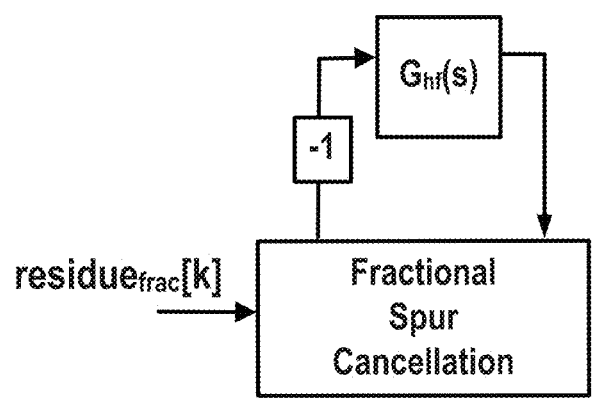
FIG. 32 illustrates a model showing the transfer function from $\hat{r}_{spur}[k]$ to u[k].
Figure 33:
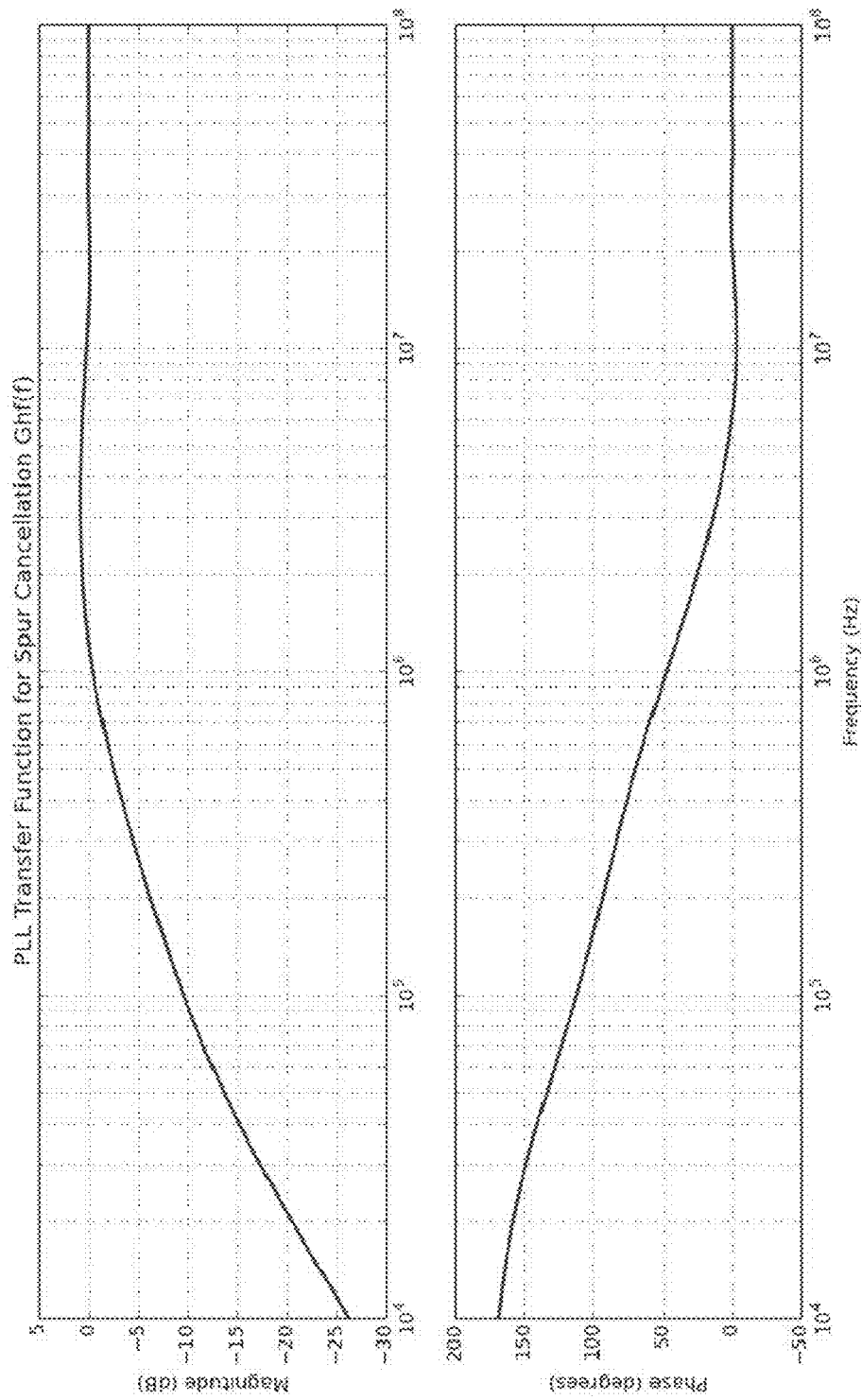
FIG. 33 illustrates example frequency response plots showing the PLL effectively high pass filters $\hat{r}_{spur}[k]$ in influencing u[k].

The PLL effectively highpass filters $\hat{r}_{spur}[k]$ in influencing u[k], as indicated by the example frequency response plots shown in FIG. 33. For a given PLL implementation, the phase shift occurring for a given ratio of spur frequency to PLL bandwidth can be determined through simulation or empirically determined through initial calibration or test procedures and then stored in a lookup table At frequencies greater than the PLL bandwidth, the PLL dynamics have a negligible impact on spur cancellation. However, at frequencies below the PLL bandwidth, there is a significant impact on spur cancellation. FIG. 32 illustrates the impact of transfer function $G_{hf}(s)$ on the influence of $\hat{r}_{spur}[k]$ on u[k]. In particular, the transfer function $G_{hf}(s)$ impacts the correlation operation occurring between $\hat{r}_{spur}[k]$ and the sine and cosine generators in the spur cancellation block 2605. Since $\hat{r}_{spur}[k]$ corresponds to a sinusoidal waveform, $G_{hf}(s)$ impacts the amplitude and phase of $\hat{r}_{spur}[k]$ in impacting u[k]. The phase impact is of significant concern as it can lead to instability. Note that while this discussion is focused on fractional spur cancellation, the same issues occur when performing non-fractional spur cancellation.

Figure 34A:
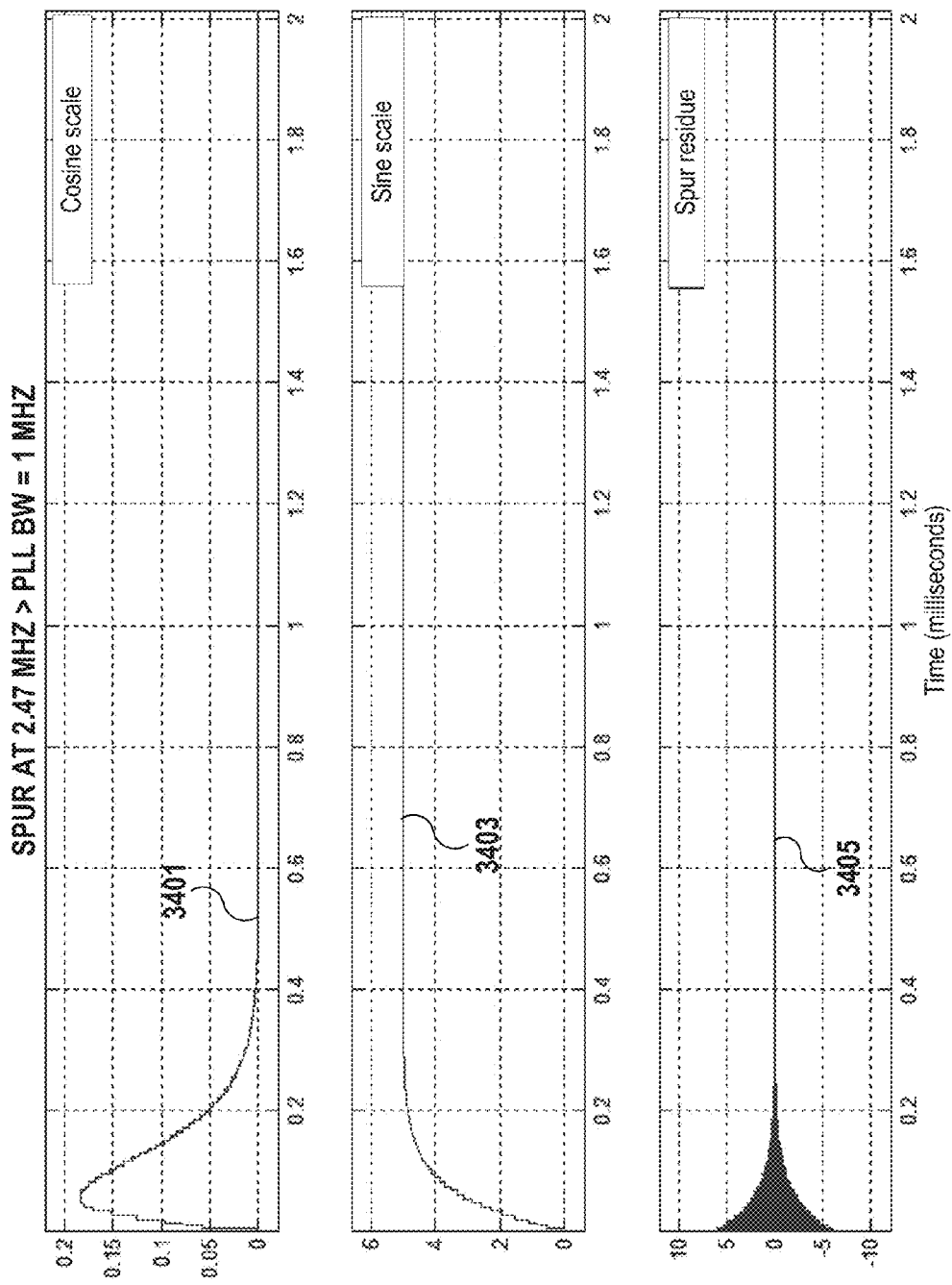
FIG. 34A illustrates a simulation example of a spur at 2.47 MHz for a PLL bandwidth equal to 1 MHz.
Figure 34B:
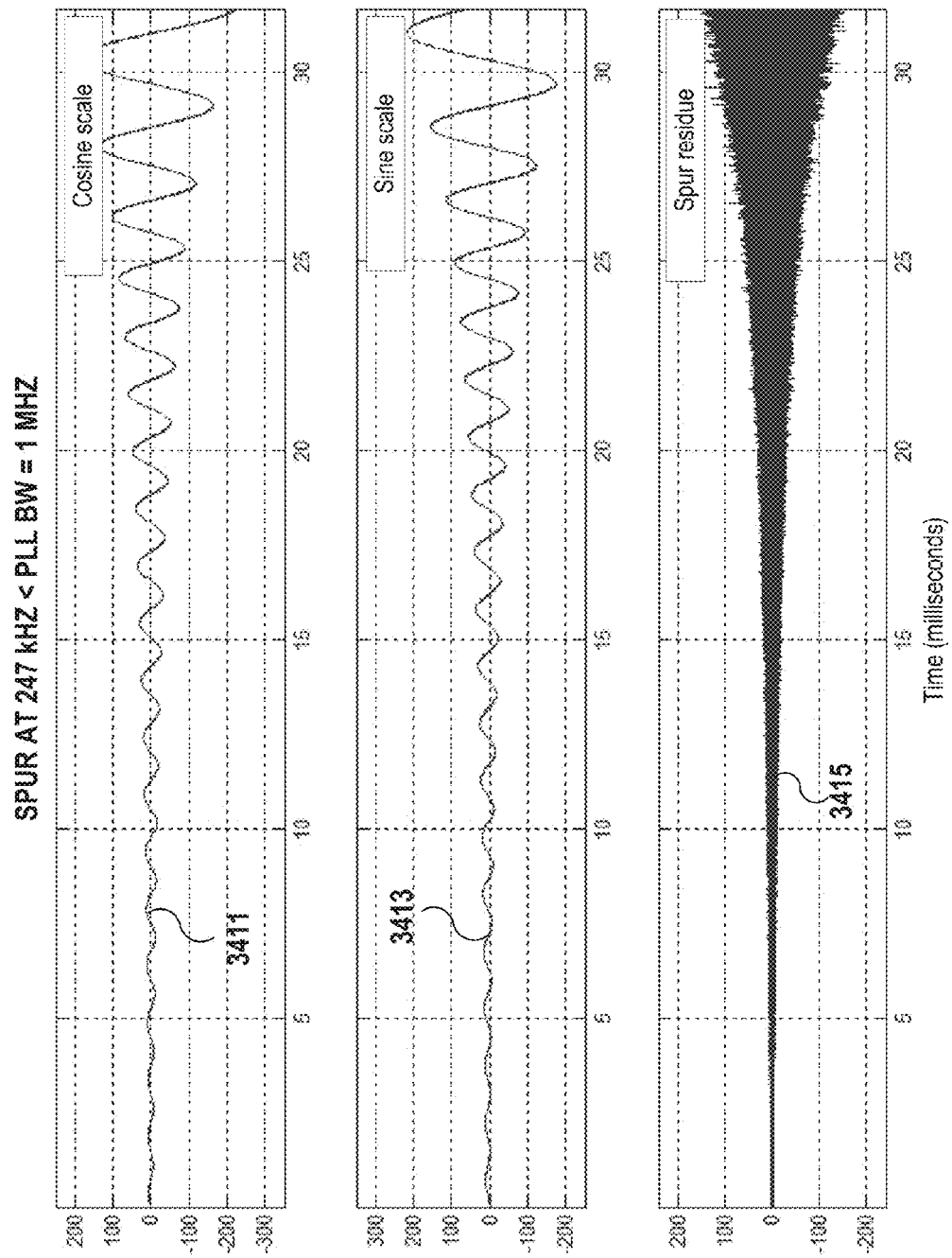
FIG. 34B illustrates a modeling example of a spur at 247 kHz for a PLL bandwidth equal to 1 MHz.

FIG. 34A illustrates a simulation example of a spur at 2.47 MHz for a PLL bandwidth equal to 1 MHz such that the spur frequency is greater than the PLL bandwidth. FIG. 34A shows that cosine scale factors 3401 and sine scale factors 3403 converge nicely for a spur at 2.47 MHz. The spur residue u[k] 3405 shows an exponentially decreasing spur signal. In contrast, FIG. 34B illustrates a modeling example of a spur at 247 kHz for a PLL bandwidth equal to 1 MHz such that the spur frequency is less than the PLL bandwidth. In this case, FIG. 34B shows that cosine scale factors 3411 and sine scale factors 3413 are unstable and the spur residue u[k] 3415 increases exponentially.

Figure 35:
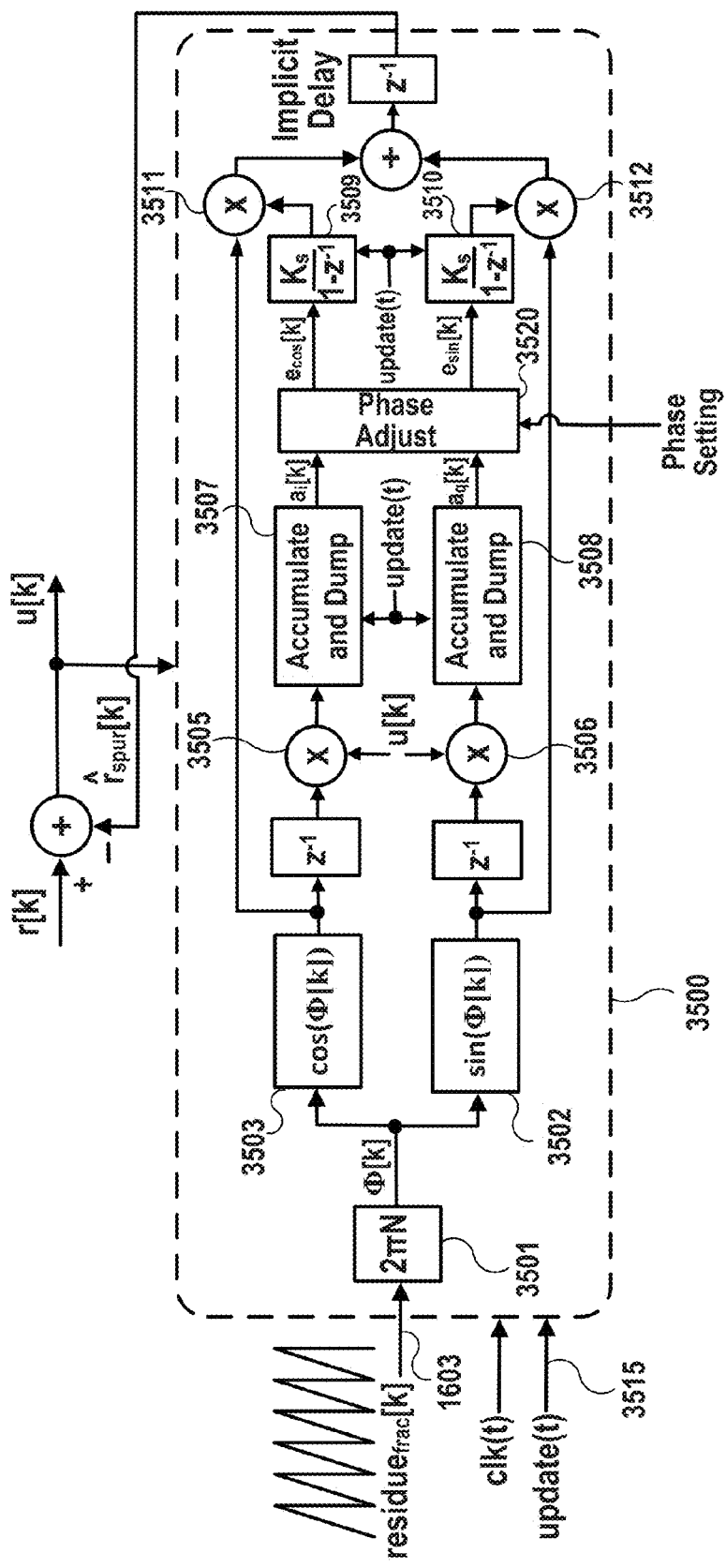
FIG. 35 illustrates an embodiment that addresses the impact of PLL dynamics on spur cancellation.

FIG. 35 illustrates an embodiment that addresses the impact of $G_{hf}(s)$. The fractional spur cancellation block 3500 is modified to include phase adjust block 3520. As in the previous fractional spur cancellation block, the residue$_{frac}$[k] signal is scaled in scaling block 3501 to form the sequence $\Phi[k]$. Blocks 3502 and 3503 create sine and cosine sequences using $\Phi[k]$. The sine and cosine sequences are correlated with sequence u[k] using digital multipliers 3505 and 3506 and accumulate-and-dump circuits 3507 and 3508. The accumulate-and-dump circuits 3507 and 3508 operate over M spur cycles, with the final accumulator values $a_i[k]$ and $a_q[k]$ over this time span being "dumped" and then fed into phase adjust block 3520. The phase adjust block supplies signals $e_{cos}[k]$ and $e_{sin}[k]$ to digital accumulators 3509 and 3510 whose outputs are supplied to multipliers 3511 and 3512 to set the scale factors of the cosine and sine components of the cancellation signal $\hat{r}_{spur}[k]$.

The phase adjust block generates signal $e_{cos}[k]$ using function $f_{cos}(a_i[k], a_q[k],$ phase setting) and generates $e_{sin}[k]$ using function $f_{sin}(a_i[k], a_q[k],$ phase setting). The phase settings are determined by the ratio of spur frequency to PLL bandwidth in combination with knowledge of the PLL filtering action $G_{hf}(s)$ as shown in the example depicted in FIG. 33. In an embodiment the phase settings have fine enough resolution to provide a smooth adjustment of the values of $e_{cos}[k]$ and $e_{sin}[k]$ as the phase setting is varied in the case where the ratio of the spur frequency to PLL bandwidth is also varying. This fine resolution phase setting case is a relatively straightforward extension of the coarse phase setting case which is discussed in more detail in the paragraph below.

A preferred embodiment is to achieve a relatively simple implementation of the phase adjust block 3520 in FIG. 35 by using a table lookup combined with a relatively simple implementation of functions $f_{cos}(a_i[k], a_q[k],$ phase setting) and $f_{sin}(a_i[k], a_q[k],$ phase setting). As an example, in an embodiment $e_{cos}[k] = \alpha_{cos} a_i[k] + \beta_{cos} a_q[k]$ and $e_{sin}[k] = \alpha_{sin} a_i[k] + \beta_{sin} a_q[k]$. A table lookup is used to determine the values of $\alpha_{cos}, \beta_{cos}, \alpha_{sin}, \beta_{sin}$ as a function of phase setting, which, in turn, is determined by the ratio of the spur frequency to PLL bandwidth and knowledge of $G_{hf}(f)$ for a given PLL implementation (as perhaps calculated from an appropriate expression or determined empirically through calibration or test procedures). An example of such a table lookup is given below. Note that the use of fine resolution phase setting would be achieved by reducing the phase setting step size from the 45 degree value assumed in the example below to a smaller value as appropriate, and using well known trigonometric calculations to achieve appropriate values for $\alpha_{cos}, \beta_{cos}, \beta_{sin}, \beta_{sin}$ as a function of the finer resolution phase setting values.

|  | $\alpha_{cos}$ | $\beta_{cos}$ | $\alpha_{sin}$ | $\beta_{sin}$ |
| --- | --- | --- | --- | --- |
| Phase Setting = 0 (0 deg) | 1 | 0 | 1 | 0 |
| Phase Setting = 1 (45 deg) | 1 | −1 | 1 | 1 |
| Phase Setting = 2 (90 deg) | 0 | −1 | 0 | 1 |
| Phase Setting = 3 (135 deg) | −1 | −1 | −1 | 1 |
| Phase Setting = 4 (180 deg) | −1 | 0 | −1 | 0 |
| Phase Setting = 5 (225 deg) | −1 | 1 | −1 | −1 |
| Phase Setting = 6 (270 deg) | 0 | 1 | 0 | −1 |
| Phase Setting = 7 (315 deg) | 1 | 1 | 1 | −1 |

Figure 36:
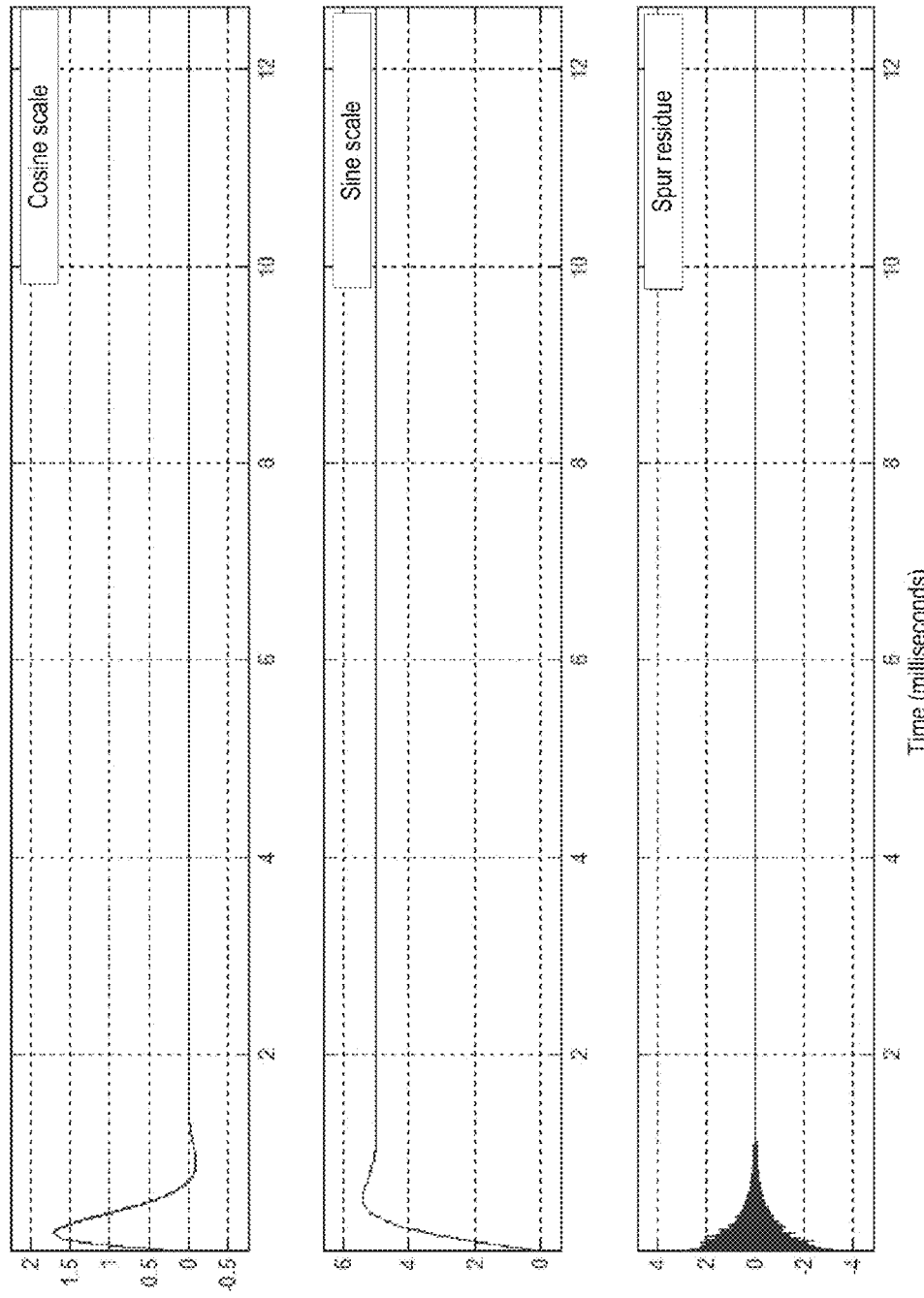
FIG. 36 illustrates a simulation example for a spur at 247 kHz with a phase setting=45 degrees.
Figure 37:
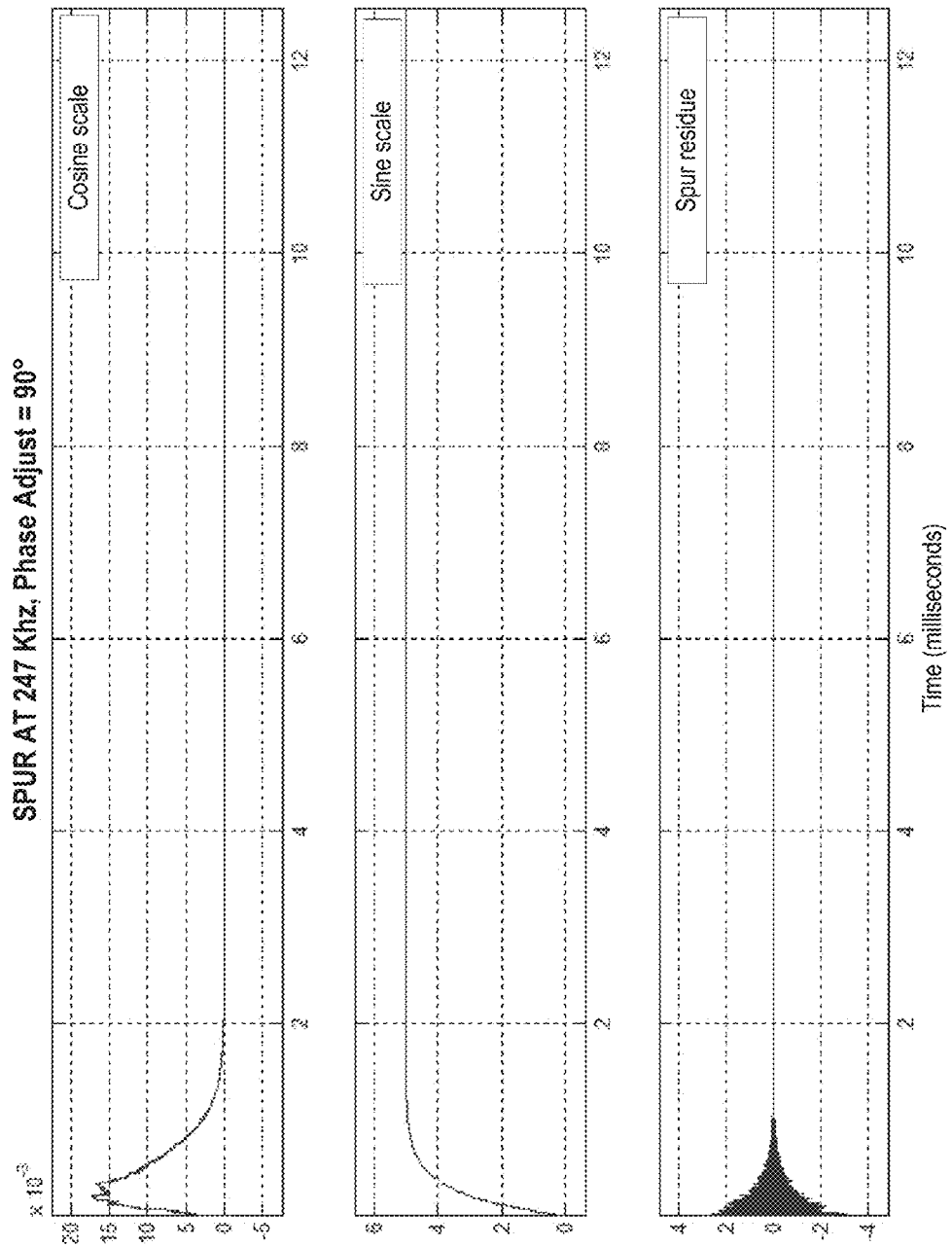
FIG. 37 illustrates a simulation example for a spur at 247 kHz with the phase setting=90 degrees.
Figure 38:
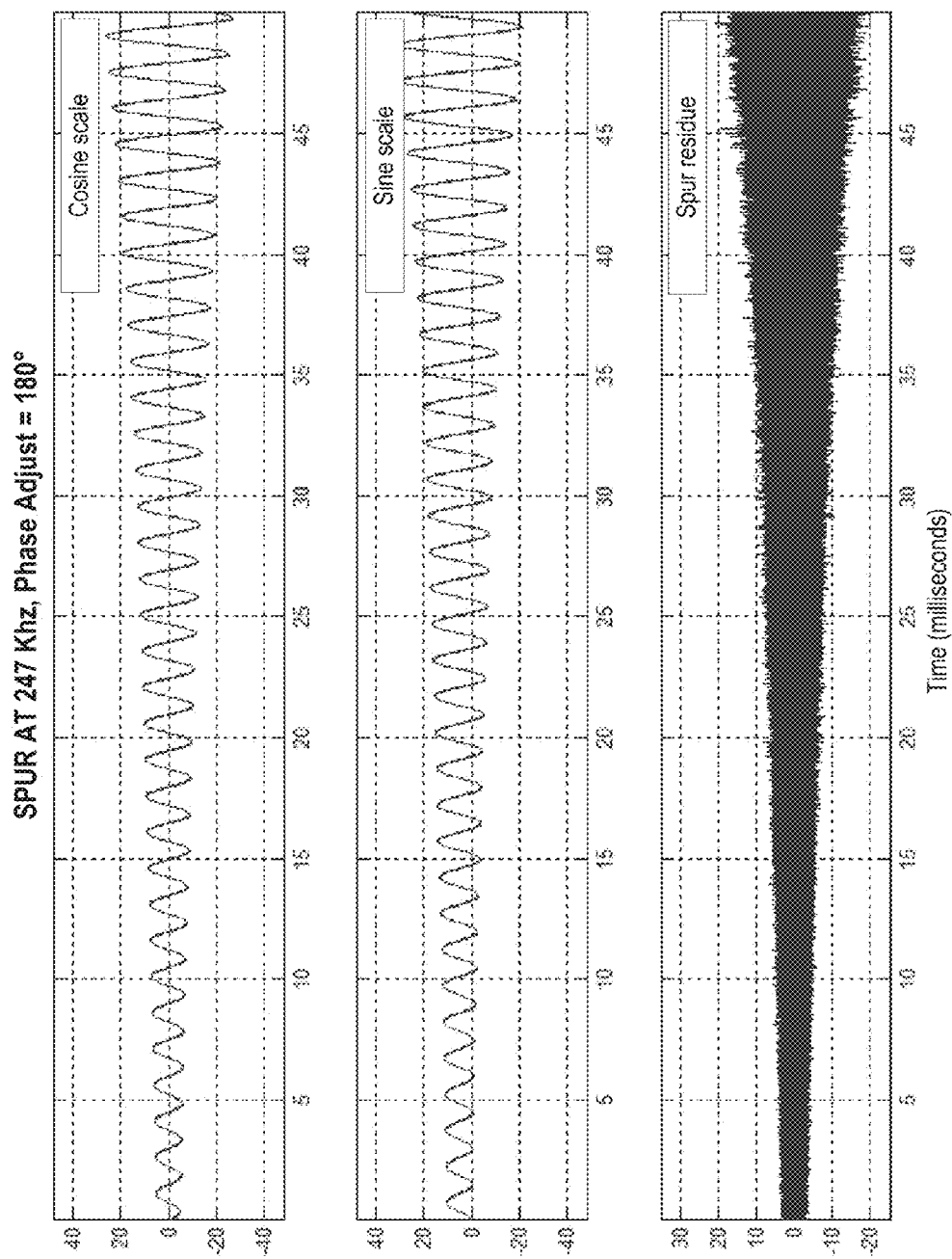
FIG. 38 illustrates a simulation example for a spur at 247 kHz with the phase setting=180 degrees, showing the sine and cosine scale factors become unstable.

FIG. 36 illustrates a simulation example for a spur at 247 kHz with a phase setting=1 (45 degrees). As seen in FIG. 36, the sine and cosine factors are now stable, in contrast to FIG. 34, and the spur residue u[k] now decreases exponentially. The response is slightly underdamped which indicates a lower phase margin. FIG. 37 illustrates an example for a spur at 247 kHz with the phase setting=2 (90 degrees). As seen in FIG. 37, the sine and cosine factors are stable and the spur residue u[k] decreases exponentially. The response is no longer underdamped which indicates phase margin has improved. Note that not all phase settings will work. For example, for a phase setting of 4 (180 degrees), the sine and cosine scale factors become unstable as shown in FIG. 38.

Thus, adding the phase adjust block 3520 at the input of the spur cancellation accumulators addresses the impact of PLL dynamics on spur cancellation when the spur frequency is less than the PLL bandwidth. Note that the fact that the update rate of phase adjust block 3520 is relatively low allows for a simpler implementation. Note also that the phase adjustment need not be precisely accurate. Simulations indicate that a ±45° degree accuracy in phase settings is sufficient. For applications demanding adaptive control of the phase setting, as could occur if the ratio of the spur frequency to the PLL bandwidth is dynamic in nature, higher resolution of phase adjust may be required to avoid glitching the spur cancellation signal.

Note that in an embodiment, spur cancellation may be limited to a minimum ratio of spur frequency to PLL bandwidth due to variation of $G_{hf}(S)$, as well as the large attenuation it causes, at such low frequencies. As such, proper frequency planning of the PLL should be employed to avoid very low frequency spurs.

Thus, various aspects have been described relating to cancellation of quantization noise within a fractional-N PLL having a nonlinear time-to-digital converter. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
    performing nonlinear quantization noise cancellation to generate a digital representation of a phase error with reduced quantization noise, the phase error corresponding to a time difference between a feedback signal of a fractional-N phase-locked loop (PLL) and a reference signal;
    performing the nonlinear quantization noise cancellation in an analog domain to generate an analog representation of the phase error with reduced quantization noise;
    converting the analog representation to a digital representation of the phase error with reduced quantization noise; and
    performing cancellation on the digital representation based on residual error associated with the cancellation in the analog domain to generate a second digital representation with further reduced noise.

2. The method as recited in claim 1 further comprising:
    introducing a non-linear component into an analog phase error representation in a time-to-voltage converter in the PLL.

3. A method comprising:
    performing nonlinear quantization noise cancellation to generate a digital representation of a phase error with reduced quantization noise, the phase error corresponding to a time difference between a feedback signal of a fractional-N phase-locked loop (PLL) and a reference signal,
    wherein performing the nonlinear quantization noise cancellation further comprises multiplying a quantization error based signal by a polynomial and supplying a multiplied signal, the quantization error based signal based on a residue signal from a first delta sigma modulator controlling a divider value for a feedback divider in the fractional-N PLL.

4. The method as recited in claim 3 further comprising:
    updating coefficient values of the polynomial with a first update time period during initial operation of the quantization noise cancellation; and
    updating the coefficient values of the polynomial with a second update time period greater than the first update time period during steady state operation of the quantization noise cancellation.

5. The method as recited in claim 3 further comprising forming the quantization error based signal by summing a dither signal with the residue signal.

6. The method as recited in claim 3 wherein the polynomial is a third order polynomial.

7. The method as recited in claim 3 further comprising:
    supplying the multiplied signal to a second delta sigma modulator and generating a quantized version of the multiplied signal and a second residue signal corresponding to a residual error of a digital to analog converter;
    supplying the quantized version of the multiplied signal to the digital to analog converter and generating an analog representation of the quantized version of the multiplied signal;
    combining the analog representation of the quantized version of the multiplied signal with an analog representation of the phase error to reduce quantization noise in the analog representation of the phase error and generate an analog representation of the phase error with reduced quantization noise; and
    supplying the analog representation of the phase error with reduced quantization noise to an analog to digital converter and generating the digital representation of the phase error.

8. The method as recited in claim 7 further comprising:
    combining a first signal based on the second residue signal with a second signal corresponding to the digital representation of the phase error to generate a second digital representation of the phase error with further reduced quantization noise; and
    controlling a frequency of an oscillator of the fractional-N PLL based on the second digital representation of the phase error.

9. The method as recited in claim 8 further comprising:
    generating the second signal using a compensation filter to compensate for memory effect of a capacitor filter formed by capacitors used in sampling the analog representation of the phase error with reduced quantization noise.

10. The method as recited in claim 9 further comprising:
    setting the quantized version of the multiplied signal to a constant value; and
    determining coefficient values of the compensation filter with the quantized version of the multiplied signal set to the constant value.

11. A fractional-N phase-locked loop (PLL) comprising:
    a nonlinear time to digital converter to generate a digital representation of a phase error corresponding to a time difference between a feedback signal of the fractional-N PLL and a reference signal; and
    a nonlinear quantization noise cancellation circuit coupled to supply a correction signal to the time to digital converter to cause the time to digital converter to generate the digital representation of the phase error with reduced quantization noise;
    wherein the nonlinear time to digital converter further comprises,
        a resistor-based or current-based charge pump controlled by a phase detector to create a voltage corresponding to the phase error that is combined with the correction signal; and
        an analog to digital converter coupled to the charge pump to generate the digital representation of the phase error with reduced quantization noise.

12. The fractional-N PLL as recited in claim 11 further comprising:
    a delta sigma modulator supplying a divider control signal for the fractional-N PLL and a first residue signal corresponding to a quantization error associated with the delta sigma modulator;

a feedback divider coupled to receive the divider control signal and an output of a controlled oscillator of the PLL and supply the feedback signal; and wherein the nonlinear quantization noise cancellation circuit includes a multiplier circuit to multiply a quantization error signal by a polynomial and supply a multiplied signal, the quantization error signal based on the first residue signal.

13. The fractional-N PLL as recited in claim 12 wherein the nonlinear quantization noise cancellation circuit is configured to update coefficient values of the polynomial with a first update time period during a period of operation of the quantization noise cancellation and is configured to update the coefficient values of the polynomial with a second update time period during another period of operation, the second update time period being greater than the first update time period.

14. The fractional-N PLL as recited in claim 12 further comprising a summing circuit coupled to sum a dither signal with the first residue signal to generate the quantization error signal.

15. The fractional-N PLL as recited in claim 12 wherein the polynomial is a third order polynomial.

16. The fractional-N PLL as recited in claim 12 further comprising:
a second delta sigma modulator coupled to receive the multiplied signal and to generate a quantized version of the multiplied signal and a second residue signal;
a digital to analog converter coupled to receive the quantized version of the multiplied signal and generate an analog representation of the quantized version of the multiplied signal as the correction signal; and
wherein the analog representation of the quantized version of the multiplied signal and the voltage corresponding to the phase error are combined in the time to digital converter to generate an analog representation of the phase error with reduced quantization noise.

17. The fractional-N PLL as recited in claim 16 further comprising a summing circuit coupled to combine a first signal based on the second residue signal and a second signal based on the digital representation of the phase error, to generate a residual phase error signal having further reduced quantization error.

18. The fractional-N PLL as recited in claim 17 further comprising a compensation filter coupled to the digital representation of the phase error and configured to compensate for memory effect of a capacitor filter formed by capacitors used in sampling the analog representation of the phase error and the compensation filter being further coupled to supply the second signal to the summing circuit.

19. A fractional-N phase-locked loop (PLL) comprising:
a phase and frequency detector (PFD);
a nonlinear time to digital converter to generate a digital representation of a phase error corresponding to a time difference determined by the PFD between a feedback signal of the fractional-N PLL and a reference signal, the digital representation including nonlinearity and quantization noise,
a nonlinear quantization noise cancellation circuit coupled to supply a correction signal to reduce the quantization noise; and
a summing circuit to combine the correction signal and a second signal based on the digital representation of the phase error, to generate a second digital representation of the phase error with reduced quantization noise;
wherein the nonlinear time to digital converter includes,
a charge pump controlled by the PFD to create a voltage corresponding to the phase error; and
an analog to digital converter to generate the digital representation of the phase error based on the voltage.

20. The fractional-N PLL as recited in claim 19 further comprising:
a delta sigma modulator supplying a divider control signal for the fractional-N PLL and a first residue signal corresponding to the quantization noise associated with the delta sigma modulator;
a feedback divider coupled to receive the divider control signal and an output of a controlled oscillator of the PLL and supply the feedback signal; and
wherein the nonlinear quantization noise cancellation circuit includes a multiplier circuit to multiply a quantization error signal by a polynomial and supply a multiplied signal as the correction signal, the quantization error signal based on the first residue signal.

* * * * *